United States Patent
Wang et al.

(10) Patent No.: US 11,626,400 B2
(45) Date of Patent: Apr. 11, 2023

(54) SEMICONDUCTOR DEVICE STRUCTURE INCORPORATING AIR GAP

(71) Applicant: TAIWAN SEMICONDUCTOR MANUFACTURING COMPANY, LTD., Hsinchu (TW)

(72) Inventors: Chih-Ching Wang, Kinmen (TW); Wen-Yuan Chen, Taoyuan (TW); Chun Chung Su, New Taipei (TW); Jon-Hsu Ho, New Taipei (TW); Wen-Hsing Hsieh, Hsinchu (TW); Kuan-Lun Cheng, Hsinchu (TW); Chung-Wei Wu, Hsinchu (TW); Zhiqiang Wu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 12 days.

(21) Appl. No.: 17/377,796

(22) Filed: Jul. 16, 2021

(65) Prior Publication Data

US 2023/0020933 A1    Jan. 19, 2023

(51) Int. Cl.
*H01L 27/088* (2006.01)
*H01L 21/764* (2006.01)
(Continued)

(52) U.S. Cl.
CPC .......... *H01L 27/088* (2013.01); *H01L 21/764* (2013.01); *H01L 29/0847* (2013.01);
(Continued)

(58) Field of Classification Search
CPC ....... H01L 29/41783; H01L 21/823814; H01L 29/0649–0653; H01L 23/5329–53295; H01L 21/79801–76837; H01L 23/481; H01L 2225/06548; H01L 2224/02372; H01L 2224/29009; H01L 2224/29025; H01L 2224/05009; H01L 2224/05025; H01L 2224/05087; H01L 2224/0509; H01L 2224/0557; H01L 2224/08146;
(Continued)

(56) References Cited

U.S. PATENT DOCUMENTS 9,209,247 B2    12/2015    Colinge et al.
9,236,267 B2    1/2016     De et al.
(Continued)

*Primary Examiner* — Sonya McCall-Shepard
(74) *Attorney, Agent, or Firm* — NZ Carr Law Office PLLC

(57) ABSTRACT

A semiconductor device structure includes a dielectric layer, a first source/drain feature in contact with the dielectric layer, wherein the first source/drain feature comprises a first sidewall, and a second source/drain feature in contact with the dielectric layer and adjacent to the first source/drain feature, wherein the second source/drain feature comprises a second sidewall. The structure also includes an insulating layer disposed over the dielectric layer and between the first sidewall and the second sidewall, wherein the insulating layer comprises a first surface facing the first sidewall, a second surface facing the second sidewall, a third surface connecting the first surface and the second surface, and a fourth surface opposite the third surface. The structure includes a sealing material disposed between the first sidewall and the first surface, wherein the sealing material, the first sidewall, the first surface, and the dielectric layer are exposed to an air gap.

20 Claims, 51 Drawing Sheets

(51) Int. Cl.
*H01L 29/08* (2006.01)
*H01L 29/423* (2006.01)
*H01L 29/66* (2006.01)

(52) U.S. Cl.
CPC .... *H01L 29/42392* (2013.01); *H01L 29/6653* (2013.01); *H01L 29/66553* (2013.01); *H01L 29/66742* (2013.01)

(58) Field of Classification Search
CPC .......................... H01L 2221/1015–1036; H01L 21/76802–76817; H01L 21/76877–76883; H01L 27/088; H01L 29/0847; H01L 21/764; H01L 29/6653; H01L 29/66553; H01L 29/42392; H01L 21/02104; H01L 21/02107; H01L 21/02225; H01L 23/53295; H01L 29/66689; H01L 29/66719; H01L 21/31; H01L 2221/1042–1047; H01L 29/4991; H01L 29/515; H01L 29/0843–0891; H01L 29/66636–66643; H01L 21/823418–823425; H01L 21/823443; H01L 21/823835; H01L 29/41725–41791; H01L 29/4933; H01L 29/4975; H01L 29/665–66507; H01L 29/7845; H01L 21/823475; H01L 21/823871
See application file for complete search history.

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2018/0026033 A1 | 1/2018 | Chang et al. |

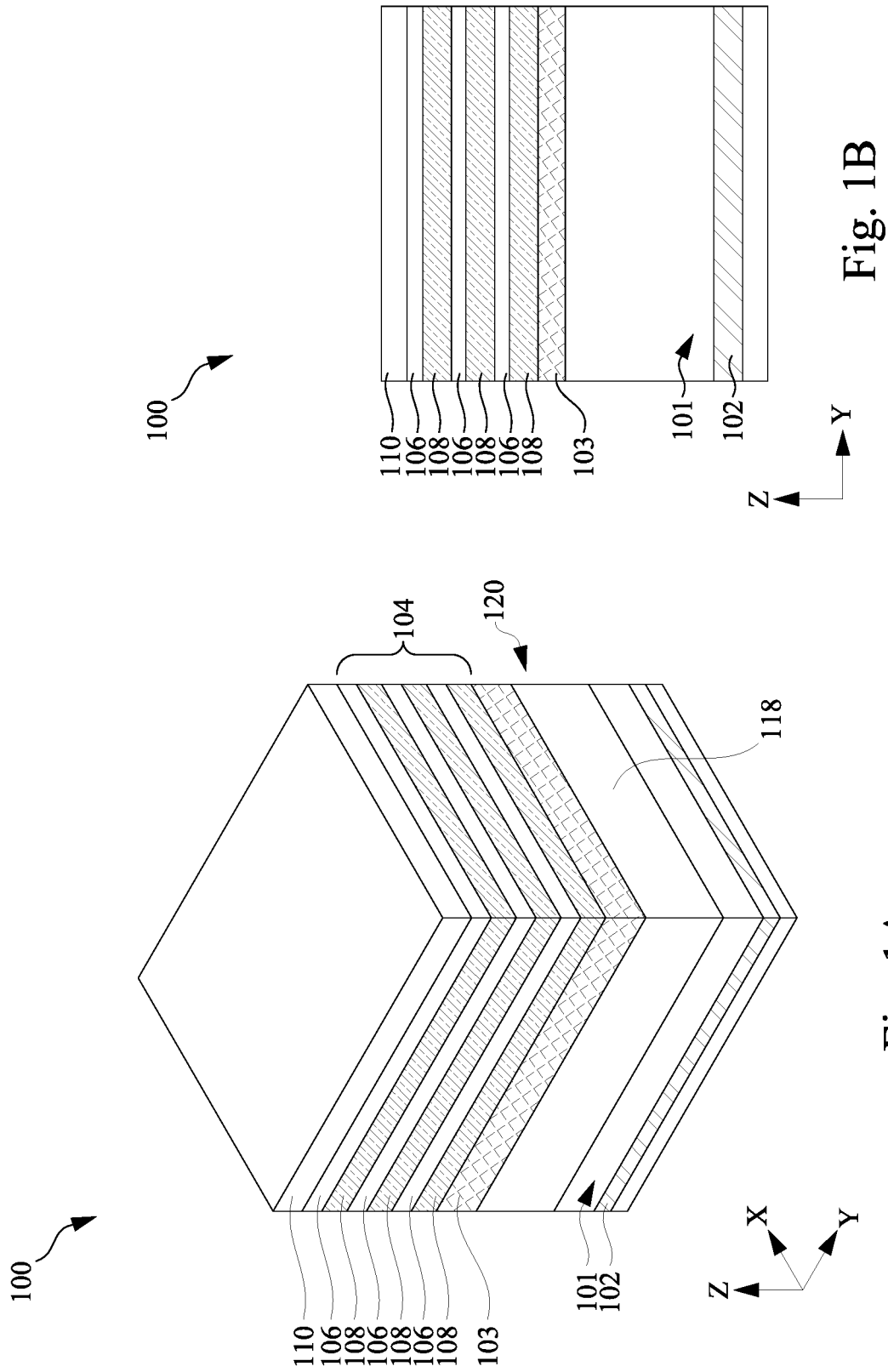

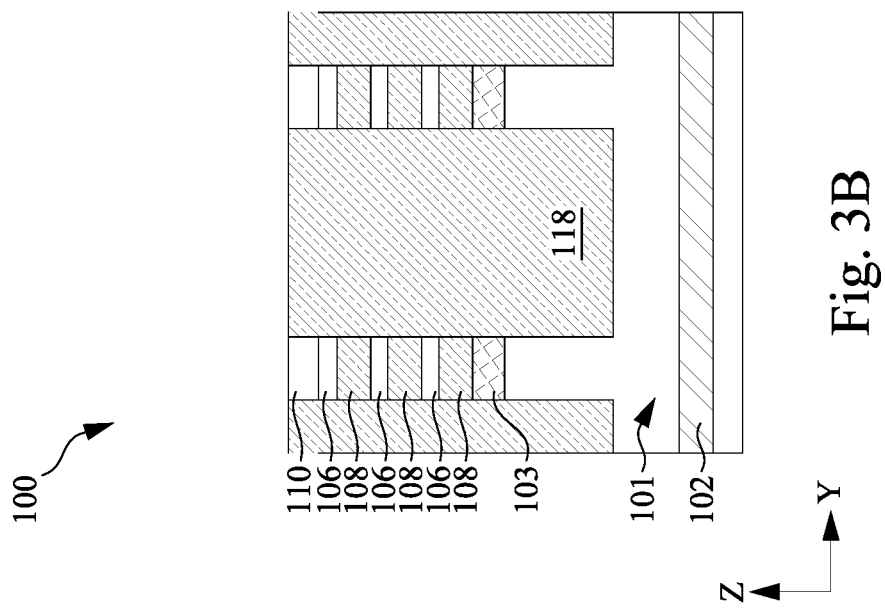
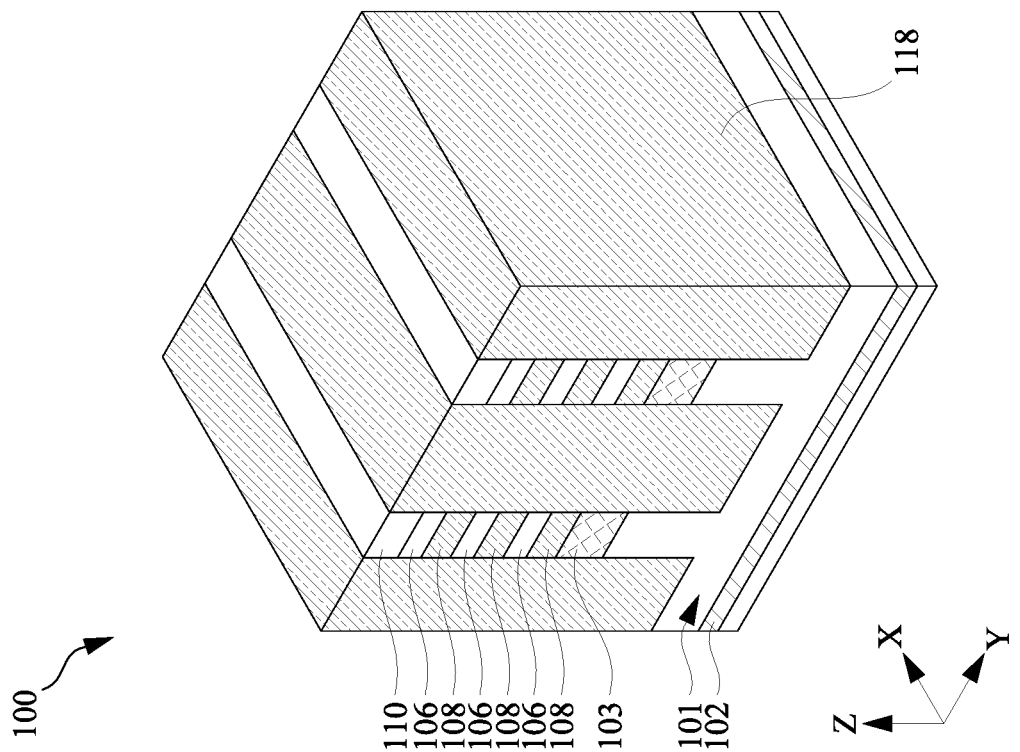

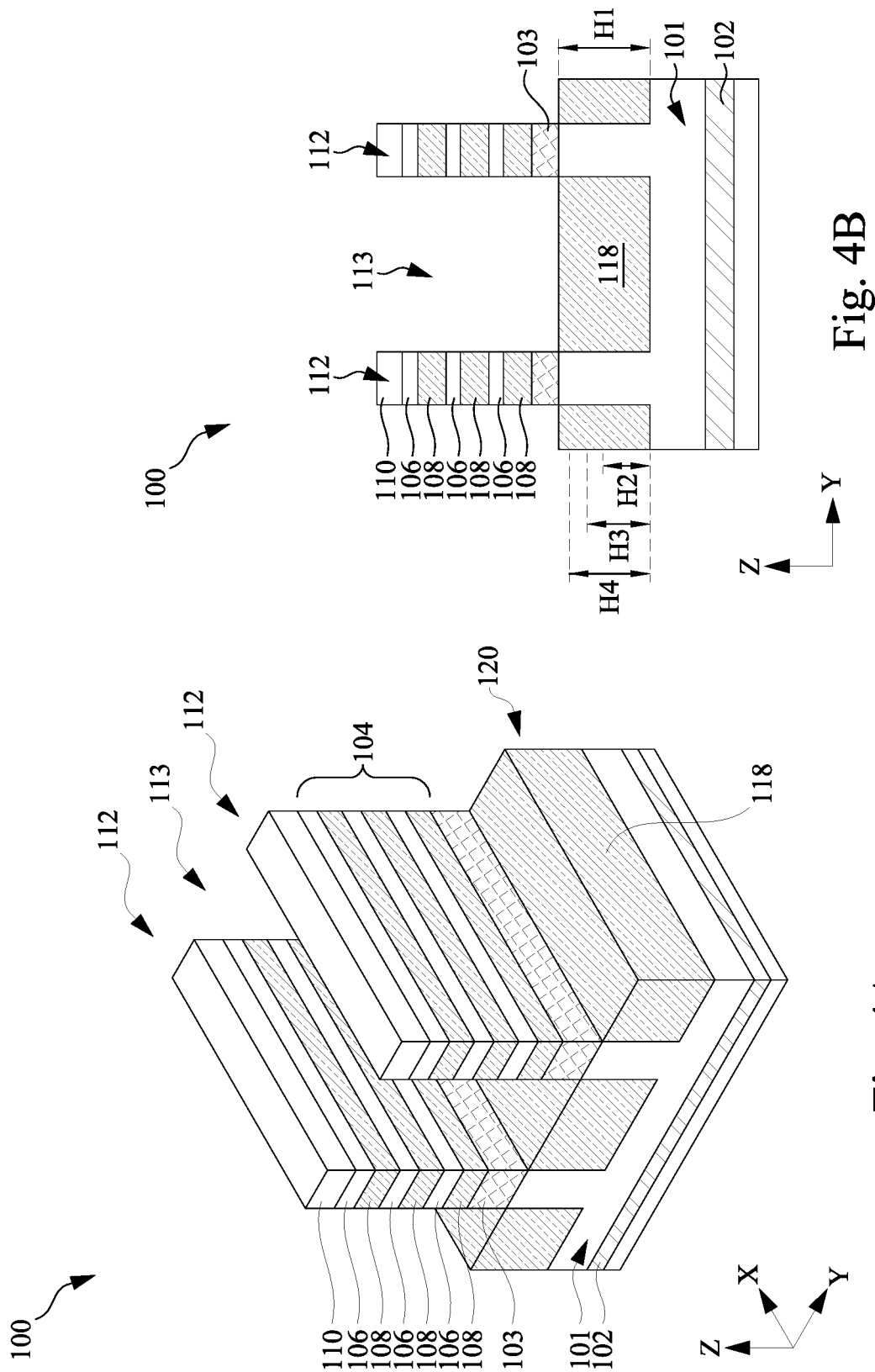

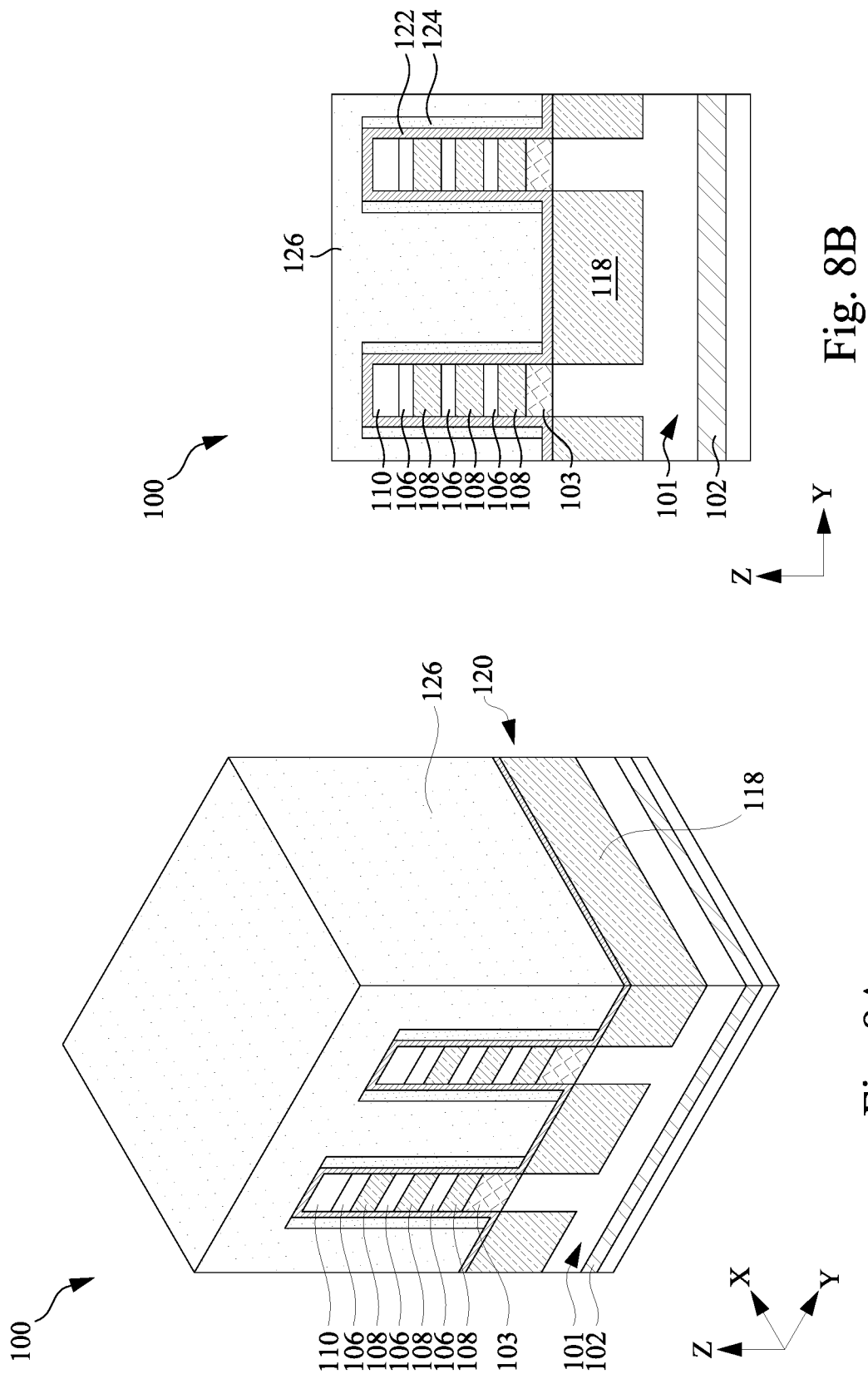

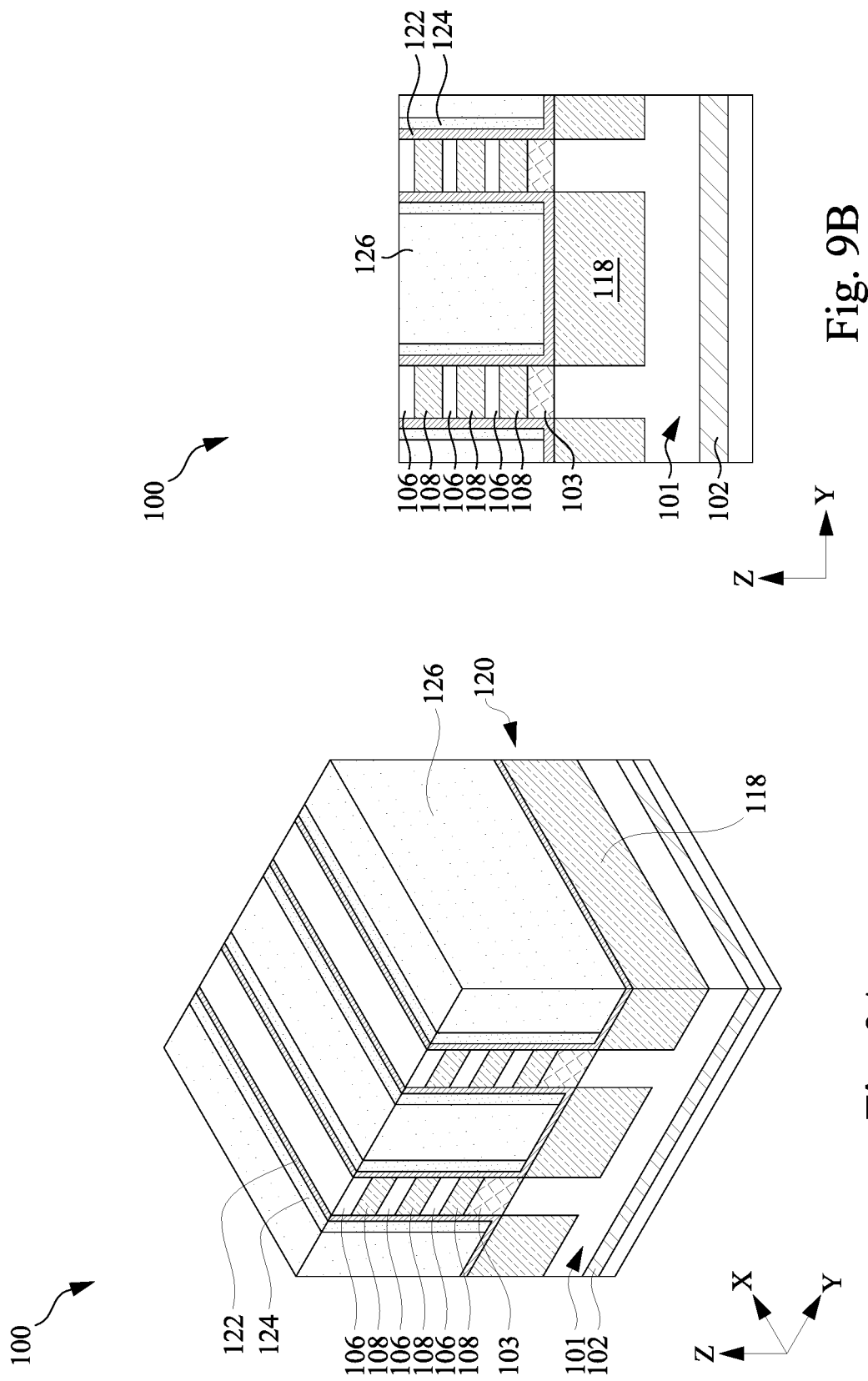

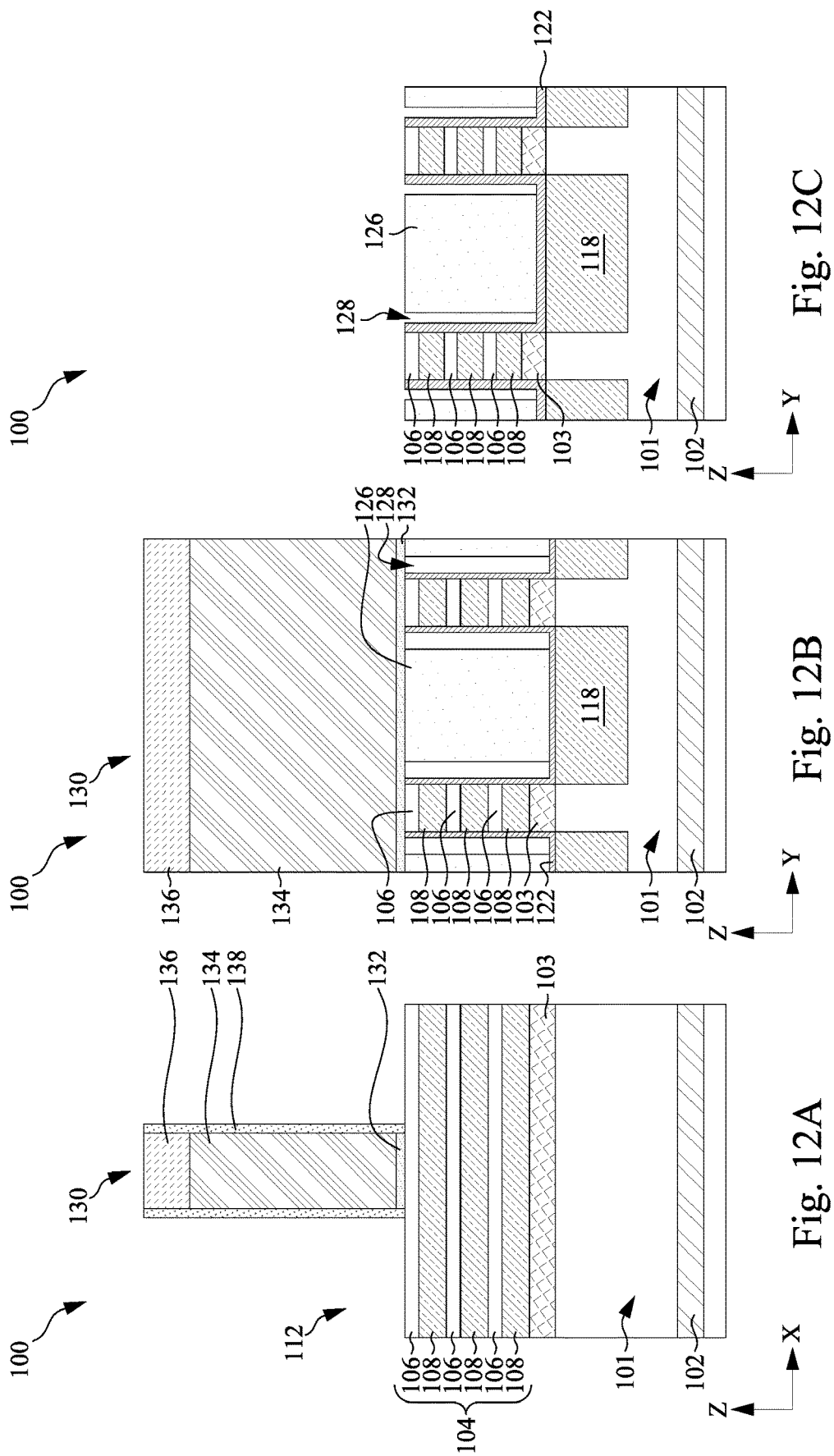

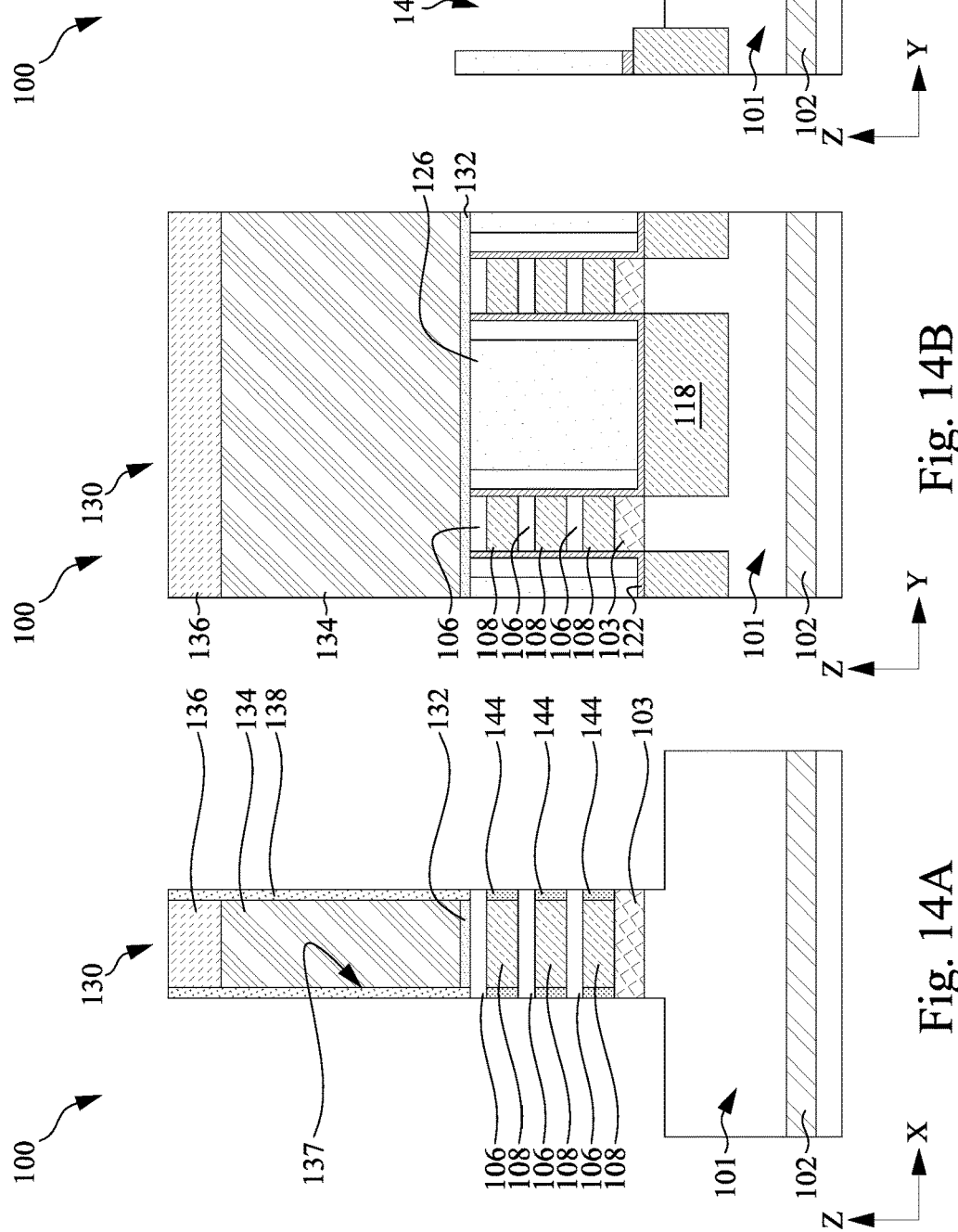

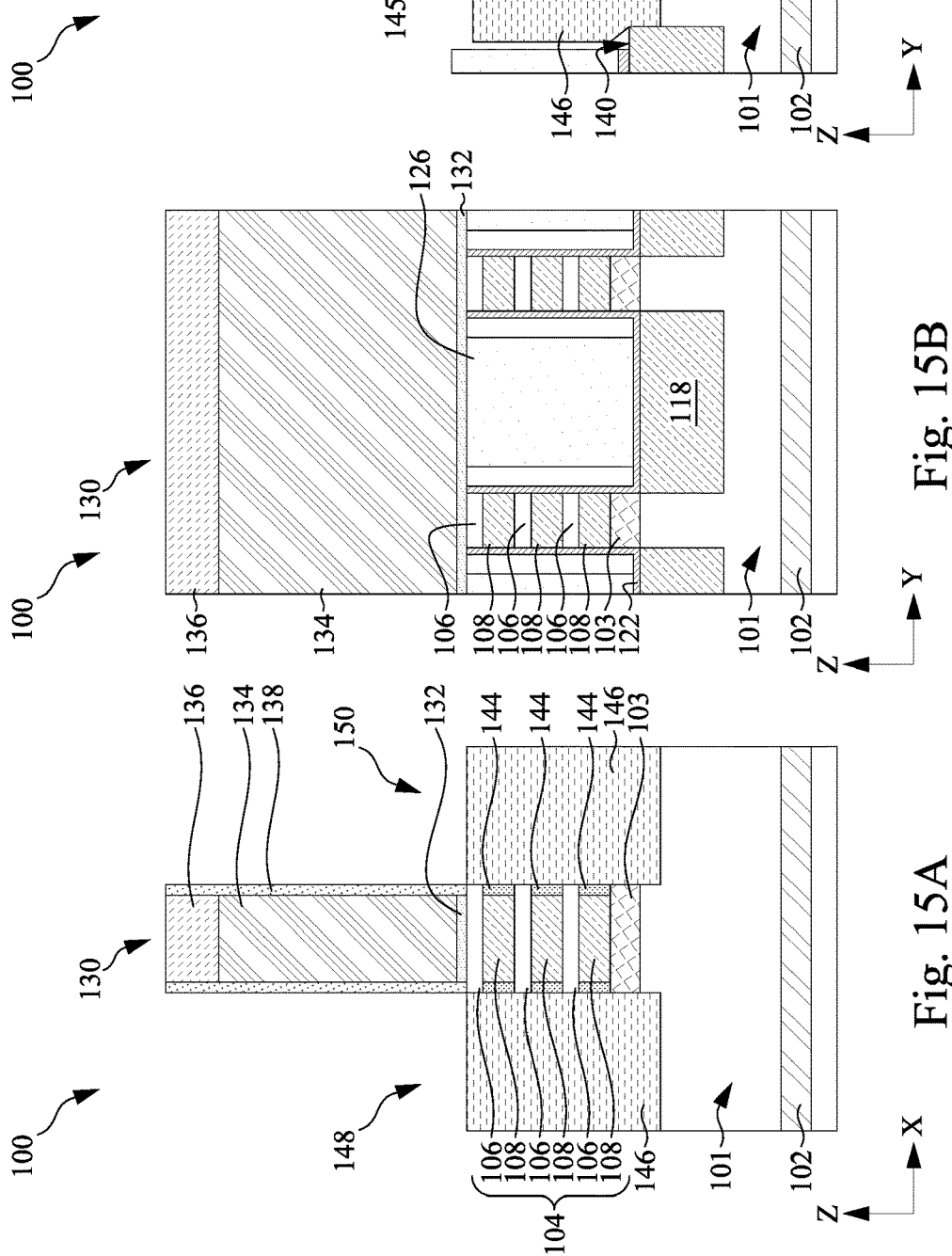

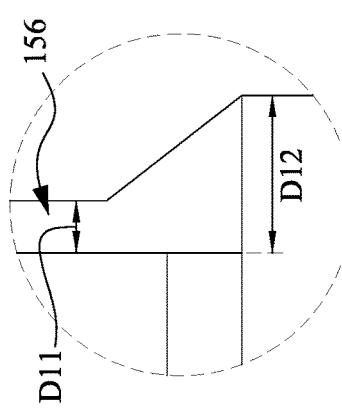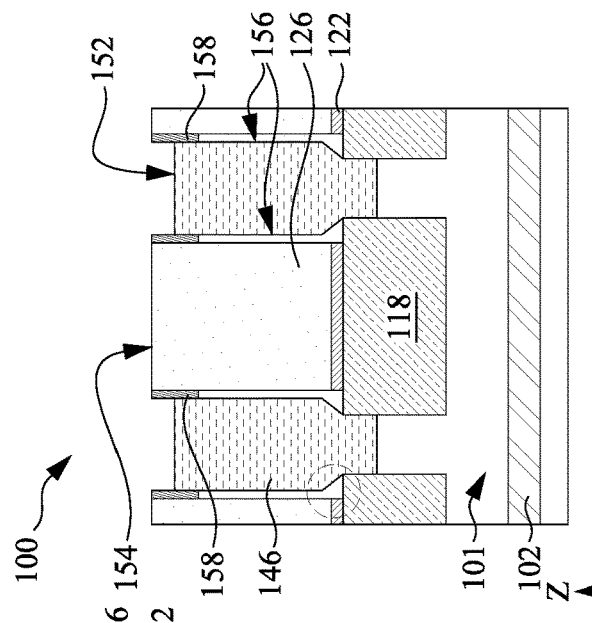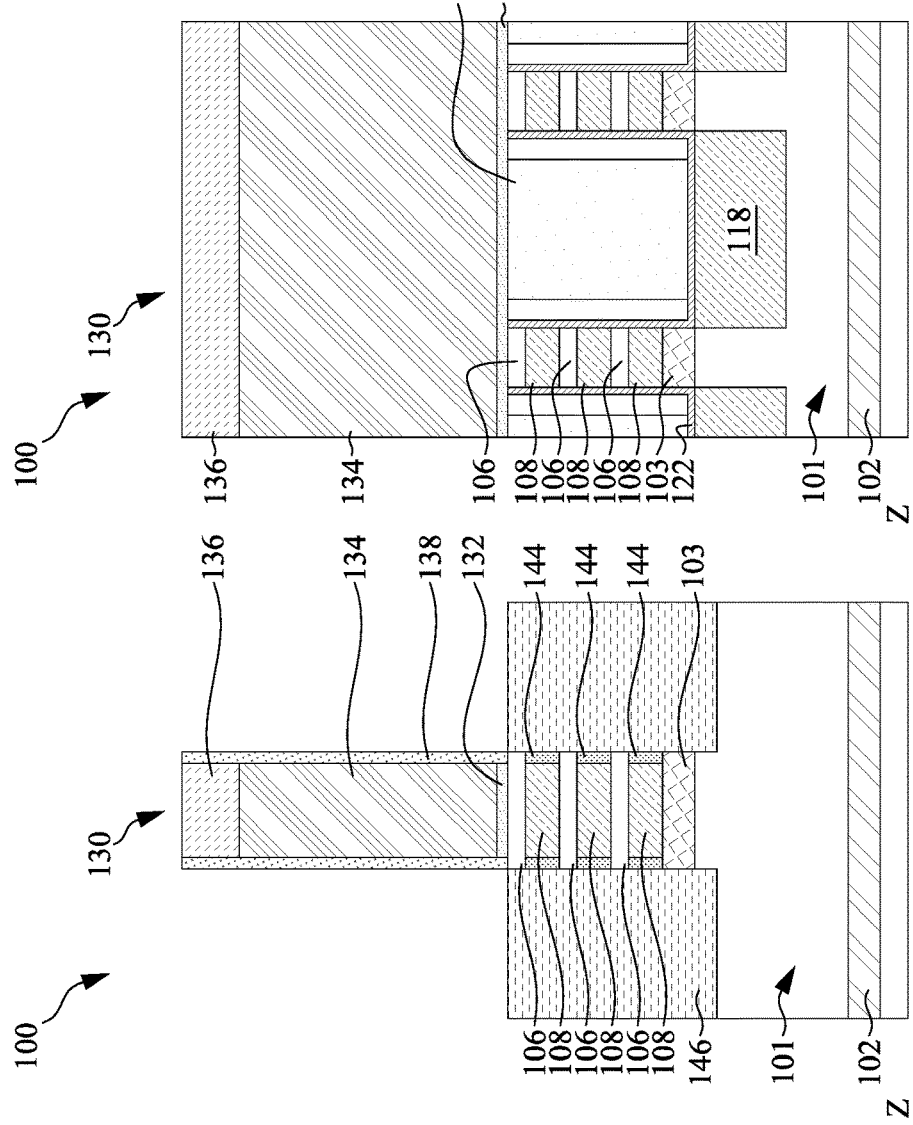

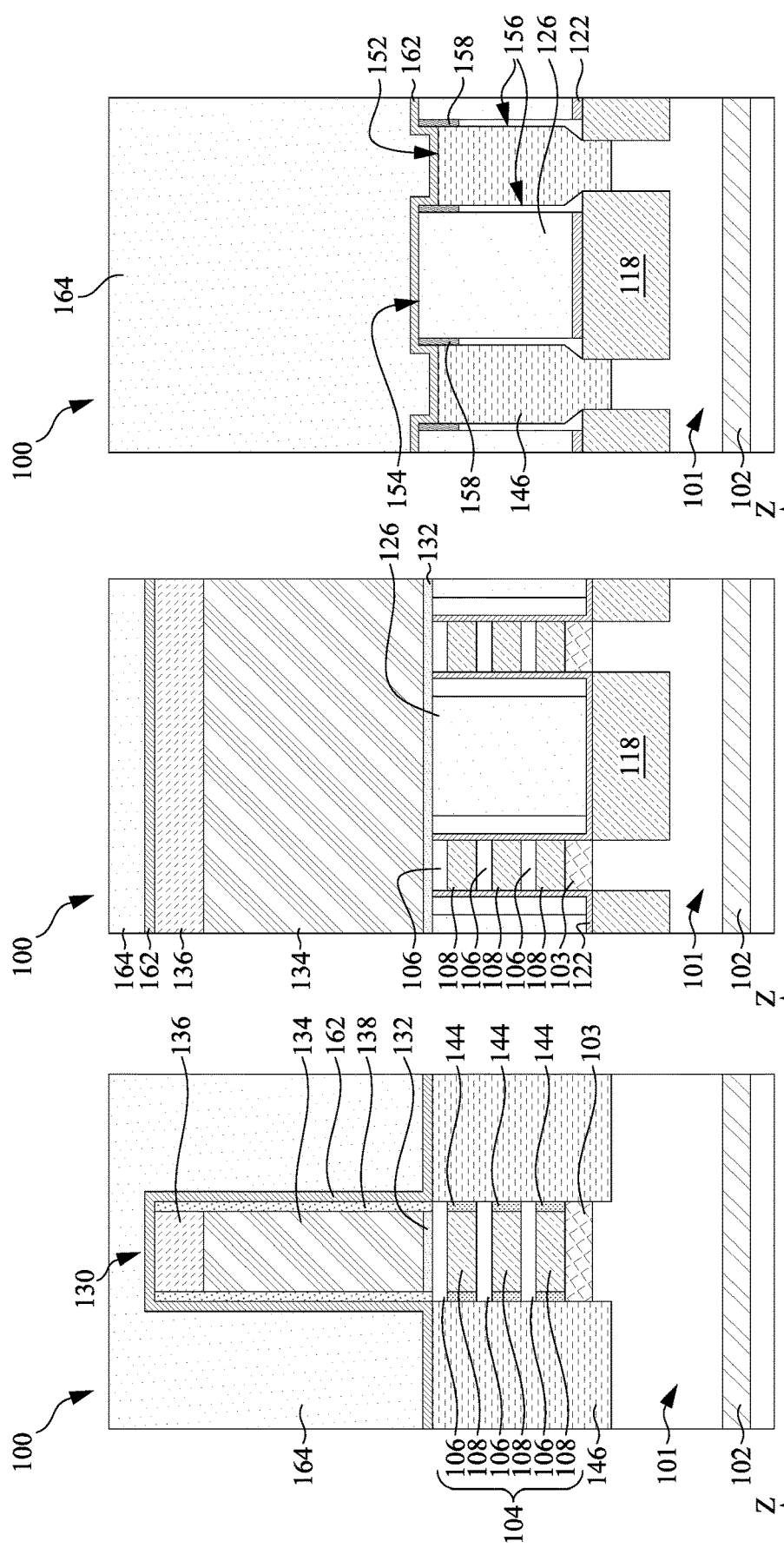

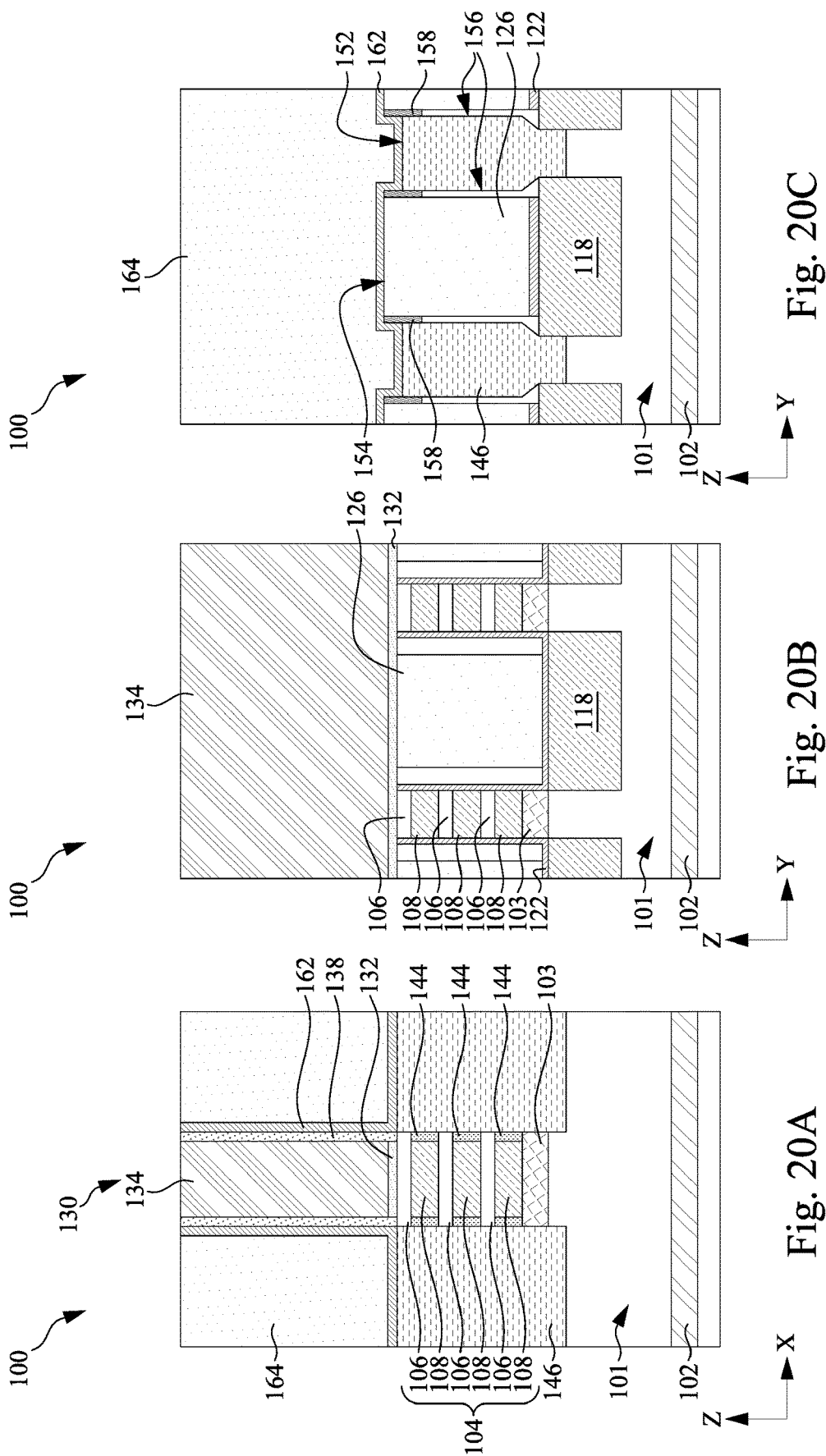

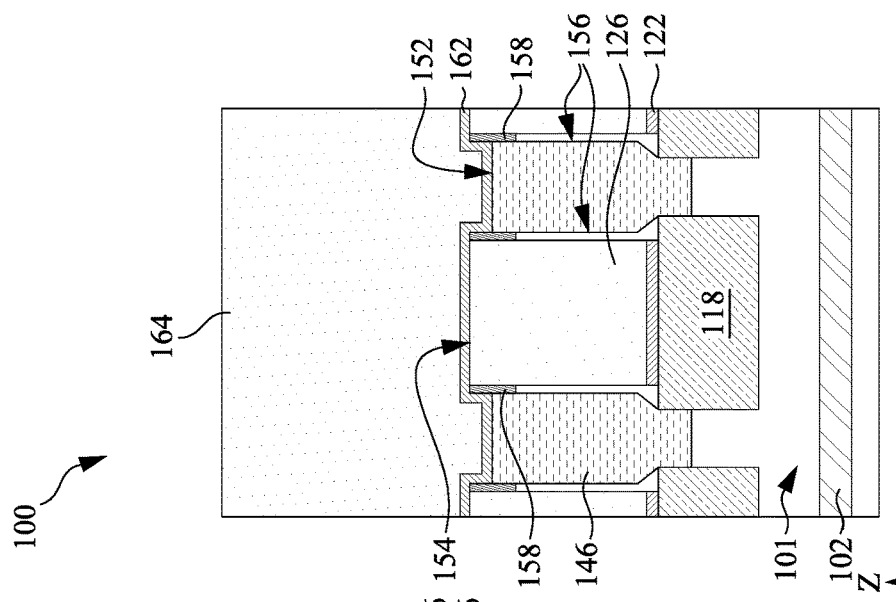
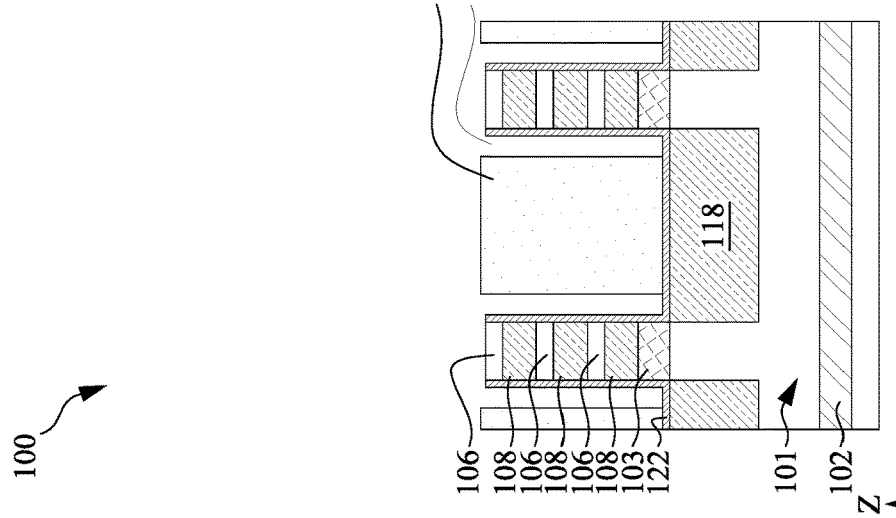
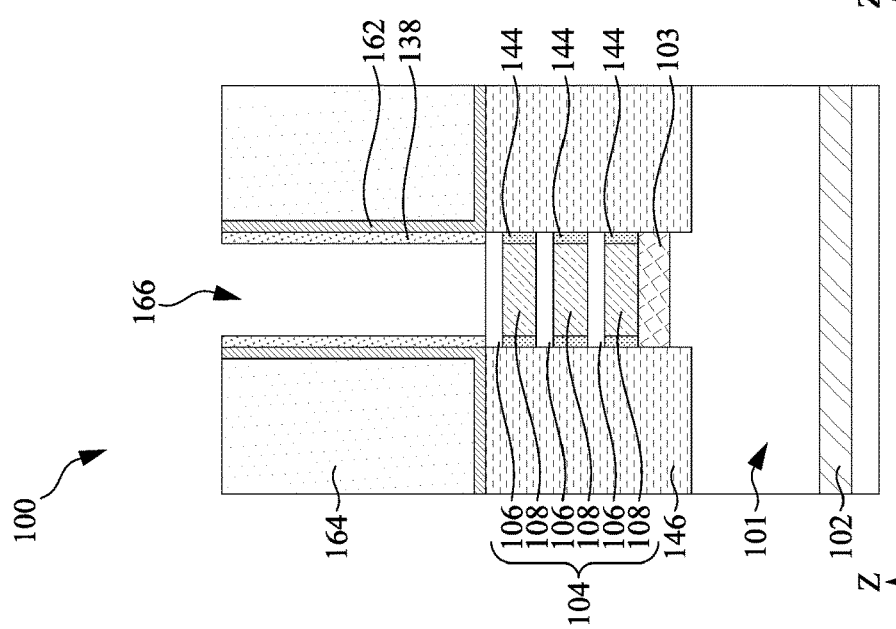

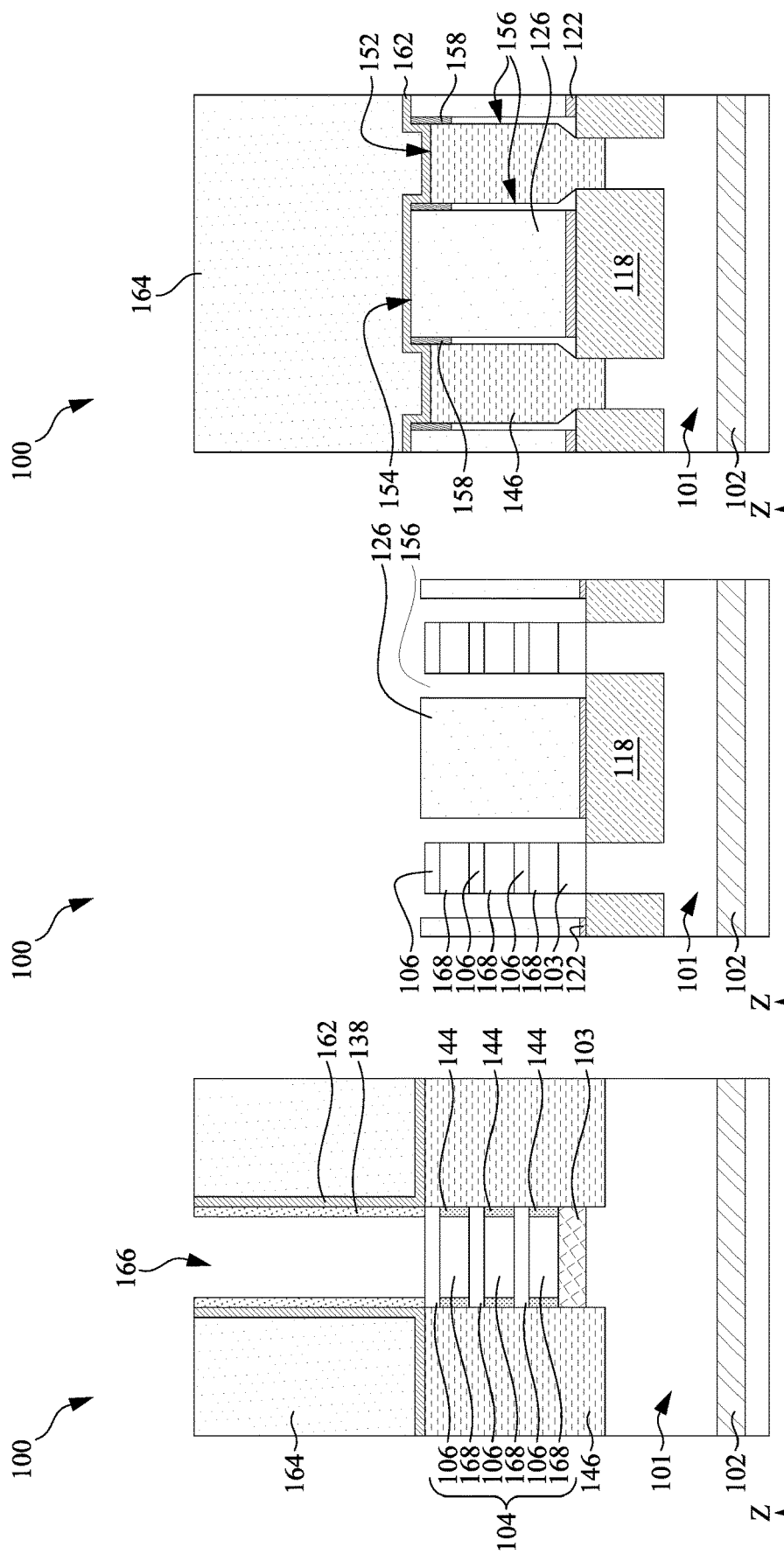

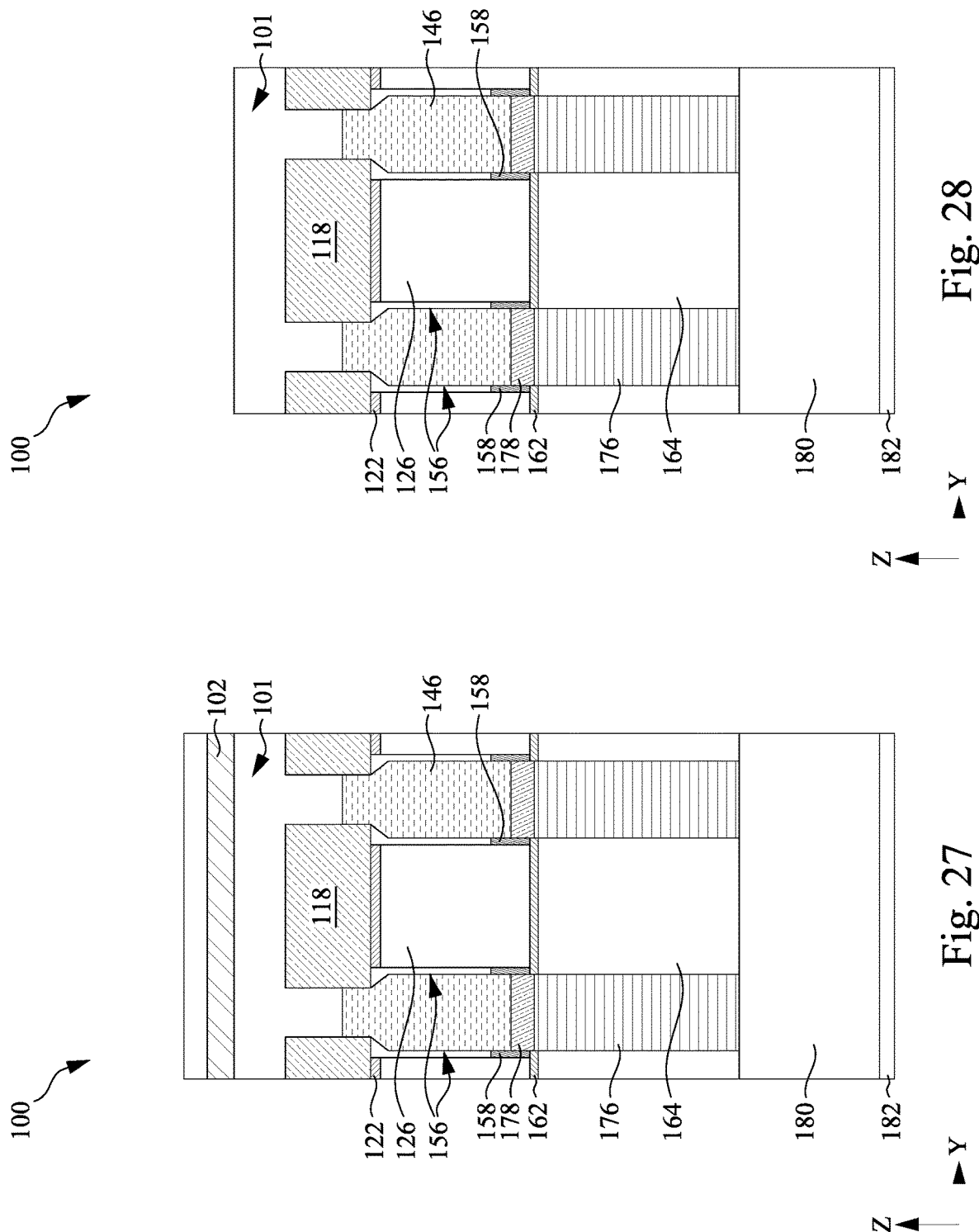

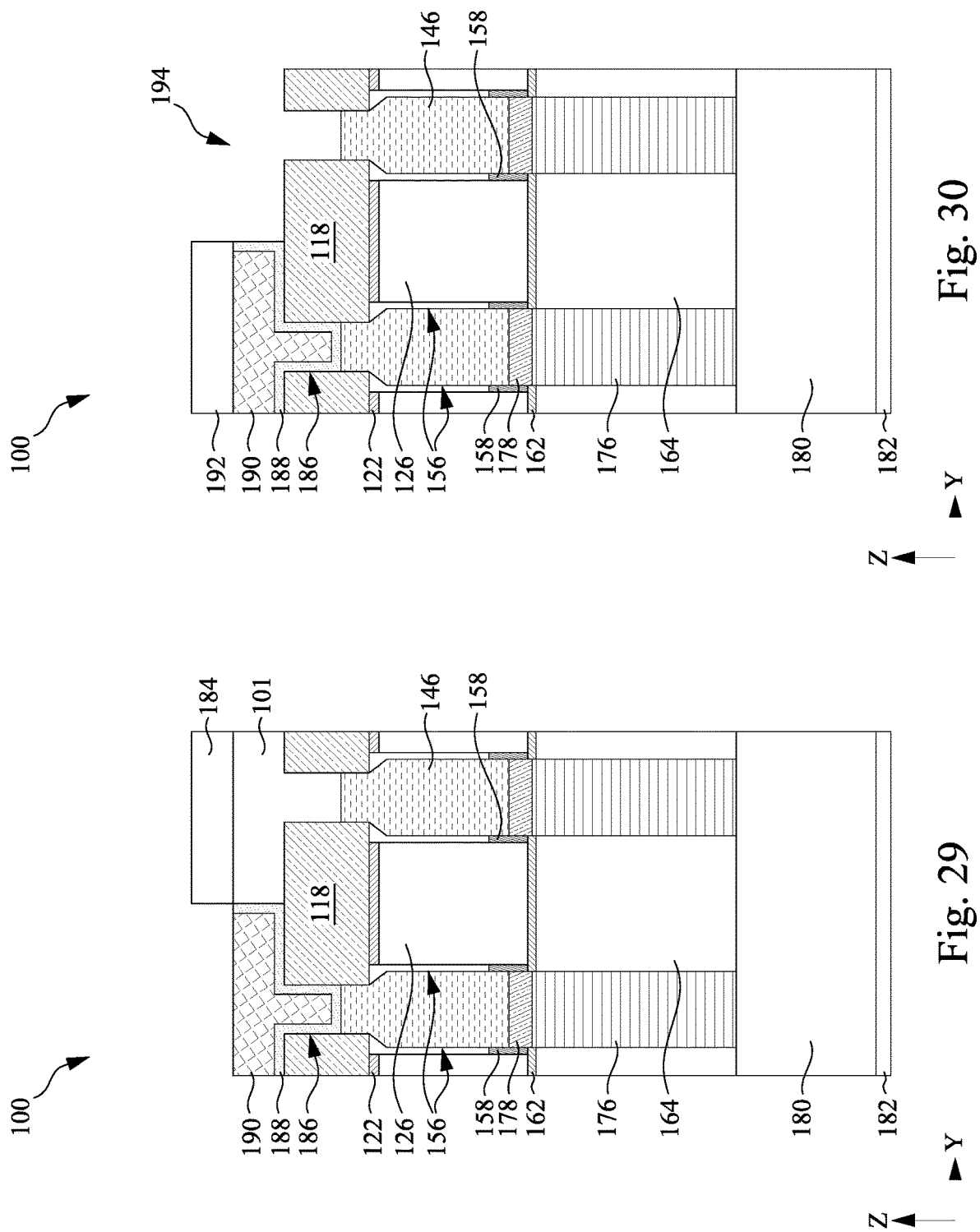

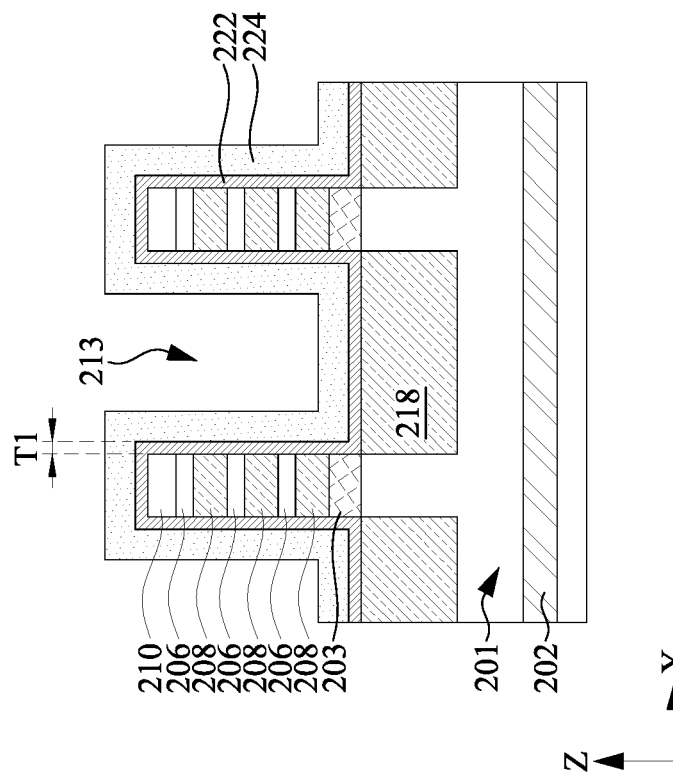
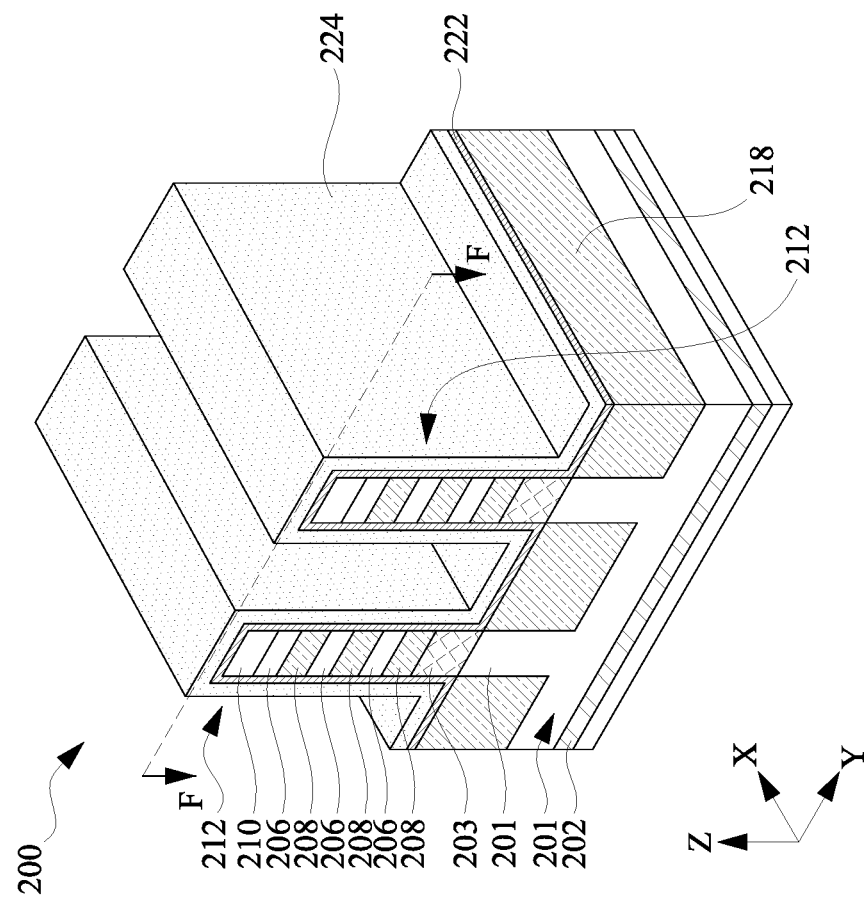
Fig. 32B
Fig. 32A

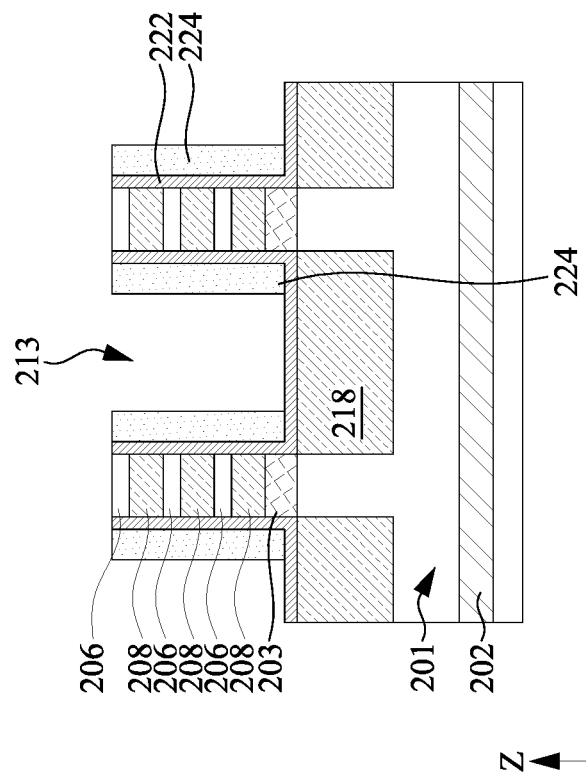
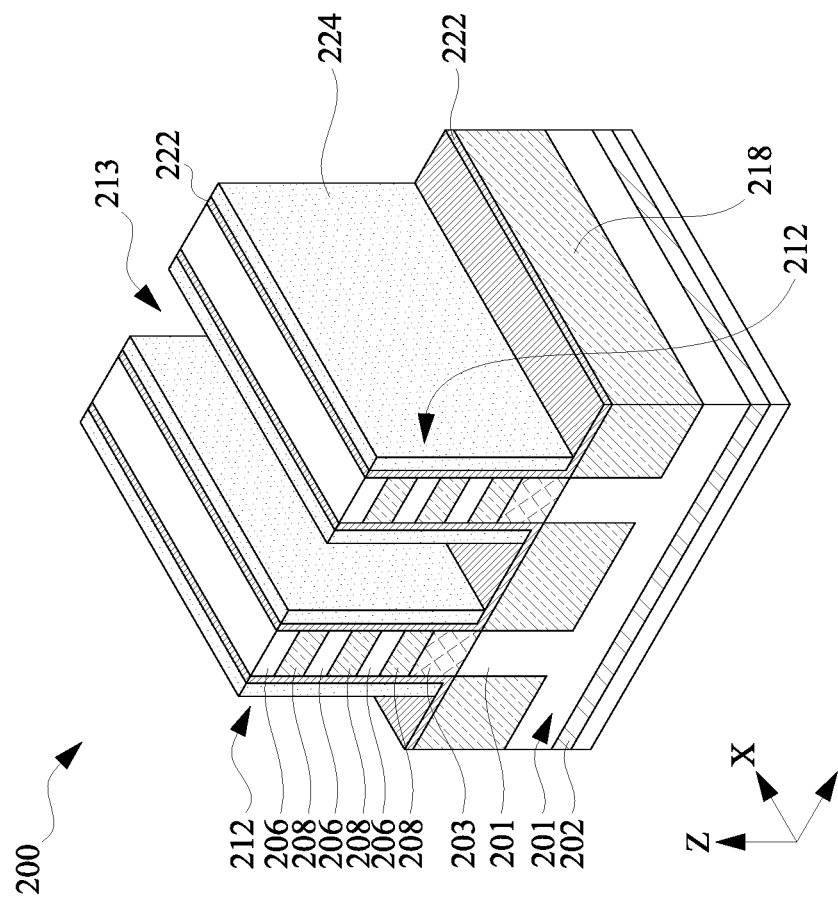
Fig. 36B
Fig. 36A

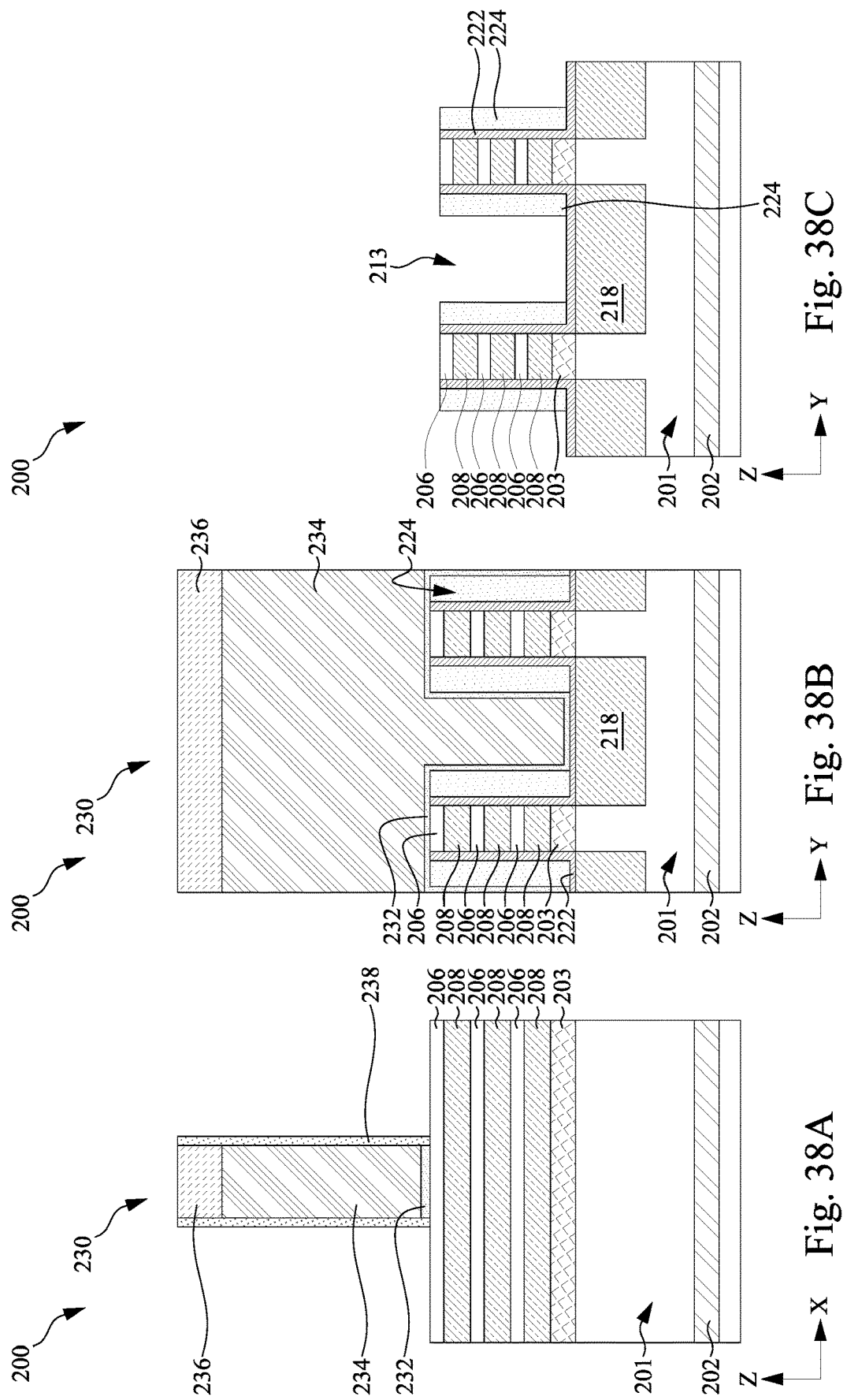

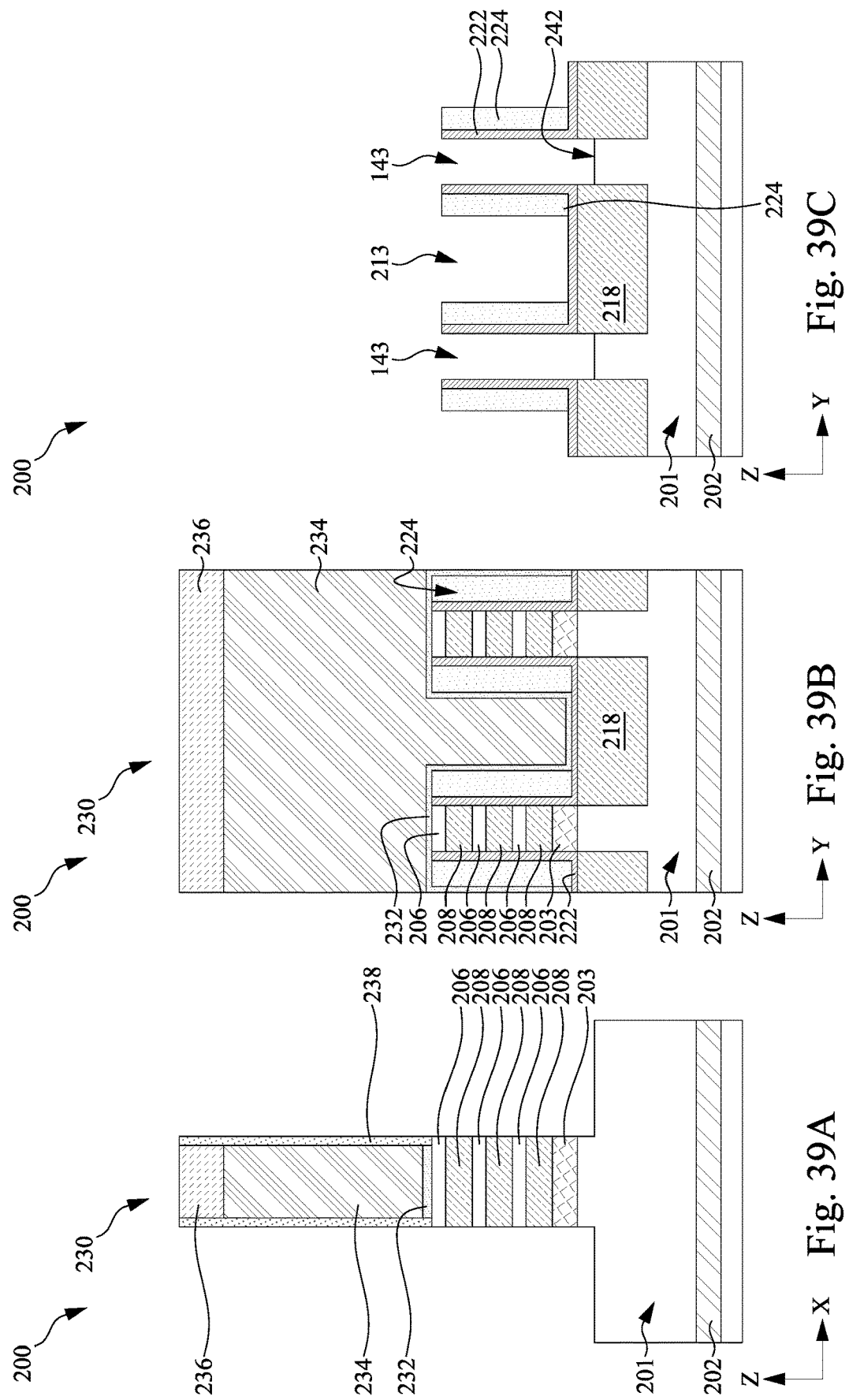

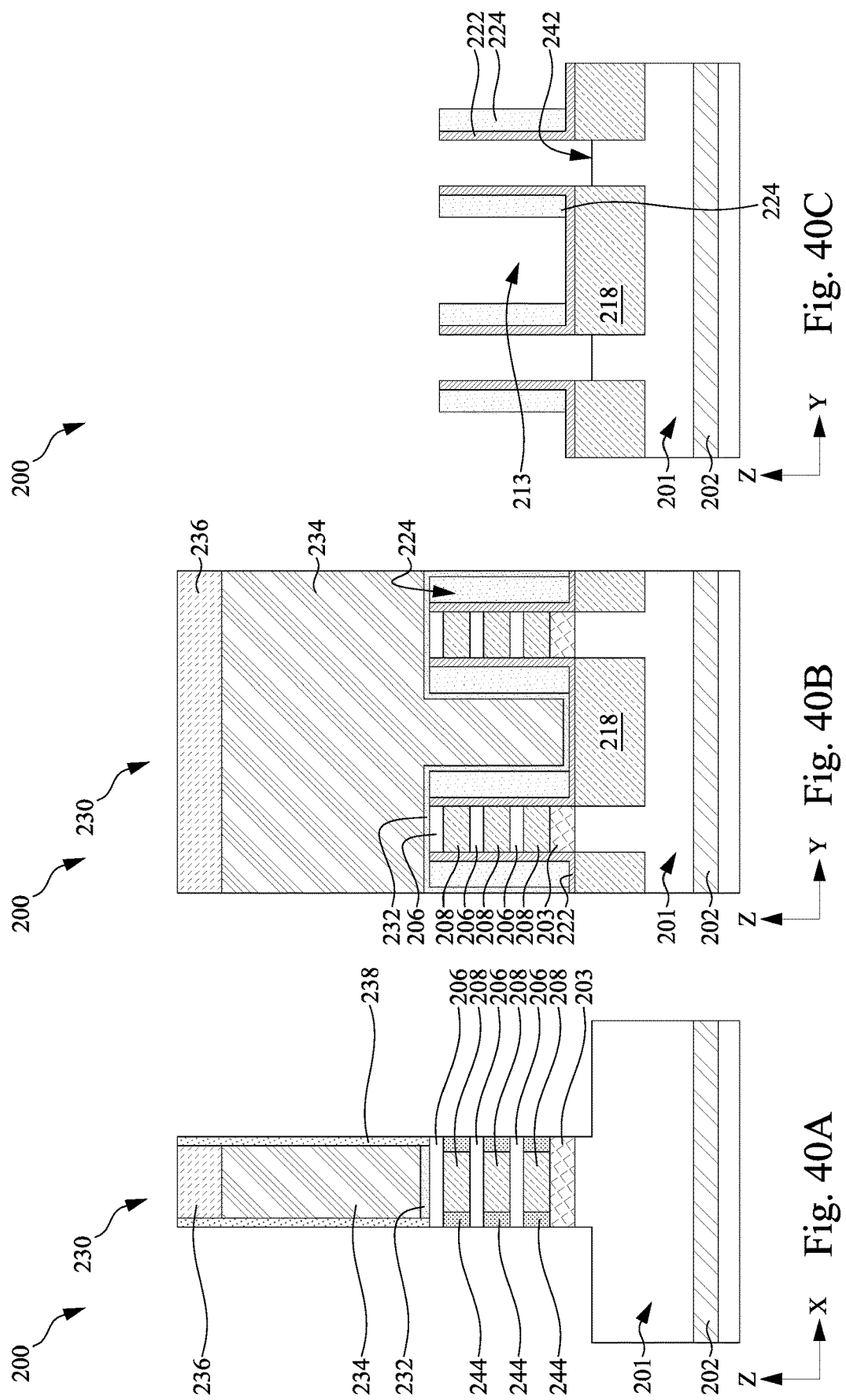

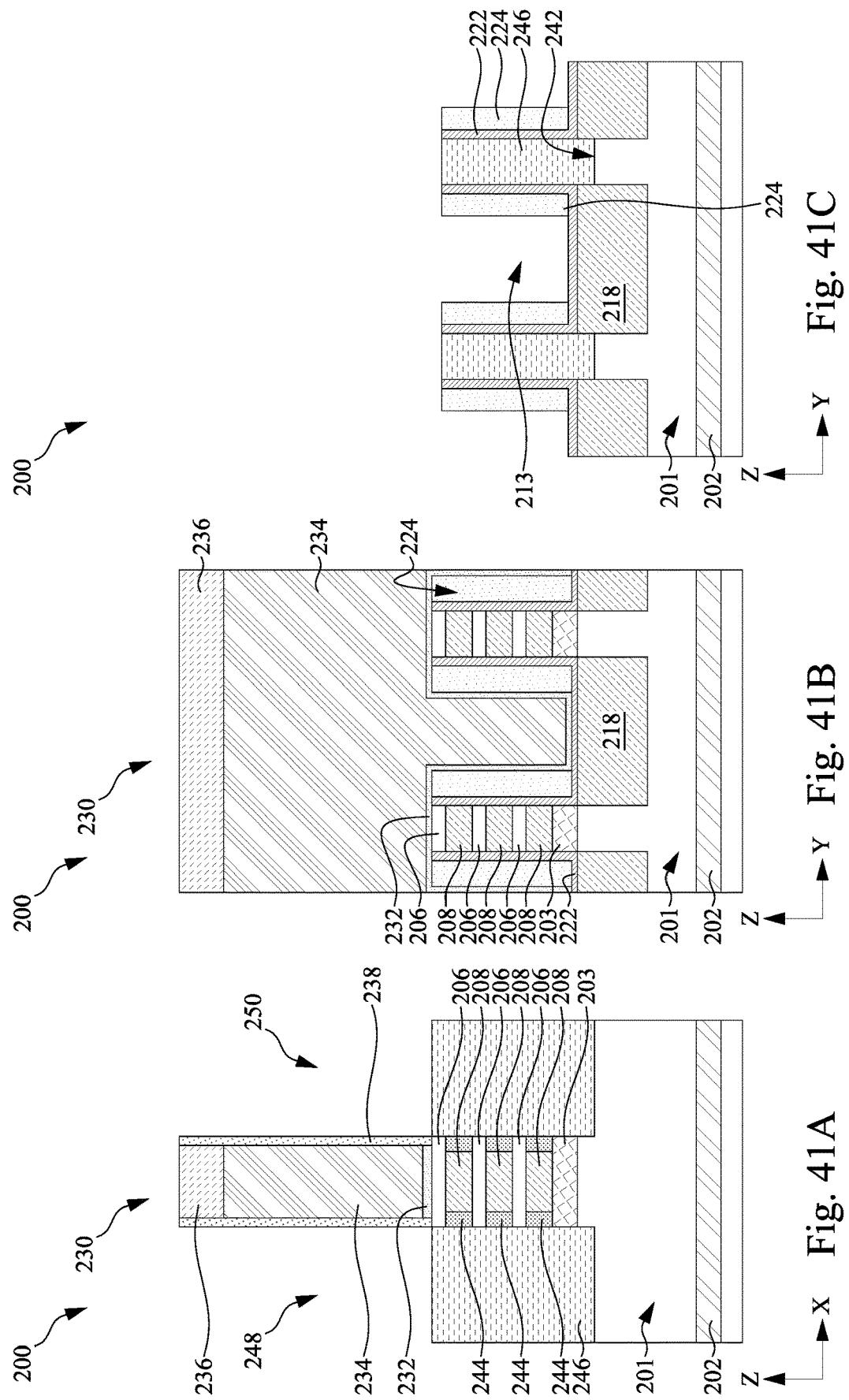

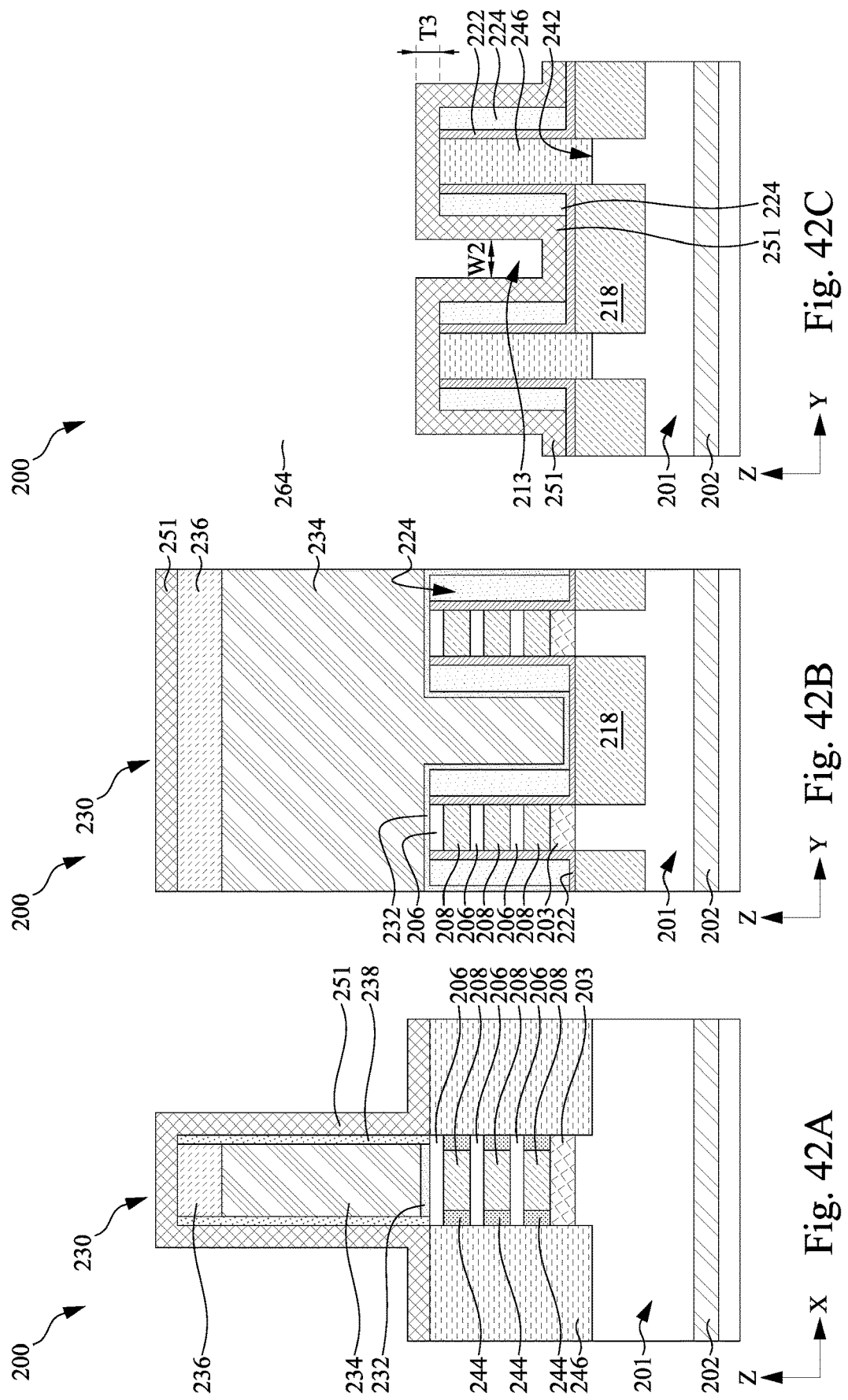

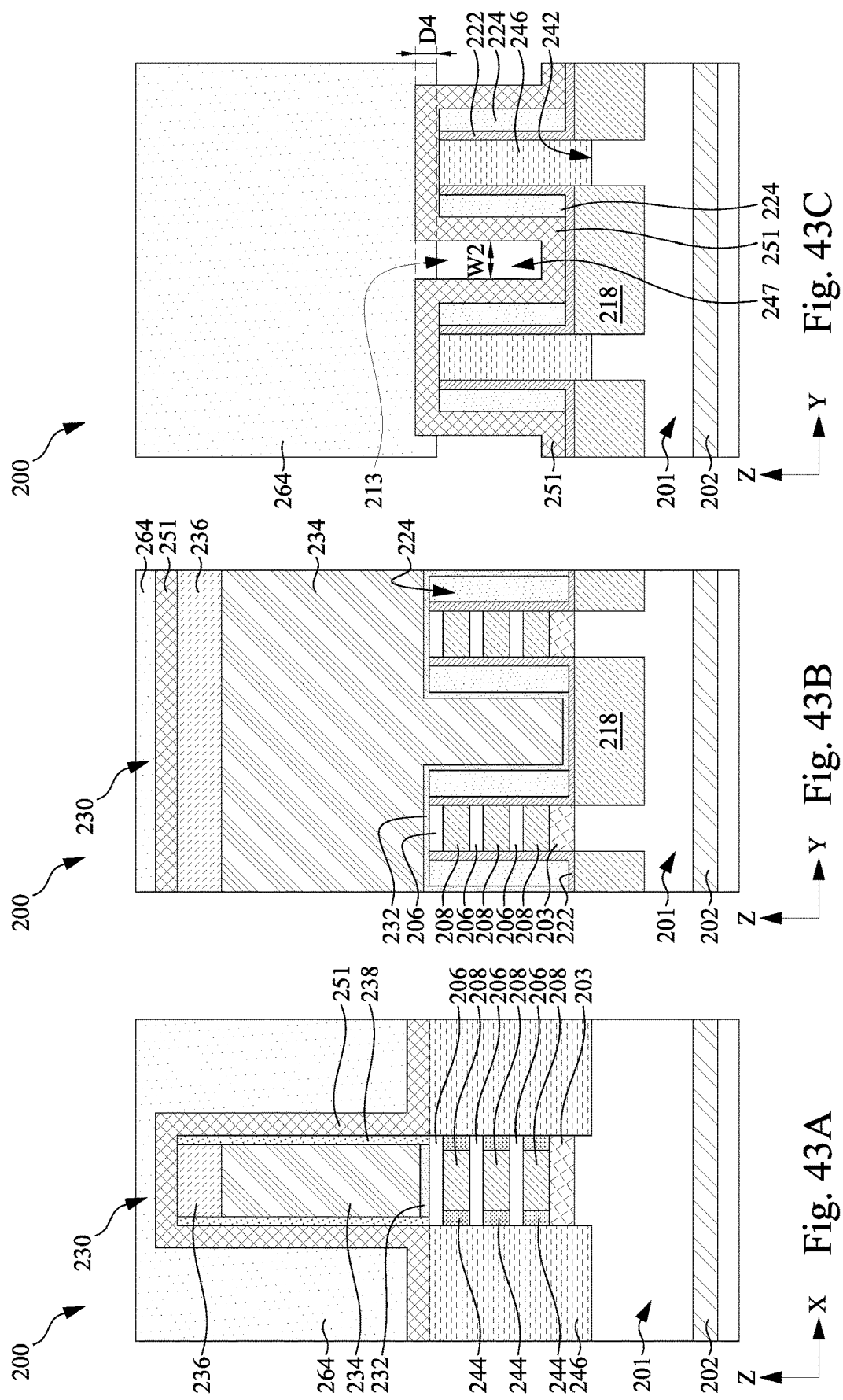

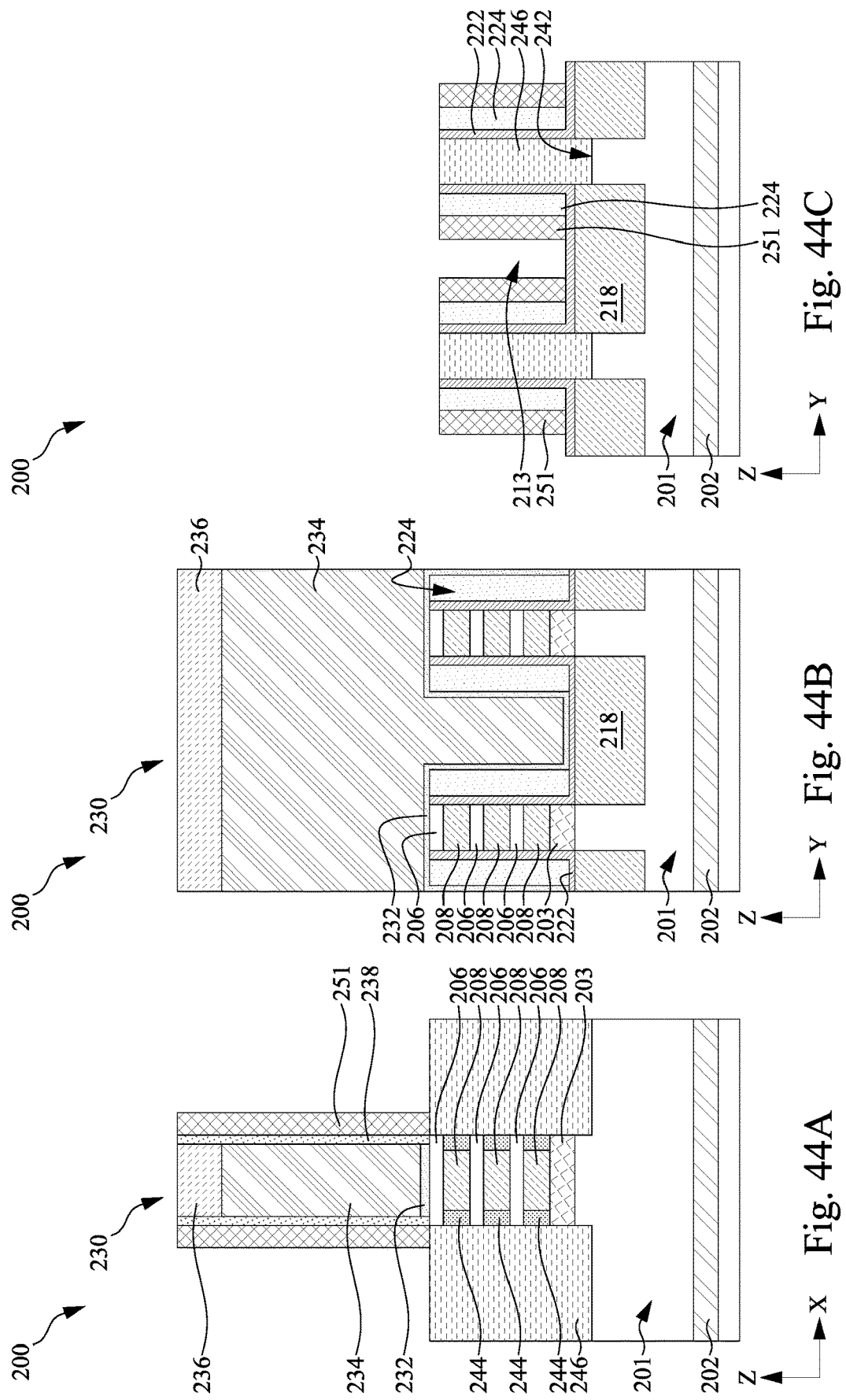

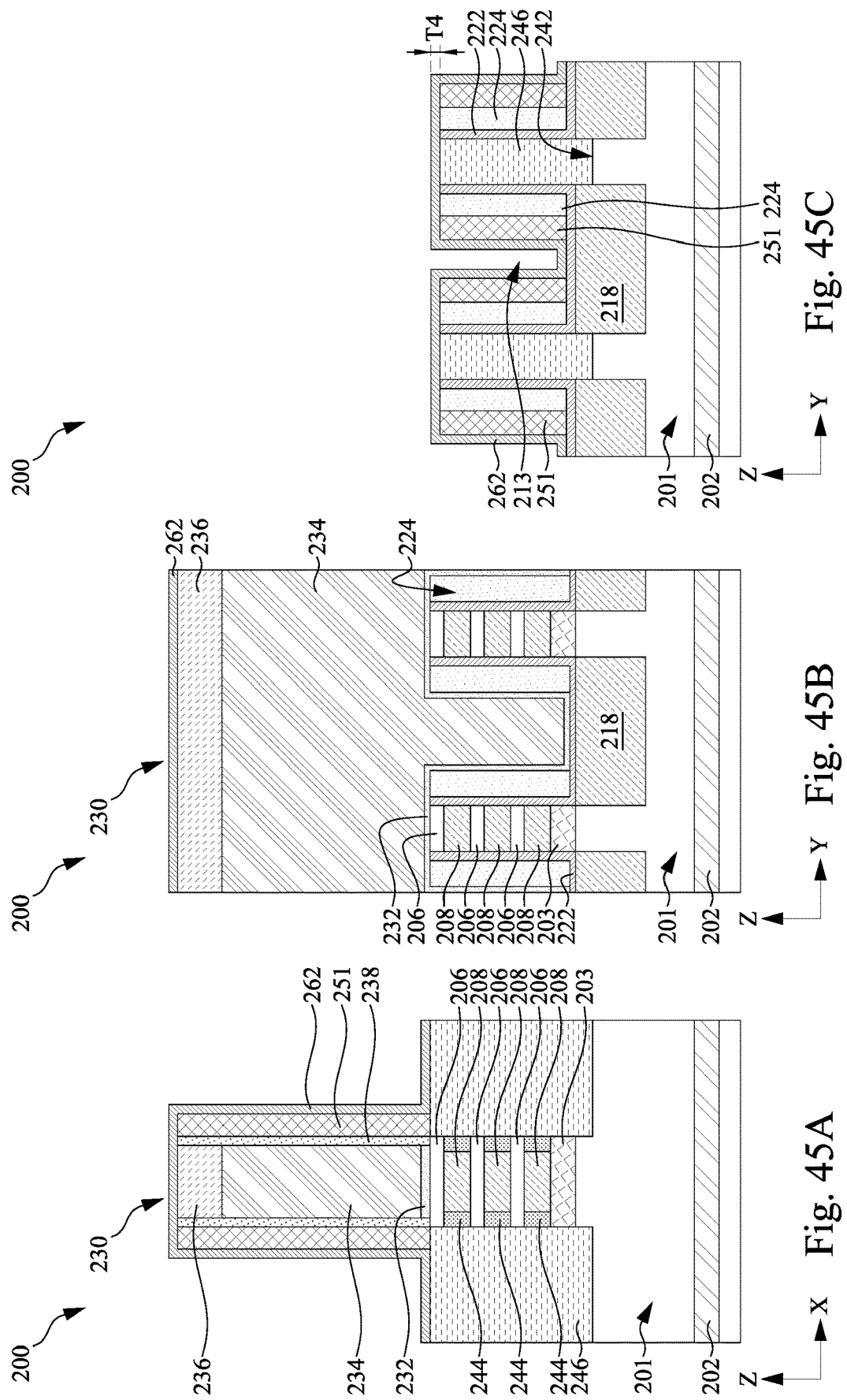

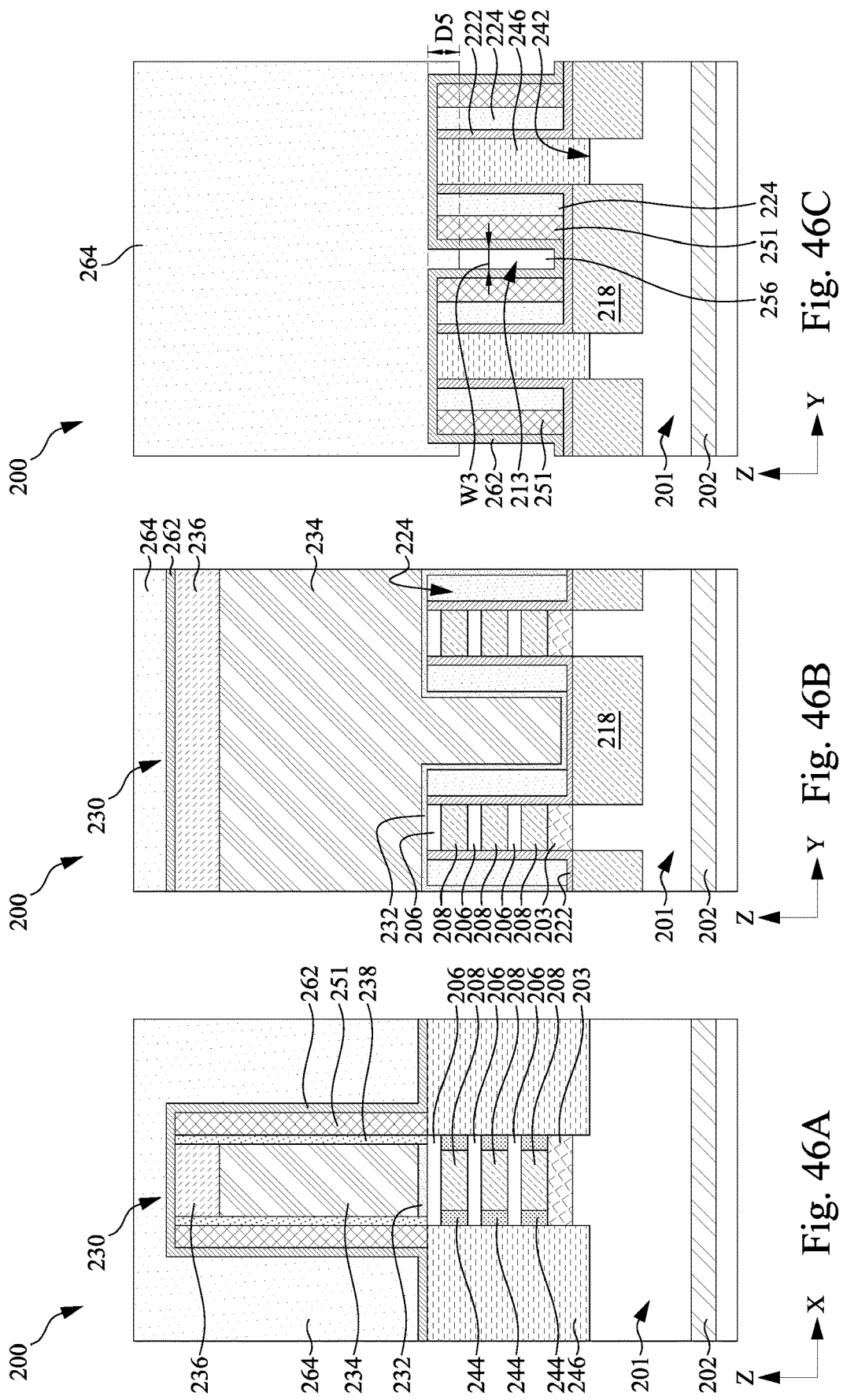

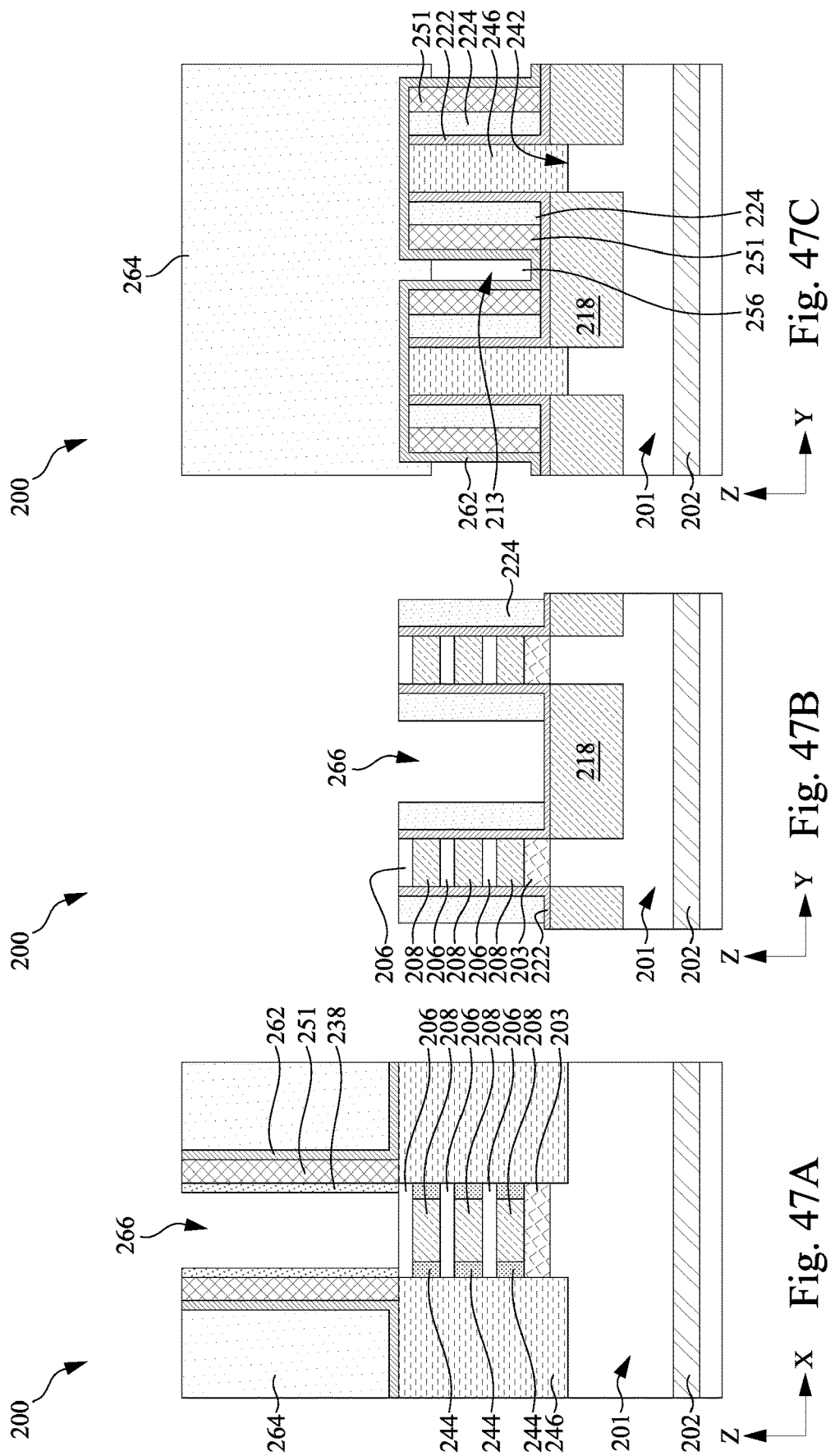

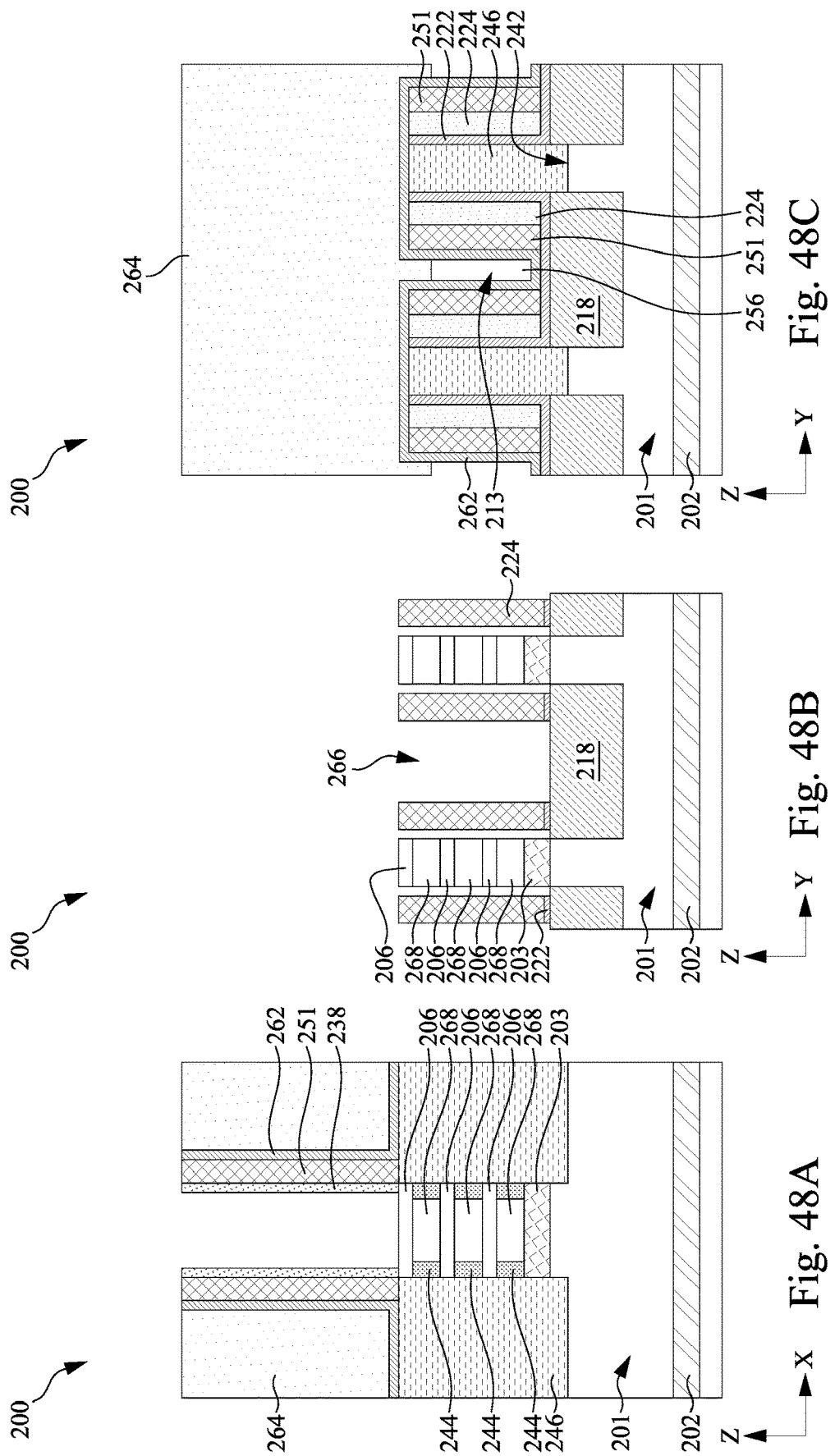

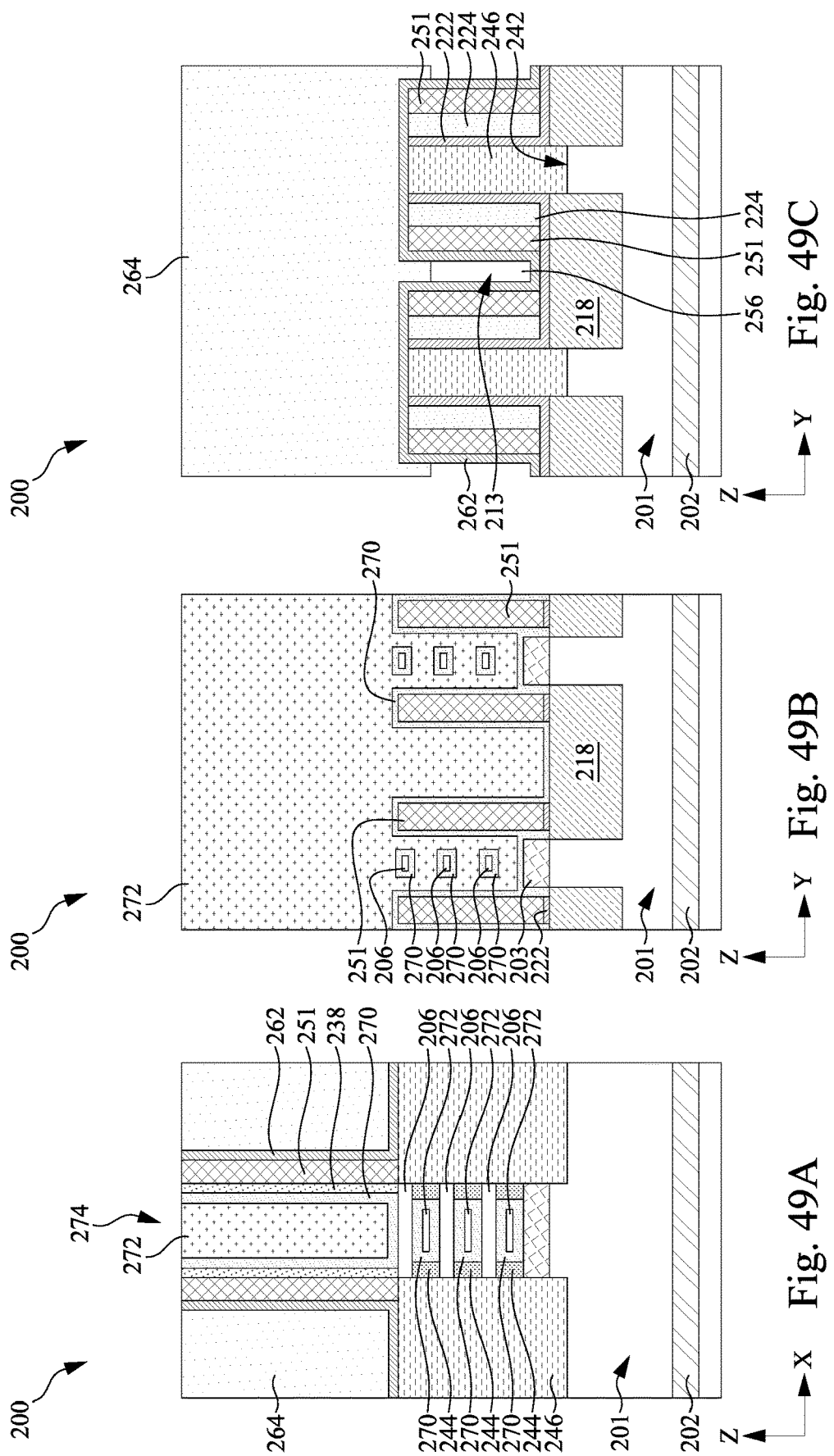

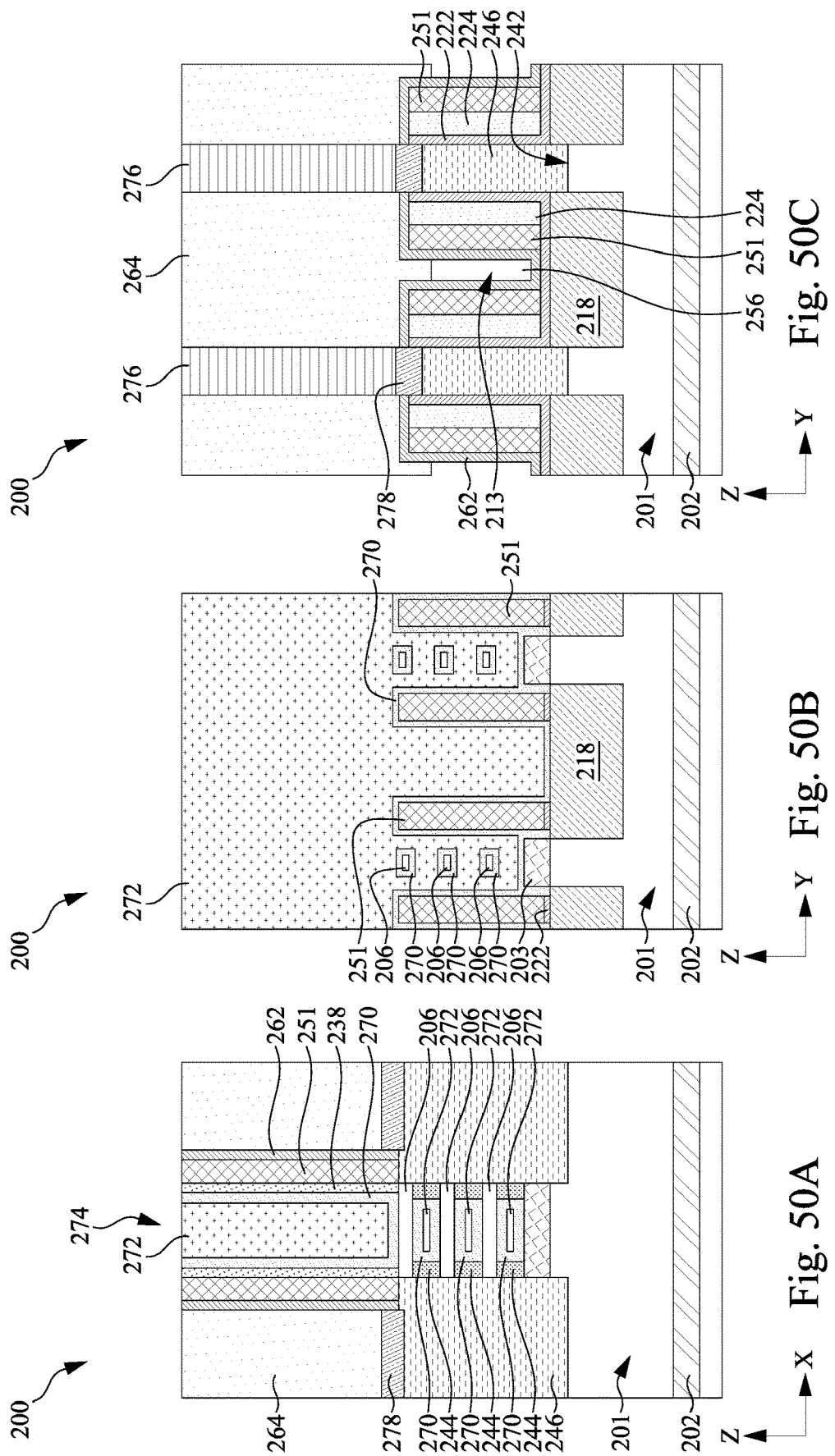

SEMICONDUCTOR DEVICE STRUCTURE INCORPORATING AIR GAP

BACKGROUND

As the semiconductor industry introduces new generations of integrated circuits (IC) having higher performance and more functionality, the density of the elements forming the ICs increases, while the dimensions, sizes and spacing between components or elements are reduced. In the past, such reductions were limited only by the ability to define the structures photo-lithographically, device geometries having smaller dimensions also created new limiting factors. For example, isolation structures such as dielectric fins are used between active regions (e.g., regions where n-type MOSFET devices and p-type MOSFET devices are located) to isolate n-type and p-type devices from abnormal electrical misconnections. As device size reduces, such dielectric fins may not effectively isolate the n-type and p-type devices, resulting in relatively high parasitic fringing capacitances between neighboring electrically-conductive features and/or between transistor gates and neighboring electrically-conductive features. This high fringing capacitance can cause increased power consumption, an increase in the resistive-capacitive (RC) time constant, and poor device performance. Therefore, there is a need to improve processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-1B are perspective and cross-sectional side views of one of the various stages of a semiconductor device structure in accordance with some embodiments.

FIGS. 3A-3B are perspective view and cross-sectional side views of one of the various stages of the semiconductor device structure in accordance with some embodiments.

FIGS. 4A-4B are perspective view and cross-sectional side views of one of the various stages of the semiconductor device structure in accordance with some embodiments.

FIGS. 8A-8B are perspective view and cross-sectional side views of one of the various stages of the semiconductor device structure in accordance with some embodiments.

FIGS. 9A-9B are perspective view and cross-sectional side views of one of the various stages of the semiconductor device structure in accordance with some embodiments.

FIGS. 12A, 12B, and 12C are cross-sectional side views of various stages of manufacturing the semiconductor device structure taken along line A-A, line B-B, and line C-C of FIG. 11 in accordance with some embodiments.

FIGS. 14A, 14B, and 14C are cross-sectional side views of various stages of manufacturing the semiconductor device structure taken along line A-A, line B-B, and line C-C of FIG. 11 in accordance with some embodiments.

FIGS. 15A, 15B, and 15C are cross-sectional side views of various stages of manufacturing the semiconductor device structure taken along line A-A, line B-B, and line C-C of FIG. 11 in accordance with some embodiments.

FIGS. 18A, 18B, and 18C are cross-sectional side views of various stages of manufacturing the semiconductor device structure taken along line A-A, line B-B, and line C-C of FIG. 11 in accordance with some embodiments.

FIGS. 19A, 19B, and 19C are cross-sectional side views of various stages of manufacturing the semiconductor device structure taken along line A-A, line B-B, and line C-C of FIG. 11 in accordance with some embodiments.

FIGS. 20A, 20B, and 20C are cross-sectional side views of various stages of manufacturing the semiconductor device structure taken along line A-A, line B-B, and line C-C of FIG. 11 in accordance with some embodiments.

FIGS. 21A, 21B, and 21C are cross-sectional side views of various stages of manufacturing the semiconductor device structure taken along line A-A, line B-B, and line C-C of FIG. 11 in accordance with some embodiments.

FIGS. 22A, 22B, and 22C are cross-sectional side views of various stages of manufacturing the semiconductor device structure taken along line A-A, line B-B, and line C-C of FIG. 11 in accordance with some embodiments.

FIGS. 27-31 illustrate cross-sectional views of various stages of manufacturing the semiconductor device structure having a back-side power rail in accordance with some embodiments, and the cross-sectional views are taken along line D-D of FIG. 26.

FIGS. 32A-32B are perspective and cross-sectional side views of one of the various stages of a semiconductor device structure in accordance with embodiments of the present disclosure.

FIGS. 36A-36B are perspective view and cross-sectional side views of one of the various stages of the semiconductor device structure in accordance with some embodiments.

FIGS. 38A, 38B, and 38C are cross-sectional side views of various stages of manufacturing the semiconductor device structure taken along line A-A, line B-B, and line C-C of FIG. 37 in accordance with various embodiments.

FIGS. 39A, 39B, and 39C are cross-sectional side views of various stages of manufacturing the semiconductor device structure taken along line A-A, line B-B, and line C-C of FIG. 37 in accordance with various embodiments.

FIGS. 40A, 40B, and 40C are cross-sectional side views of various stages of manufacturing the semiconductor device structure taken along line A-A, line B-B, and line C-C of FIG. 37 in accordance with various embodiments.

FIGS. 41A, 41B, and 41C are cross-sectional side views of various stages of manufacturing the semiconductor device structure taken along line A-A, line B-B, and line C-C of FIG. 37 in accordance with some embodiments.

FIGS. 42A, 42B, and 42C are cross-sectional side views of various stages of manufacturing the semiconductor device structure taken along line A-A, line B-B, and line C-C of FIG. 37 in accordance with some embodiments.

FIGS. 43A, 43B, and 43C are cross-sectional side views of various stages of manufacturing the semiconductor device structure taken along line A-A, line B-B, and line C-C of FIG. 37 in accordance with some embodiments.

FIGS. 44A, 44B, and 44C are cross-sectional side views of various stages of manufacturing the semiconductor device structure taken along line A-A, line B-B, and line C-C of FIG. 37 in accordance with some embodiments.

FIGS. 45A, 45B, and 45C are cross-sectional side views of various stages of manufacturing the semiconductor device structure taken along line A-A, line B-B, and line C-C of FIG. 37 in accordance with some embodiments.

FIGS. 46A, 46B, and 46C are cross-sectional side views of various stages of manufacturing the semiconductor device structure taken along line A-A, line B-B, and line C-C of FIG. 37 in accordance with some embodiments.

FIGS. 47A, 47B, and 47C are cross-sectional side views of various stages of manufacturing the semiconductor device structure taken along line A-A, line B-B, and line C-C of FIG. 37 in accordance with some embodiments.

FIGS. 48A, 48B, and 48C are cross-sectional side views of various stages of manufacturing the semiconductor device structure taken along line A-A, line B-B, and line C-C of FIG. 37 in accordance with some embodiments.

FIGS. 49A, 49B, and 49C are cross-sectional side views of various stages of manufacturing the semiconductor device structure taken along line A-A, line B-B, and line C-C of FIG. 37 in accordance with some embodiments.

FIGS. 50A, 50B, and 50C are cross-sectional side views of various stages of manufacturing the semiconductor device structure taken along line A-A, line B-B, and line C-C of FIG. 37 in accordance with some embodiments.

DETAILED DESCRIPTION

Figure 2A:
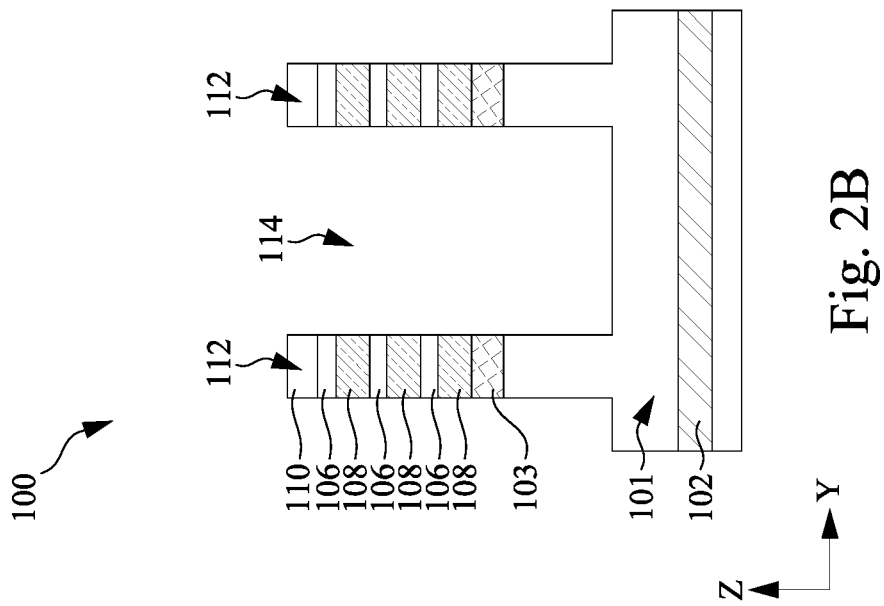
FIGS. 2A-2B are perspective view and cross-sectional side views of one of the various stages of the semiconductor device structure in accordance with some embodiments.
Figure 2B:
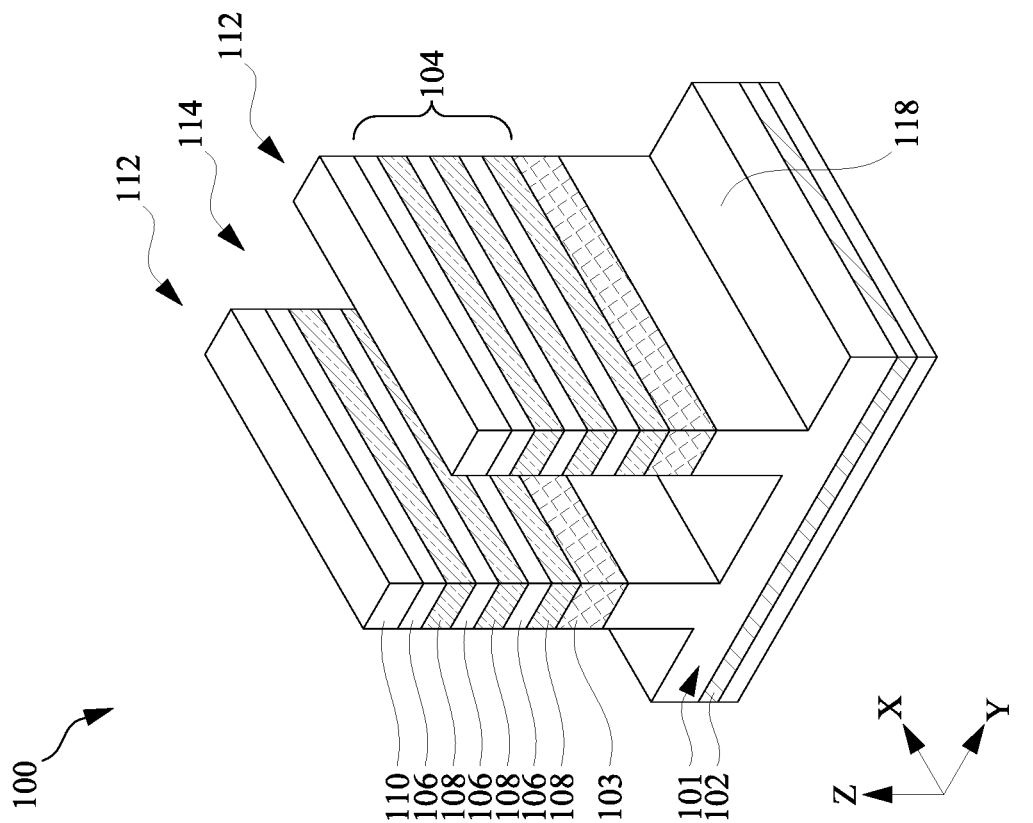

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

While some embodiments described in this disclosure are described in the context of nanosheet channel FETs, implementations of some aspects of the present disclosure may be used in other processes and/or in other devices, such as planar FETs, Fin-FETs, Horizontal Gate All Around (HGAA) FETs, Vertical Gate All Around (VGAA) FETs, and other suitable devices. A person having ordinary skill in the art will readily understand other modifications that may be made are contemplated within the scope of this disclosure. In cases where gate all around (GAA) transistor structures are adapted, the GAA transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Figure 54:
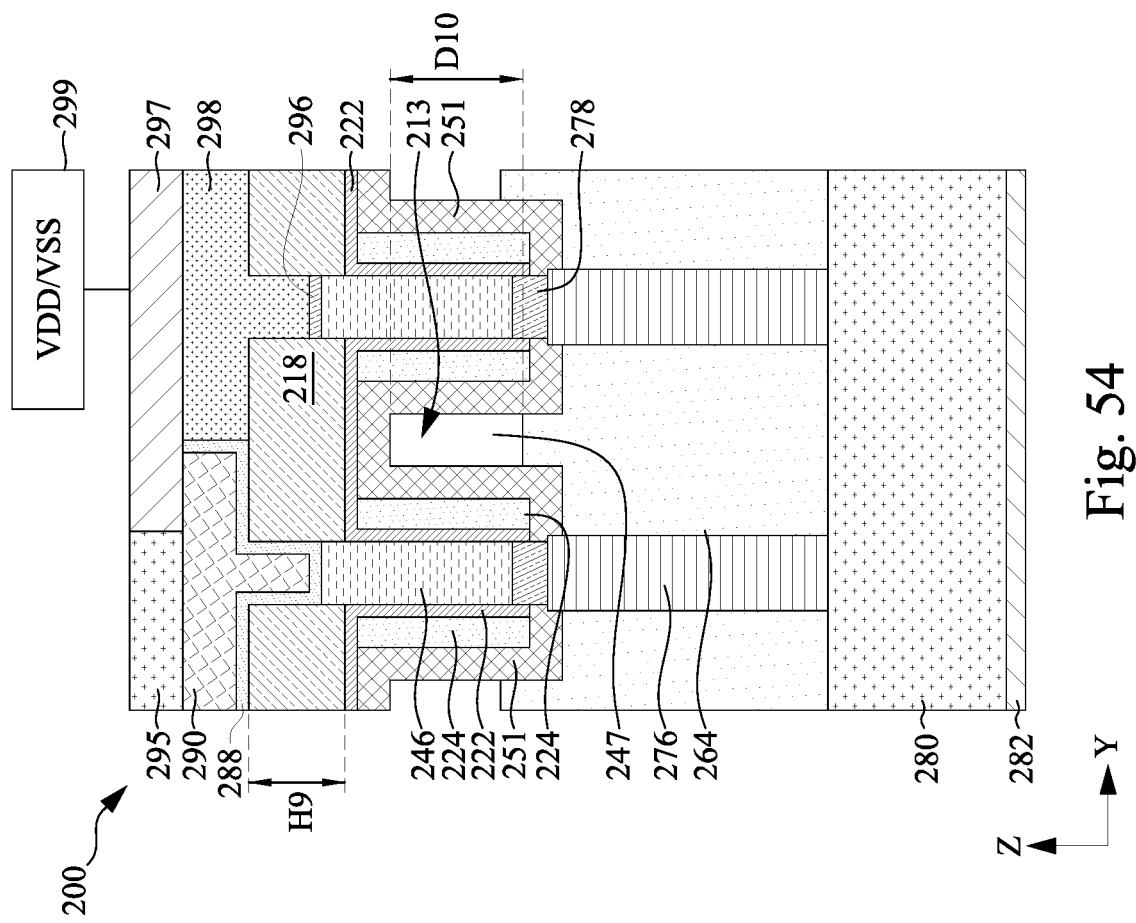
FIG. 54 illustrates another embodiment showing the stage after a backside power contact has been formed on a semiconductor device structure.

FIGS. 1A-54 show exemplary processes for manufacturing a semiconductor device structure 100 according to embodiments of the present disclosure. It is understood that additional operations can be provided before, during, and after processes shown by FIGS. 1A-54, and some of the operations described below can be replaced or eliminated, for additional embodiments of the method. The order of the operations/processes is not limiting and may be interchangeable.

FIGS. 1A-10A are perspective views of one of the various stages of the semiconductor device structure 100 in accordance with some embodiments. FIGS. 2B-10B are cross-sectional side views of the semiconductor device structure 100 of FIGS. 1A-10A taken along line E-E of FIG. 1A. As shown in FIG. 1A, a substrate 101 is provided to form a semiconductor device thereon. The substrate 101 may include a single crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb) and indium phosphide (InP). In one embodiment, the substrate 101 is made of silicon. In some embodiments, the substrate 101 is a silicon-on-insulator (SOI) substrate, which includes an insulating layer 102 (e.g., oxide) disposed between two silicon layers for enhancement.

The substrate 101 may include various regions that have been doped with impurities (e.g., dopants having p-type or n-type conductivity). Depending on circuit design, the dopants may be, for example boron for an n-type field effect transistors (NFET) and phosphorus for a p-type field effect transistors (PFET).

The substrate 101 may include one or more buffer layers 103 (only one buffer layer is shown) on the surface of the substrate 101. The buffer layers 103 can serve to gradually change the lattice constant from that of the substrate to that of the source/drain regions to be formed over the substrate 101. The buffer layers 103 may be formed from epitaxially grown single crystalline semiconductor materials such as, but not limited to Si, Ge, germanium tin (GeSn), SiGe, GaAs, InSb, GaP, GaSb, InAlAs, InGaAs, GaSbP, GaAsSb, GaN, GaP, and InP. In one embodiment, the substrate 101 includes SiGe buffer layers epitaxially grown on the silicon substrate 101. The germanium concentration of the SiGe buffer layers may increase from 30 atomic percent germanium for the bottom-most buffer layer to 70 atomic percent germanium for the top-most buffer layer.

A stack of semiconductor layers 104 is formed over the buffer layer 103. The stack of semiconductor layers 104 includes alternating semiconductor layers made of different materials to facilitate formation of nanosheet channels in a multi-gate device, such as nanosheet channel FETs. In some embodiments, the stack of semiconductor layers 104 includes first semiconductor layers 106 and second semiconductor layers 108. In some embodiments, the stack of semiconductor layers 104 includes alternating first and second semiconductor layers 106, 108. The first semiconductor layers 106 and the second semiconductor layers 108 are made of semiconductor materials having different etch selectivity and/or oxidation rates. For example, the first semiconductor layers 106 may be made of Si and the second semiconductor layers 108 may be made of SiGe. In some examples, the first semiconductor layers 106 may be made of SiGe and the second semiconductor layers 108 may be made of Si. Alternatively, in some embodiments, either of the semiconductor layers 106, 108 may be or include other materials such as Ge, SiC, GeAs, GaP, InP, InAs, InSb, GaAsP, AlInAs, AlGaAs, InGaAs, GaInP, GaInAsP, or any combinations thereof.

The first semiconductor layers 106 or portions thereof may form nanosheet channel(s) of the semiconductor device structure 100 in later fabrication stages. The term nanosheet is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including, for example, a cylindrical in shape or substantially rectangular cross-section. The nanosheet channel(s) of the semiconductor device structure 100 may be surrounded by the gate electrode. The semiconductor device structure 100 may include a nanosheet transistor. The nanosheet transistors may be referred to as nanowire transistors, gate-all-around (GAA) transistors, multi-bridge channel (MBC) transistors, or any transistors having the gate electrode surrounding the channels. The use of the first semiconductor layers 106 to define a channel or channels of the semiconductor device structure 100 is further discussed below.

Three first semiconductor layers 106 and three second semiconductor layers 108 are alternately arranged as illustrated in FIG. 1A, which is for illustrative purposes and not intended to be limiting beyond what is specifically recited in the claims. It can be appreciated that any number of first and second semiconductor layers 106, 108 can be formed in the stack of semiconductor layers 104, and the number of layers depending on the predetermined number of channels for the semiconductor device structure 100.

As will be described in more detail below, the first semiconductor layers 106 may serve as channels for the semiconductor device structure 100 and the thickness is chosen based on device performance considerations. In some embodiments, each first semiconductor layer 106 has a thickness ranging from about 6 nanometers (nm) to about 12 nm. The second semiconductor layers 108 may eventually be removed and serve to define a vertical distance between adjacent channels for the semiconductor device structure 100 and the thickness is chosen based on device performance considerations. In some embodiments, each second semiconductor layer 108 has a thickness ranging from about 2 nm to about 6 nm.

The first and second semiconductor layers 106, 108 are formed by any suitable deposition process, such as epitaxy. By way of example, epitaxial growth of the layers of the stack of semiconductor layers 104 may be performed by a molecular beam epitaxy (MBE) process, a metalorganic chemical vapor deposition (MOCVD) process, and/or other suitable epitaxial growth processes.

In FIG. 2A, fins 112 are formed from the stack of semiconductor layers 104, the buffer layer 103, and a portion of the substrate 101. Each fin 112 has an upper portion including the semiconductor layers 106, 108 and a well portion 116 formed from the substrate 101. The fins 112 may be formed by patterning a hard mask layer 110 formed on the stack of semiconductor layers 104 using patterning operations including photo-lithography and etching processes.

The etching process can include dry etching, wet etching, reactive ion etching (RIE), and/or other suitable processes. The photo-lithography process may include forming a photoresist layer (not shown) over the hard mask layer 110, exposing the resist to a pattern, performing post-exposure bake processes, and developing the resist to form a masking element including the resist. In some embodiments, patterning the resist to form the masking element may be performed using an electron beam (e-beam) lithography process. The masking element may then be used to protect regions of the substrate 101, and layers formed thereupon, while an etch process forms trenches 114 in unprotected regions through the hard mask layer 110, through the stack of semiconductor layers 104, the buffer layer 103, and into the substrate 101, thereby leaving the plurality of extending fins 112. The trenches 114 may be etched using a dry etch (e.g., RIE), a wet etch, and/or combination thereof.

In FIG. 3A, after the fins 112 are formed, an insulating material 118 is formed in the trenches 114 so that the fins 112 are embedded in the insulating material 118. Then, a planarization operation, such as a chemical mechanical polishing (CMP) method and/or an etch-back method, is performed such that the top of the fin 112 is exposed. The insulating material 118 may be made of silicon oxide, silicon nitride, silicon oxynitride (SiON), SiOCN, SiCN, fluorine-doped silicate glass (FSG), a low-K dielectric material, or any suitable dielectric material. The insulating material 118 may be formed by any suitable method, such as low-pressure chemical vapor deposition (LPCVD), plasma enhanced CVD (PECVD) or flowable CVD (FCVD).

In FIG. 4A, the insulating material 118 is recessed to form an isolation region 120. The recess of the insulating material 118 exposes portions of the fins 112, such as the hard mask layer 110, the stack of semiconductor layer 104, and the buffer layer 103. The recess of the insulating material 118 results in the trench 113 formed between the neighboring fins 112. The isolation region 120 may be formed using a suitable a dry etching process, a wet etching process, or a combination thereof. In some embodiments, the insulating material 118 is etched to expose at least a portion of the buffer layer 103 in the fins 112.

In some embodiments, the insulating material 118 may be recessed to have different heights, for example various heights "H1", "H2", "H3", and "H4" as shown in FIG. 4B. The heights "H1", "H2", "H3", and "H4" are measured along the Z-axis from the top surface of the insulating material 118 to the bottom surface of the insulating material 118, or to a horizontal surface of the substrate 101 from which the fins 112 extend upwardly. As will be discussed in more detail below, the heights "H1", "H2", "H3", and "H4" can be chosen to control the length of air gaps to be formed between the epitaxial S/D features. The greater the height of the insulating material 118, the shorter the air gaps in the semiconductor device structure 100. Exemplary structures having air gaps at different lengths are shown in FIGS. 52, 53A-53C and 54.

Figure 5B:
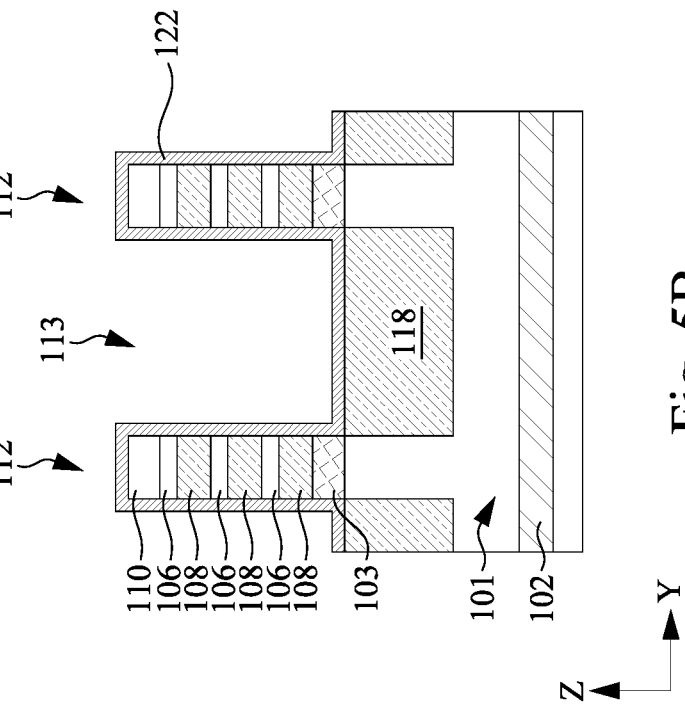
FIGS. 5A-5B are perspective view and cross-sectional side views of one of the various stages of the semiconductor device structure in accordance with some embodiments.
Figure 5A:
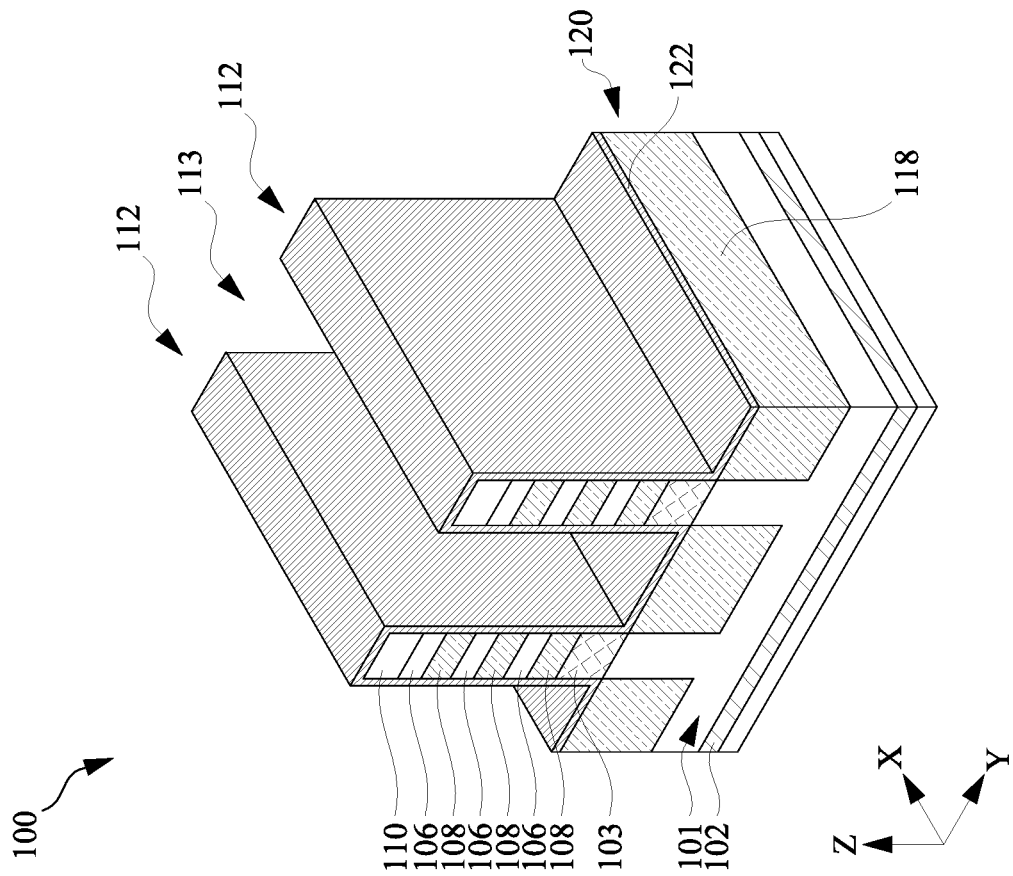

In FIG. 5A, a first liner layer 122 is conformally formed on the exposed surfaces of the semiconductor device structure 100. In one embodiment, the first liner layer 122 is conformally formed on the fins 112 and the top surface of the insulating material 118. The first liner 122 may be made of SiGe. Other silicon germanium-based materials such as SiGeC, Ge, or any suitable III/V compound semiconductor may also be used. The term "conformally" is used in this disclosure for ease of description upon a layer having substantial same thickness over various regions. The first liner layer 122 may be formed by an ALD process or any suitable deposition technique.

The first liner layer 122 may have a thickness in a range between about 1 nm and about 10 nm. The first liner layer 122 serves to protect the channel regions during subsequent processing of the fins 112 and/or to make room for replacement gate on the sidewalls of the stack of semiconductor layers 104 when the first liner layer 122 is removed in the later stage. Thus, if the thickness of the first liner layer 122 is less than about 1 nm, the first liner layer 122 may not be sufficient to protect the channel regions and/or provide enough room for the replacement gate on the sidewalls of the stack of semiconductor layers 104. On the other hand, if the thickness of the first liner layer 122 is greater than about 10 nm, the manufacturing cost is increased without significant advantage.

Figure 6B:
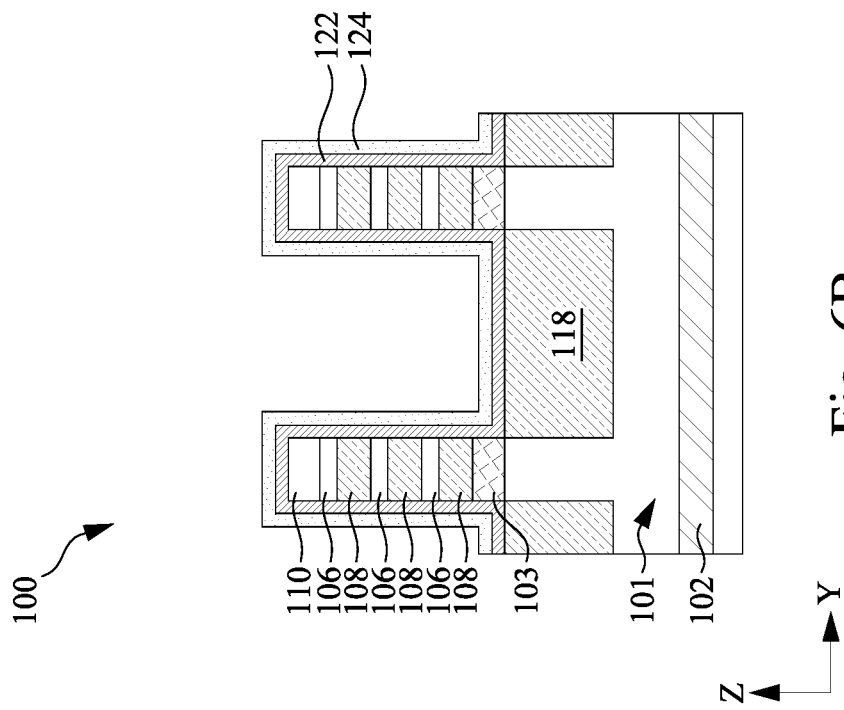
FIGS. 6A-6B are perspective view and cross-sectional side views of one of the various stages of the semiconductor device structure in accordance with some embodiments.
Figure 6A:
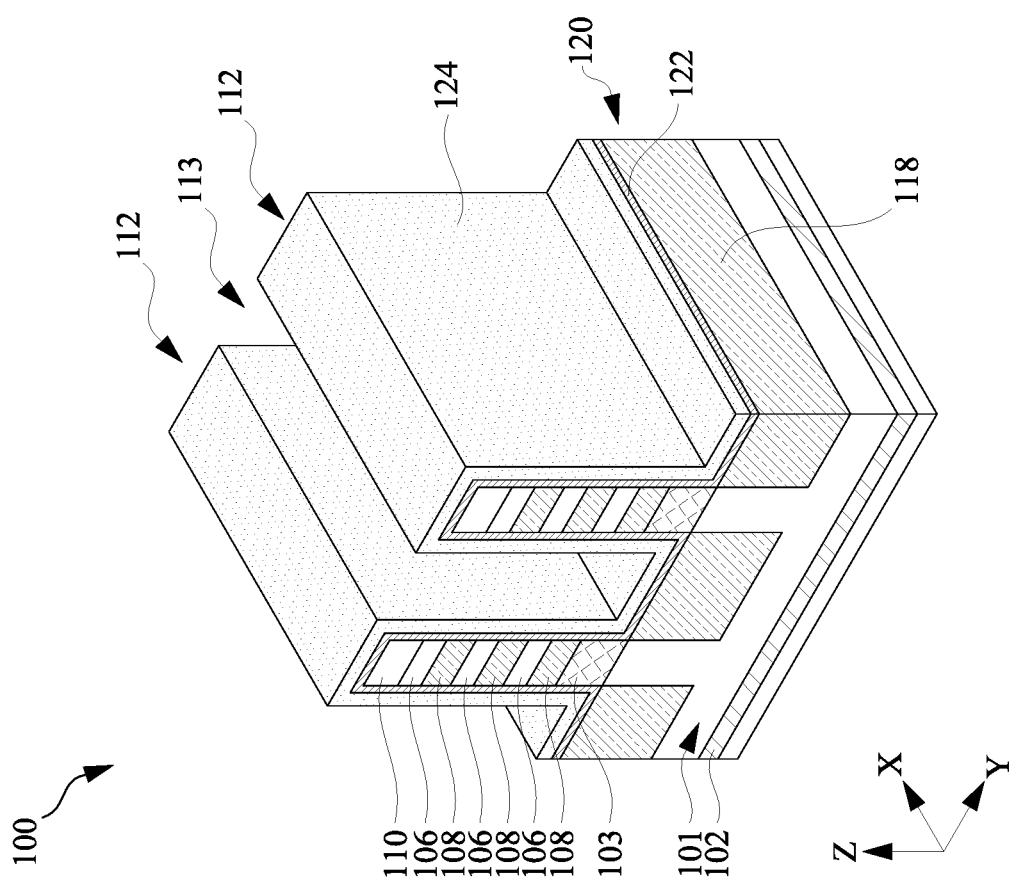

In FIG. 6A, a second liner layer 124 is conformally formed on the exposed surfaces of the semiconductor device structure 100. In one embodiment, the second liner layer 124 is conformally formed on the first liner layer 122. The material of the second liner layer 124 is selected to have different etch and/or oxidation rate relative to the material of the first liner layer 122. In some embodiments, the second liner layer 124 may be made of a nitride-based material (e.g., SiN) or a silicon nitride-based material (e.g., SiON, SiCN, SiOCN), or any material comprising Si, C, N, and O. The second liner layer 124 may be formed by an ALD process or any suitable deposition technique.

The second liner layer 124 may have a thickness in a range between about 0.5 nm and about 5 nm. The second liner layer 124 will be removed in the subsequent stage and the space created by removal of the second liner layer 124 provides room for the air gaps to be formed between the electrical-conductive structures (e.g., epitaxial S/D features 146 in FIG. 15C) of the semiconductor device structure 100. Therefore, if the thickness of the second liner layer 124 is less than about 0.5 nm, the dimensions of the air gap may be too small to sufficiently isolate neighboring electrical-conductive structures.

Figure 7B:
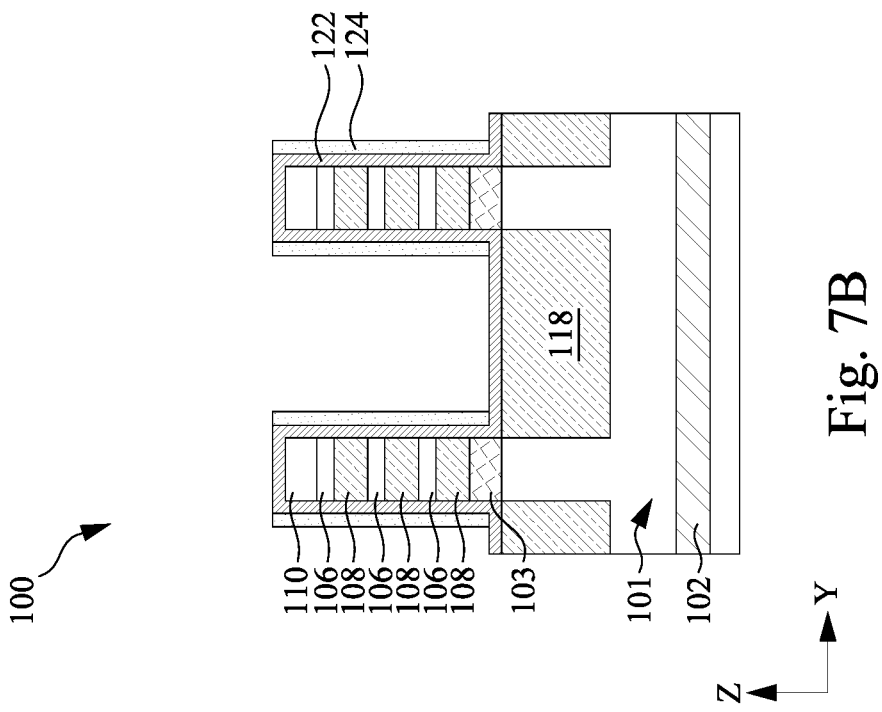
FIGS. 7A-7B are perspective view and cross-sectional side views of one of the various stages of the semiconductor device structure in accordance with some embodiments.
Figure 7A:
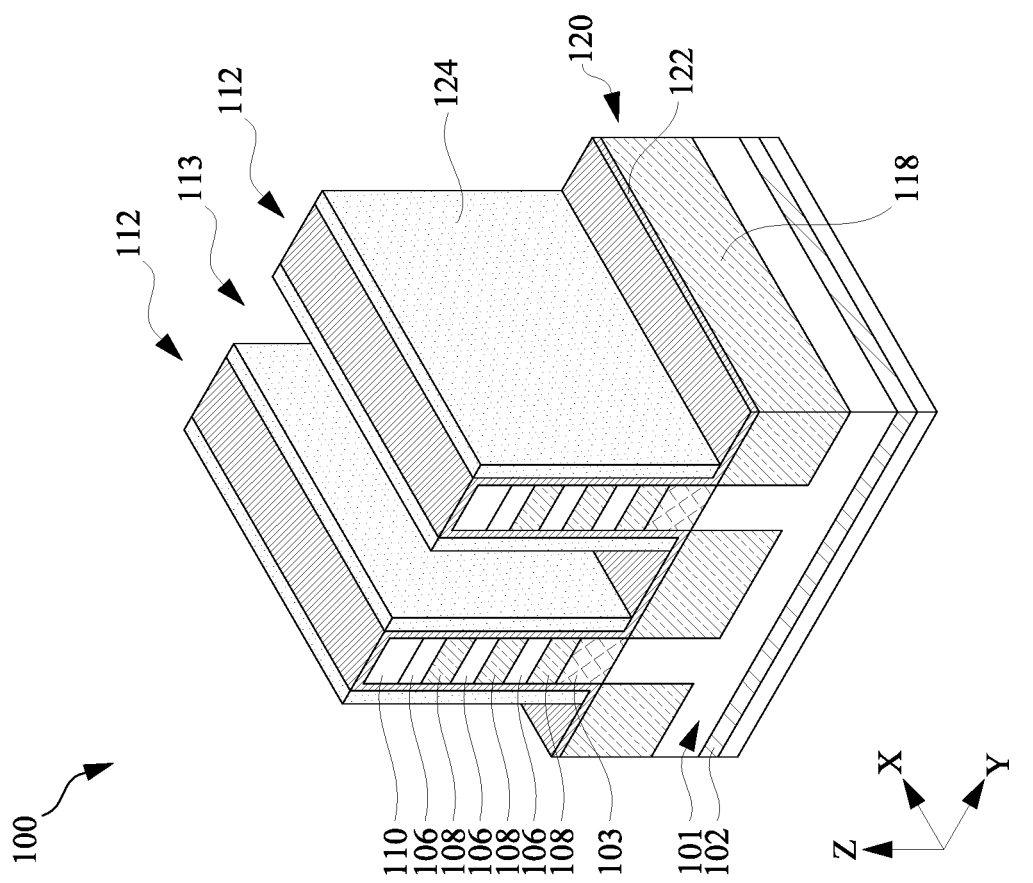

In FIG. 7A, portions of the second liner layer 124 are removed to expose the first liner layer 122 underneath. The second liner layer 124 may be removed by any suitable removal process. In one embodiment, the removal process is an anisotropic selective dry etch process. The anisotropic selective dry etch process removes portions of the second liner layer 124 from horizontal surfaces of the semiconductor device structure 100, such as the top of the fins 112 and the isolation region 120, while leaving the second liner layer 124 on the vertical surfaces, such as the portions of the first liner layer 122 in contact with the sidewalls of the fins 112. The anisotropic etching may be RIE or any suitable dry etching process.

In FIG. 8A, an insulating layer 126 is formed over the semiconductor device structure 100. The insulating layer 126 fills the trench 113 completely and extend over the top of the fins 112. The insulating layer 126 may be formed from an oxide-containing material (e.g., silicon oxide) or the like. The insulating layer 126 may be deposited by a CVD process, a sub-atmospheric CVD (SACVD) process, a FCVD process, an ALD process, or any suitable deposition technique.

In FIG. 9A, after the insulating layer 126 is formed, a planarization operation, such as CMP, is performed on the semiconductor device structure 100 to remove portions of the insulating layer 126. The planarization operation is performed until the top of the stack of semiconductor layers 104, the first liner layer 122, and the second liner layer 124 are exposed.

Figure 10A:
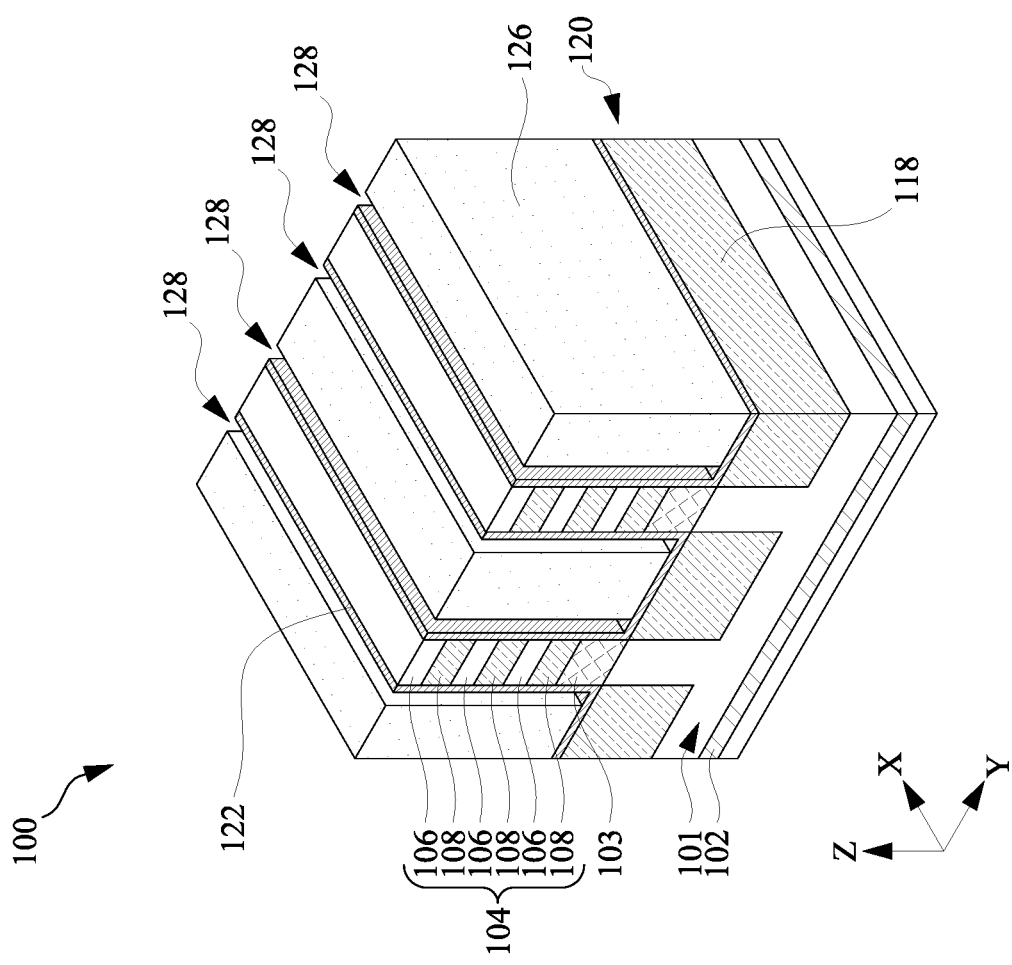
FIGS. 10A-10B are perspective view and cross-sectional side views of one of the various stages of the semiconductor device structure in accordance with some embodiments.
Figure 10B:
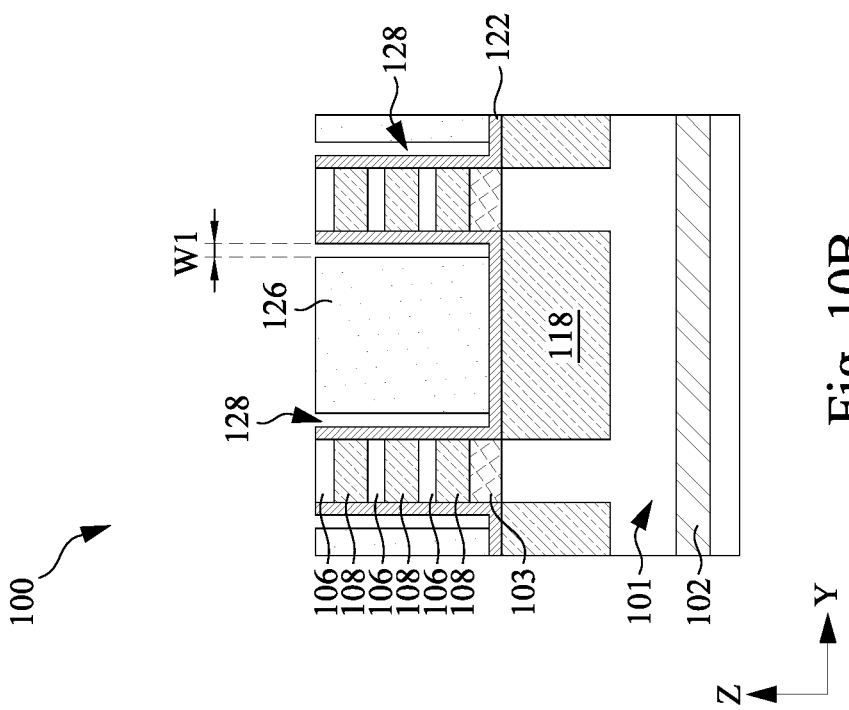

In FIG. 10A, the second liner layer 124 is removed by a selective removal process. The removal process may be an etch process, such as a wet etch, a dry etch, and/or a combination thereof. Since the first liner layer 122, the second liner layer 124 and the insulating layer 126 have different etch selectivity to an etchant, the etch process can selectively etch the second liner layer 124 without substantially etching the first liner layer 122 and the insulating layer 126. The removal of the second liner layer 124 forms a gap 128 between the first liner layer 122 and the insulating layer 126. Each gap 128 has a width "W1", which generally corresponds to the thickness of the second liner layer 124 as discussed above. The gaps 128 formed as a result of removing the second liner layer 124 provide additional room to the trench 143 (FIG. 13C) and help formation of a gap 145 (and thus an air gap) between the subsequently formed epitaxial S/D features 146 (FIG. 15C) and the insulating layer 126.

Figure 11:
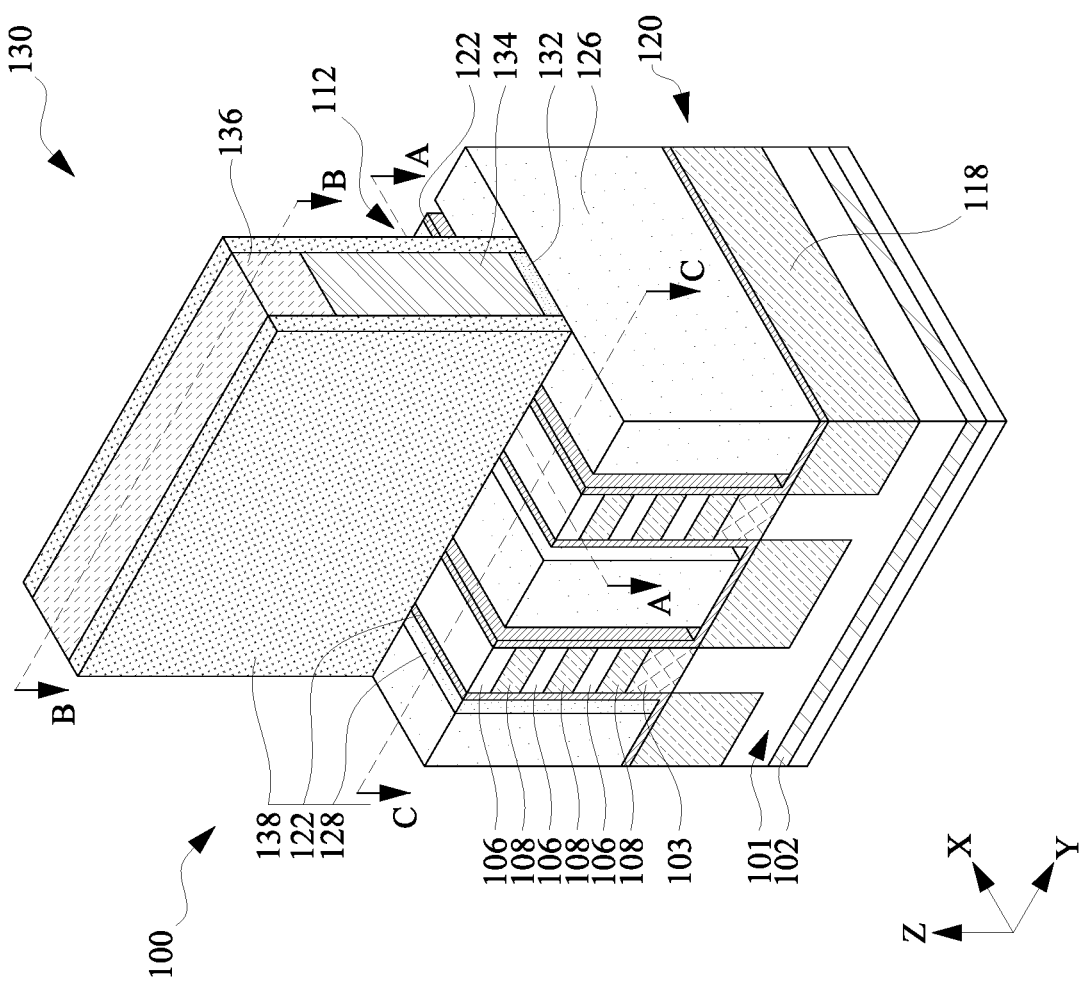
FIG. 11 illustrates a sacrificial gate structure formed over the semiconductor device structure of FIG. 10A.

In FIG. 11, a sacrificial gate structure 130 is formed over the semiconductor device structure 100. FIGS. 12A-24A are cross-sectional side views of various stages of manufacturing the semiconductor device structure 100 taken along line A-A of FIG. 11 in accordance with some embodiments. FIGS. 12B-24B are cross-sectional side views of various stages of manufacturing the semiconductor device structure 100 taken along line B-B of FIG. 11 in accordance with some embodiments. FIGS. 12C-24C are cross-sectional side views of various stages of manufacturing the semiconductor device structure 100 taken along line C-C of FIG. 11 in accordance with some embodiments. As can be seen in FIGS. 12A and 12B, the sacrificial gate structure 130 is formed over a portion of the fins 112 which are to be channel regions for the semiconductor device structure 100. The sacrificial gate structure 130 may include a sacrificial gate dielectric layer 132, a sacrificial gate electrode layer 134, and a mask layer 136. Gate spacers 138 are then formed on sidewalls of the sacrificial gate structure 130.

The sacrificial gate structure 130 may be formed by a blanket deposition of the sacrificial gate dielectric layer 132 over the semiconductor device structure 100. The sacrificial gate dielectric layer 132 may include one or more layers of dielectric material, such as a silicon oxide-based material. The sacrificial gate dielectric layer 132 may be deposited by a CVD process, a sub-atmospheric CVD (SACVD) process, a FCVD process, an ALD process, a PVD process, or other suitable process. Next, a sacrificial gate electrode layer 134 and a mask layer 136 are then blanket deposited on the sacrificial gate dielectric layer 132. The sacrificial gate electrode layer 134 may include silicon such as polycrystalline silicon or amorphous silicon. The mask layer 136 may include more than one layer, such as an oxide layer and a nitride layer. For example, the mask layer 136 may include a $SiO_2$ layer and a SiN or SiON layer. Next, a patterning operation including one or more lithography and etching processes is performed on the mask layer 136, the sacrificial gate electrode layer 134, and the sacrificial gate dielectric layer 132 to form the sacrificial gate structure 130. By patterning the layers of the sacrificial gate structure 130, the fins 112 are partially exposed on opposite sides of the sacrificial gate structure 130, thereby defining source/drain (S/D) regions for the semiconductor device structure 100. While only one sacrificial gate structure 130 is shown, the number of the sacrificial gate structure is not limited to one. Two or more sacrificial gate structures may be formed in the X direction in some embodiments.

The gaps 128 extend along the X direction between the S/D regions on opposite sides of the sacrificial gate structure 130. The gaps 128 also extend along the X direction under the sacrificial gate structure 130, as shown in FIG. 12B. Due to the small width "W1" (e.g., about 0.5-10 nm) of the gap 128, materials, such as the sacrificial gate structure 130 and the gate spacer 138, may seal the opening of the gap 128 before entering into the gaps 128. In other words, the gaps 128 are not filled by the materials formed thereover.

The gate spacer 138 is then formed on the sidewalls of the sacrificial gate dielectric layer 132, sacrificial gate electrode layer 134, and the mask layer 136. The gate spacer 138 may be formed by first depositing a conformal layer that is subsequently etched back to form gate spacers 138. For example, a spacer material layer can be disposed conformally on the exposed surfaces of the fins 112, the first liner layer 122, the insulating layer 126, on the sidewalls of the sacrificial gate structure 130. Subsequently, anisotropic etching is performed on the gate spacer 138 using, for example, RIE. During the anisotropic etching process, most of the spacer material is removed from horizontal surfaces, such as the tops of the fins 112, the first liner layer 122, and the insulating layer 126, leaving the gate spacers 138 on the vertical surfaces of the sacrificial gate structure 130, such as the sidewalls of the sacrificial gate dielectric layer 132, the sacrificial gate electrode layer 134, and the mask layer 136. The gate spacer 138 may be made of a dielectric material such as silicon oxide, silicon nitride, silicon carbide, silicon oxynitride, SiCN, silicon oxycarbide, SiOCN, and/or combinations thereof.

Figure 13C:
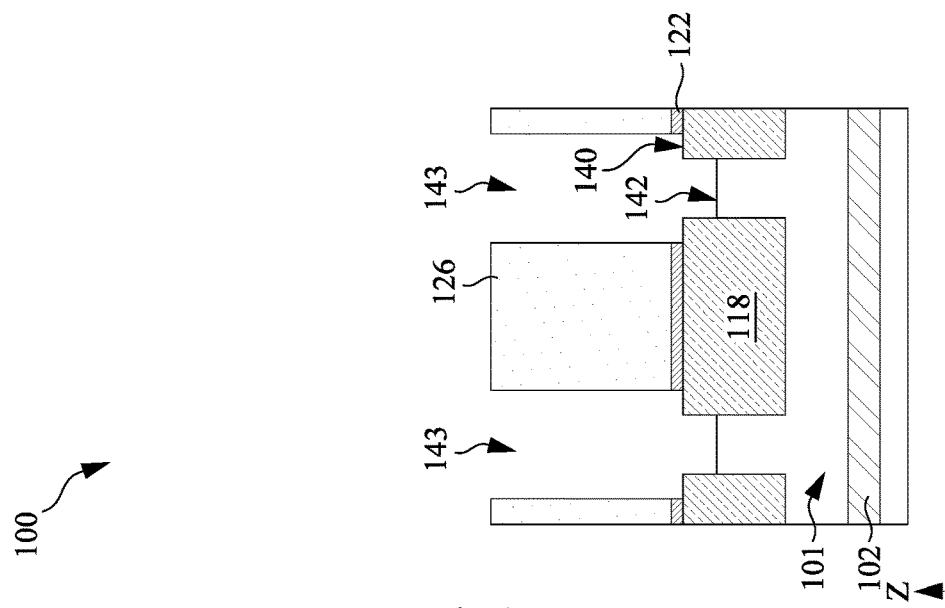
FIGS. 13A, 13B, and 13C are cross-sectional side views of various stages of manufacturing the semiconductor device structure taken along line A-A, line B-B, and line C-C of FIG. 11 in accordance with some embodiments.
Figure 13B:
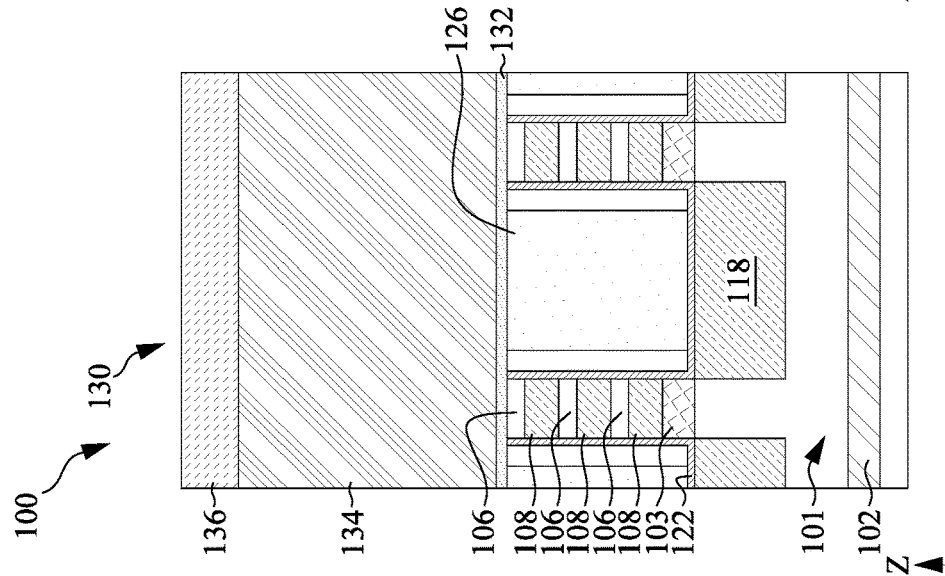
Figure 13A:
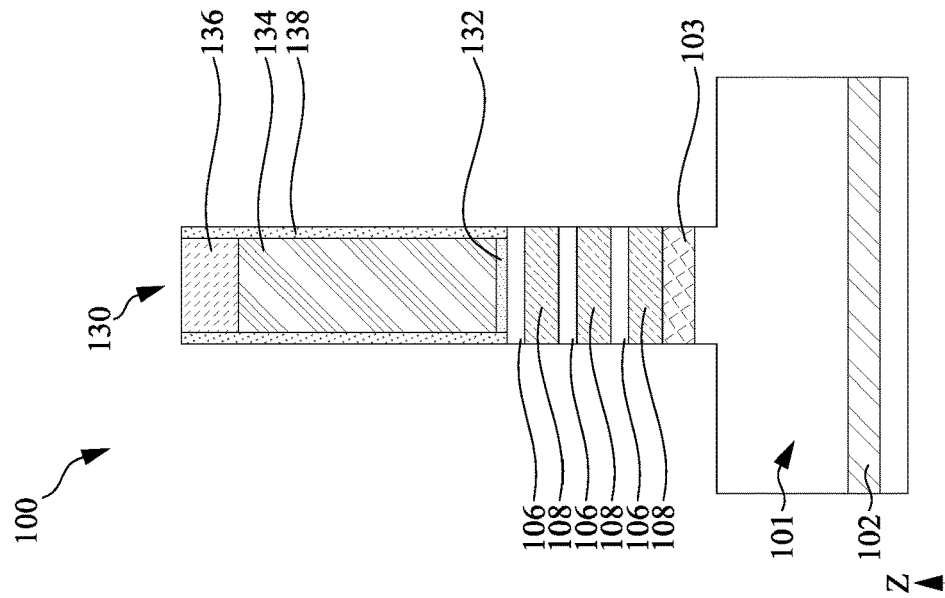

In FIG. 13A-13C, the portions of the fins 112 in the S/D regions (e.g., regions on opposite sides of the sacrificial gate structure 130) are recessed down below the top surface 140 of the isolation region 120 (or the insulating material 118), by using dry etching and/or wet etching. The recess of the fins 112 form trenches 143 between the neighboring insulating layers 126, as shown in FIG. 13C. Surfaces 142 of the substrate 101 may be exposed as the result of the recess of the portions of the fins 112. At this stage, end portions of the stack of semiconductor layers 104 and the buffer layer 103 under the sacrificial gate structure have substantially flat surfaces which may be flush with the gate spacers 138, as shown in FIG. 13A. In some embodiments, the end portions of the stack of semiconductor layers 104 and the buffer layer 103 under the sacrificial gate structure 130 are slightly horizontally etched.

In FIGS. 14A-14C, edge portions of each second semiconductor layer 108 are removed horizontally along the X direction. The removal of the edge portions of the second semiconductor layers 108 forms cavities. In some embodiments, the portions of the second semiconductor layers 108 are removed by a selective wet etching process. In cases where the second semiconductor layers 108 are made of SiGe and the first semiconductor layers 106 are made of silicon, the second semiconductor layer 108 can be selectively etched using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions.

After removing edge portions of each second semiconductor layers 108, a dielectric layer is deposited in the cavities to form dielectric spacers 144, as shown in FIG. 14A. The dielectric spacers 144 may be made of a low-K dielectric material, such as SiON, SiCN, SiOC, SiOCN, or SiN. The dielectric spacers 144 may be formed by first forming a conformal dielectric layer using a conformal deposition process, such as ALD, followed by an anisotropic etching to remove portions of the conformal dielectric layer other than the dielectric spacers 144. The dielectric spacers 144 are protected by the first semiconductor layers 106 during the anisotropic etching process. The remaining second semiconductor layers 108 are capped between the dielectric spacers 144 along the X direction.

In FIGS. 15A-15C, epitaxial S/D features 146 are formed within the trench 143 on the exposed surfaces 142 of the substrate 101. The epitaxial S/D features 146 may be made of one or more layers of Si, SiP, SiC and SiCP for an n-channel FET or Si, SiGe, Ge for a p-channel FET. The epitaxial S/D features 146 are in contact with the stack of the semiconductor layers 104 and the buffer layer 103, as shown in FIG. 15A. The epitaxial S/D features 146 may be the S/D regions. For example, one of a pair of epitaxial S/D features 146 located on one side of the sacrificial gate structure 130 (or the stack of semiconductor layers 104) can be a source region 148, and the other of the pair of epitaxial S/D features 146 located on the other side of the sacrificial gate structure 130 (or the stack of semiconductor layers 104) can be a drain region 150. A pair of epitaxial S/D features 146 refers herein to a source epitaxial feature 146 and a drain epitaxial feature 146 connected by the channels (e.g., the first semiconductor layers 106). It should be noted that a source and a drain are interchangeably used in this disclosure. Therefore, a source/drain (S/D) can refer to a source and/or a drain.

In some embodiments, the epitaxial S/D features 146 are formed in a general bar-shaped, having rectangular cross section in the YZ plane, as shown in FIG. 15C. As the gaps 128 (FIGS. 10A and 10B) that were formed as a result of removing the second liner layer 124 provide additional room within the trench 143, the bar-shaped epitaxial S/D features 146 can ensure epitaxial S/D features 146 do not completely fill the trenches 143 between the neighboring insulating layers 126. The resulting structure forms a gap 145 separating the insulating layer 126 from the epitaxial S/D features 146, as shown in FIG. 15C.

The gap 145 is defined by a distance "D2" between the sidewall of the epitaxial S/D features 146 and the sidewall of the insulating layer 126. The distance "D2" may be in a range from about 0.5 nm to about 10 nm, for example about 1 nm to about 5 nm, depending on the shape and/or dimension of the epitaxial S/D features 146 along the Z direction. If the distance "D2" is smaller than about 0.5 nm, the size the air gap may be too small to provide improved isolation between neighboring electrically-conductive features. If the distance "D2" is greater than about 10 nm, the epitaxial S/D features are reduced in its dimension and may affect the performance of the device.

The bar-shape epitaxial S/D features 146 may be formed by growing the epitaxial S/D features 146 on the substrate 101 having an appropriate crystal orientation, for example a Si substrate having a {110} or {100} crystal orientation. Alternatively, a transitional epitaxial layer (not shown) having an appropriate crystal orientation may be formed between the epitaxial S/D features 146 and the substrate 101. The transitional epitaxial layer may be formed from Si, SiGeB, SiP, SiAs, or the like, and the epitaxial S/D features 146 are grown on, for example, the (100) plane of the transitional epitaxial layer to achieve the bar-shaped structure. The epitaxial S/D features 146 and the transitional epitaxial layer (if used) may be formed by an epitaxial growth method using CVD, ALD, MBE, or any suitable deposition technique.

Additionally or alternatively, the epitaxial S/D features 146 may be formed with a controlled lateral growth so that the epitaxial S/D features 146 are grown with a distance "D2" between the sidewall of the epitaxial S/D features 146 and the sidewall of the insulating layer 126. For example, the epitaxial S/D features 146 may be formed by exposing the substrate 101 to an etchant and precursor gases for the epitaxial S/D features 146. That is, the etchant is co-flowed along with the precursor gases into a deposition chamber in which the semiconductor structure device is disposed. The etchant can reduce the growth rate of the epitaxial S/D features 146 in the Y direction, resulting in the epitaxial S/D features 146 grown along the Z direction at a distance "D2" from the sidewall of the insulating layer 126. Examples of the etchant may be HCl, $Cl_2$, or any suitable halogen gas. Examples of the precursor gases may include any suitable silicon containing gas, such as silane, disilane, an organosilane, or a halosilane, and/or germanium containing gas such as a germane.

In some embodiments, the epitaxial S/D features 146 below the top surface 140 of the insulating material 118 (or the isolation region 120) have a first dimension along the Y direction and the epitaxial S/D features 146 above the top surface 140 of the insulating material 118 have a second dimension along the Y direction, and the second dimension is greater than the first dimension. In some embodiments, a portion of the epitaxial S/D features 146 above the top surface 140 of the insulating material 118 may have a varying dimension along the Y direction gradually changing from the first dimension to the second dimension. Since the air gap has a lower k value compared to the dielectric fin that would otherwise be disposed between the semiconductor fins in conventional semiconductor device structures, the parasitic fringing capacitances or capacitive coupling between neighboring electrically-conductive features (e.g., epitaxial S/D features 146 and other conductive features adjacent the epitaxial S/D features 146 such as a conductive feature 198) can be reduced.

In some embodiments, the epitaxial S/D features 146 are formed so that a top surface 152 of the epitaxial S/D features 146 is below a top surface 154 of the insulating layer 126 by a distance "D1". The distance "D1" may be in a range of about 0.5 nm to about 5 nm. The distance "D1" allows a subsequently formed sealing material (e.g., the sealing material 158 in FIG. 16C) to better grip onto the top surface 152 of the epitaxial S/D features 146 and the top surface 154 of the insulating layer 126 due to the surface areas (e.g., the sidewalls of the insulating layer 126) contributed by the insulating layer 126. As a result, the sealing material 158 can have a minimum filling depth into the subsequently formed air gaps 156 (FIG. 18C) between the epitaxial S/D features 146 and the insulating layer 126. Thus, if the distance "D1" is less than about 0.5 nm, the increased surface areas may not be meaningful or sufficient to provide friction force for the subsequent sealing material 158. On the other hand, if the distance "D1" is greater than about 5 nm, the manufacturing cost of the sealing material 158 is increased without significant advantage.

Figure 16C:
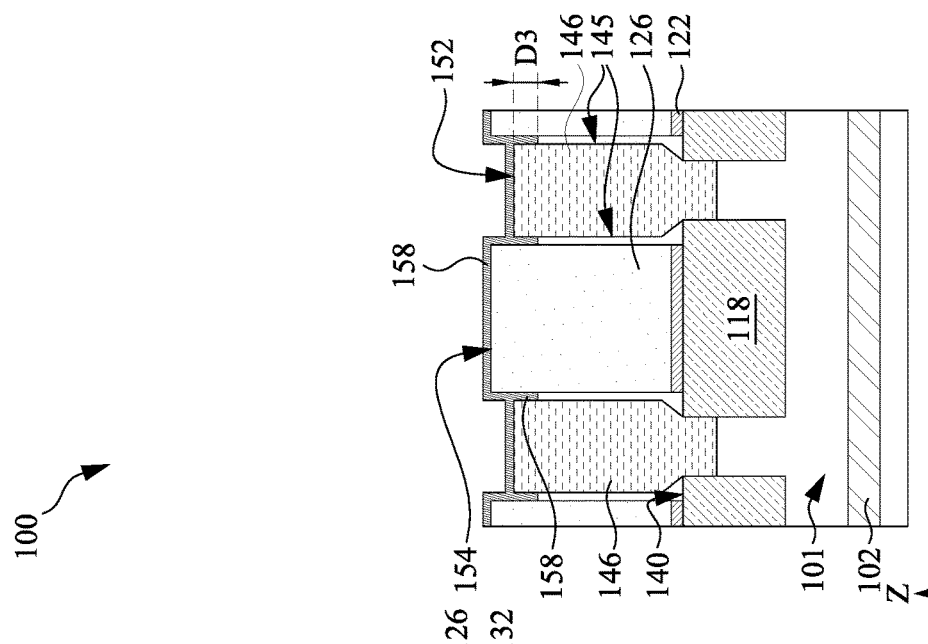
FIGS. 16A, 16B, and 16C are cross-sectional side views of various stages of manufacturing the semiconductor device structure taken along line A-A, line B-B, and line C-C of FIG. 11 in accordance with some embodiments.
Figure 16B:
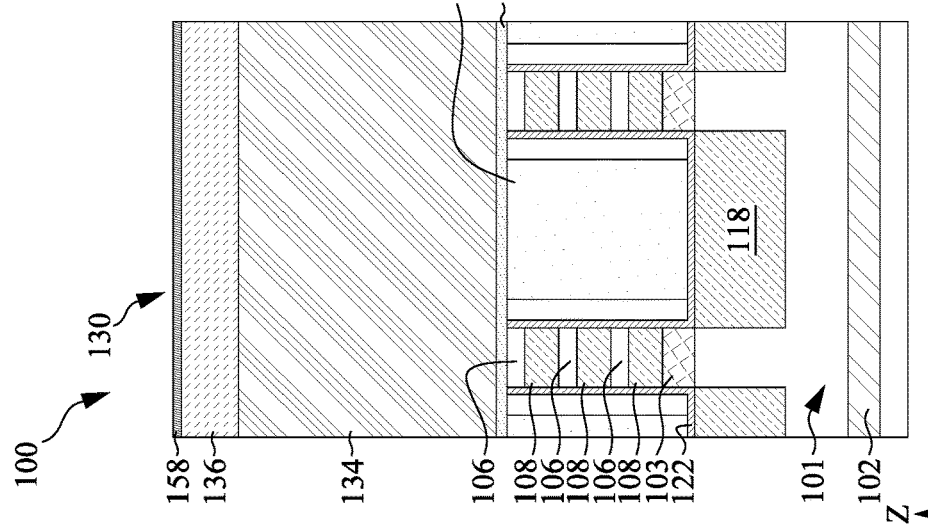
Figure 16A:
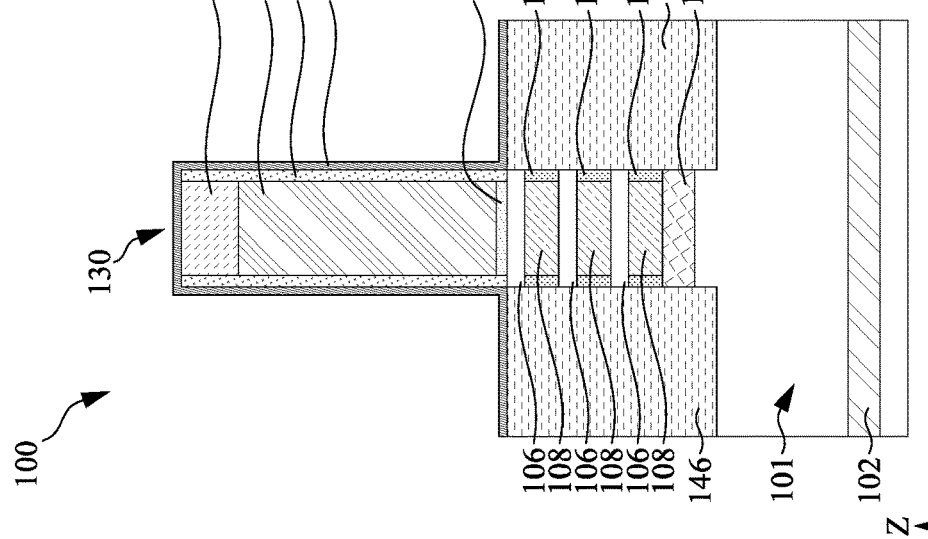

In FIGS. 16A-16C, a sealing material 158 is formed on the exposed surfaces of the semiconductor device structure 100. The sealing material 158 forms on the exposed surfaces of the insulating layer 126 and the epitaxial S/D features 146 and seals the top of the gap 145. The sealing material 158 prevents any materials, such as an ILD layer 164 (FIG. 19C), from filling the air gaps 156 (FIG. 18C) during subsequent device processing operations. Due to the height difference (i.e., distance "D1" in FIG. 15C) between the top surface 152 of the epitaxial S/D features 146 and the top surface 154 of the insulating layer 126 and the narrow gap (i.e., distance "D2" in FIG. 15C) between the sidewall of the epitaxial S/D features and the sidewall of the insulating layer 126, the sealing material 158 will have a minimum filling depth "D3" into the air gaps 156. The minimum filling depth "D3" is measured from the top surface 152 of the epitaxial S/D features 146 and may be in a range from about 0.5 nm to about 10 nm. If the distance "D3" is greater than about 10 nm, the size of the air gap is reduced and may not provide sufficient isolation between neighboring electrically-conductive features.

The sealing material 158 may be formed from an oxide-containing material (e.g., silicon oxide), a nitrogen-containing material (e.g., silicon nitride), or any suitable dielectric material, and can be deposited by a CVD process, a sub-atmospheric CVD (SACVD) process, a FCVD process, an ALD process, or any suitable deposition technique. The sealing material 158 may have a conformal layer profile as shown in FIG. 16C.

Figure 17A:
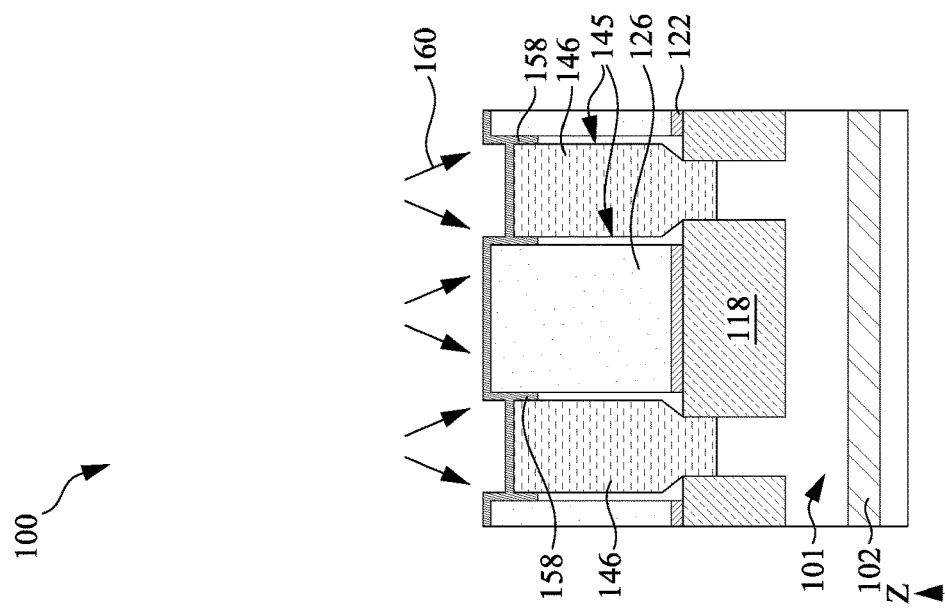
FIGS. 17A, 17B, and 17C are cross-sectional side views of various stages of manufacturing the semiconductor device structure taken along line A-A, line B-B, and line C-C of FIG. 11 in accordance with some embodiments.
Figure 17B:
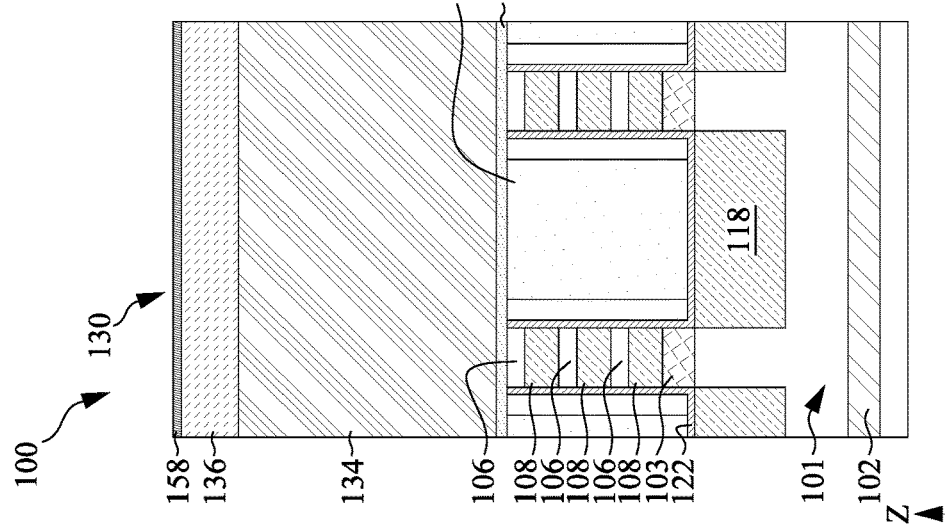
Figure 17C:
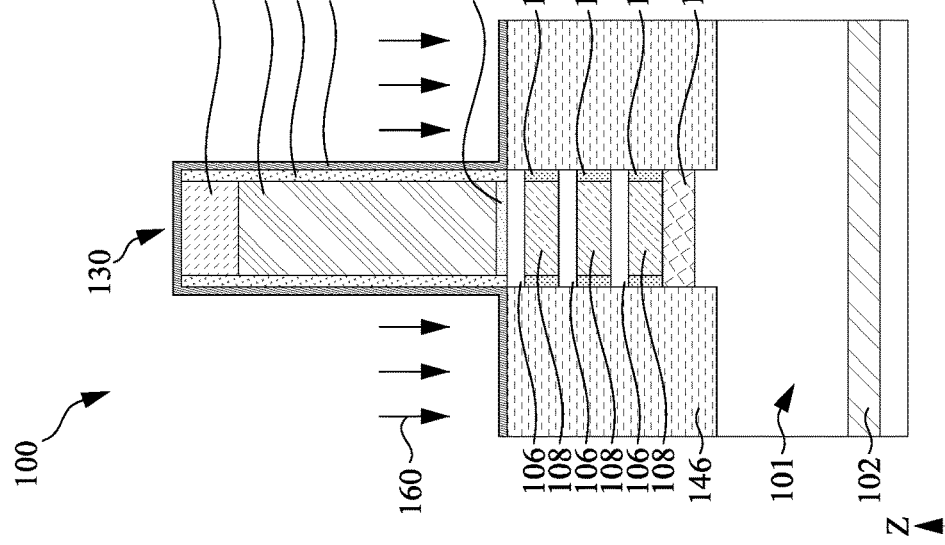

In FIGS. 17A-17C, an optional implantation process is performed on the semiconductor device structure 100. The implantation process densifies the sealing material 158 so that the sealing material 158 can sustain damages (e.g., etchant) during subsequent device processing operations. The implantation process may be a vertical implantation process (i.e., ion streams are substantially perpendicular to the surface of the layer to be implanted) or a tilted (angled) implantation process. In some embodiments, the implantation process is a tilted implantation process which directs ion streams 160 at an angle with respect to the top surface of the sealing material 158. Using the mask (not shown) and a selected angle of the tilted implantation process, the ion streams 160 can be directed to a predefined region, such as regions where the sealing material 158 is located.

In some embodiments, which can be combined with any of the embodiments in this disclosure, the implantation process may use a large size of dopants to enhance microstructure and sealing capability of the sealing material 158. Exemplary dopants may include, but are not limited to, germanium (Ge), arsenic (As), selenium (Se), bromine (Br), krypton (Kr), silicon (Si), phosphorus (P), sulfur (S), chlorine (Cl), argon (Ar), or gallium (Ga), etc.

In FIGS. 18A-18C, portions of the sealing material 158 are removed to expose the insulating layers 126 and the epitaxial S/D features 146. The sealing material 158 may be removed by any suitable removal process. In one embodiment, the removal process is an anisotropic selective dry etch process. The anisotropic selective dry etch process removes portions of the sealing material 158 from horizontal surfaces of the semiconductor device structure 100, such as the top surface 154 of the insulating layers 126 and the top surface 152 of the epitaxial S/D features 146, while leaving the sealing material 158 on the vertical surfaces, such as the sealing material 158 in contact with the sidewalls of the insulating layers 126. The anisotropic etching may be RIE or any suitable dry etching process. After the removal process, the sealing material 158 remains at the top of the gap 145 and forms an air gap 156 below the sealing material 158. The air gaps 156 is defined by the sealing material 158, the sidewall of epitaxial S/D features 146, the sidewall of the insulating layer 126, and the insulating material 118. In some embodiments, the sealing material 158, the sidewall of epitaxial S/D features 146, and the sidewall of the insulating layer 126 are directly exposed to the air gaps 156. In some embodiments, the sealing material 158, the sidewall of epitaxial S/D features 146, the sidewall of the insulating layer 126, and the insulating material 118 are directly exposed to the air gaps 156.

A portion of the air gaps 156 can have a varying dimension in accordance with the profile of the epitaxial S/D features 146. In some embodiments, the upper portion of the air gap 156 has a first dimension "D11" (corresponds to the distance "D2" in FIG. 15C) and the bottom portion of the air gap 156 has a varying dimension gradually increasing from the first dimension "D11" to a second dimension "D12". FIG. 18D illustrates an enlarged view of FIG. 18C showing the bottom portion of the air gap 156 having a varying dimension.

In FIGS. 19A-19C, a contact etch stop layer (CESL) 162 is conformally formed on the exposed surfaces of the semiconductor device structure 100. The CESL 162 covers the sidewalls of the sacrificial gate structure 130, the insulating layer 126, the epitaxial S/D features 146, and the sealing material 158. The CESL 162 may include an oxygen-containing material or a nitrogen-containing material, such as silicon nitride, silicon carbon nitride, silicon oxynitride, carbon nitride, silicon oxide, silicon carbon oxide, or the like, or a combination thereof, and may be formed by CVD, PECVD, ALD, or any suitable deposition technique. Next, an interlayer dielectric (ILD) layer 164 is formed over the semiconductor device structure 100. The materials for the ILD layer 164 may include compounds comprising Si, O, C, and/or H, such as silicon oxide, TEOS oxide, SiCOH and SiOC. Organic materials, such as polymers, may also be used for the ILD layer 164. The ILD layer 164 may be deposited by a PECVD process or other suitable deposition technique. In some embodiments, after formation of the ILD layer 164, the semiconductor device structure 100 may be subject to a thermal process to anneal the ILD layer 164.

In FIGS. 20A-20C, after the ILD layer 164 is formed, a planarization operation, such as CMP, is performed to expose the sacrificial gate electrode layer 134 for subsequent removal of the sacrificial gate structures 130.

In FIGS. 21A-21C, the sacrificial gate structure 130 (i.e., the sacrificial gate electrode layer 134 and the sacrificial gate dielectric layer 132 as shown in FIG. 20A) is removed. The ILD layer 164 protects the epitaxial S/D features 146 during the removal of the sacrificial gate structure 130. The sacrificial gate structure 130 can be removed using plasma dry etching and/or wet etching. For example, in cases where the sacrificial gate electrode layer 134 is polysilicon and the ILD layer 164 is silicon oxide, a wet etchant such as a tetramethylammonium hydroxide (TMAH) solution can be used to selectively remove the sacrificial gate electrode layer 134 without removing the dielectric materials of the ILD layer 164, the CESL 162, and the gate spacers 138. The sacrificial gate dielectric layer 132 is thereafter removed using plasma dry etching and/or wet etching. The removal of the sacrificial gate structure 130 (i.e., the sacrificial gate electrode layer 134 and the sacrificial gate dielectric layer 132) forms a trench 166 between the neighboring spacers 138, as shown in FIG. 21A. The trench 166 exposes the top of the stack of semiconductor layers 104 (e.g., the first semiconductor layers 106), the first liner layer 122, and the air gaps 156 extending under the sacrificial gate structure 130, as shown in FIG. 21B.

In FIGS. 22A-22C, the exposed portions of the first liner layer 122 (i.e., first liner layer 122 in contact with the sidewalls of the stack of semiconductor layers 104 and the buffer layer 103) and the remaining portion of each second semiconductor layer 108 are removed, as shown in FIG. 22B. The removal of the first liner layer 122 and the second semiconductor layers 108 results in gaps 168 formed between the dielectric spacers 144. The removal process may be any suitable selective removal process, such as selective wet etching process. In cases where the second semiconductor layers 108 and the first liner layer 122 are made of SiGe or Ge and the first semiconductor layers 106 are made of Si, the chemistry used in the selective wet etching process removes the SiGe while not substantially affecting Si and the dielectric materials of the gate spacers 138, the dielectric spacers 144, and the buffer layer 103. In one embodiment, the second semiconductor layers 108 and the first liner layer 122 can be removed using a wet etchant such as, but not limited to, ammonium hydroxide ($NH_4OH$), tetramethylammonium hydroxide (TMAH), ethylenediamine pyrocatechol (EDP), or potassium hydroxide (KOH) solution.

The resulting structure includes a plurality of first semiconductor layers 106 separated by pairs of the dielectric spacers 144 having gaps 168 formed between each pair of the dielectric spacers 144, as shown in FIG. 22A. Each first semiconductor layer 106 may have a surface along the longitudinal direction of the semiconductor layer 106, and the majority of that surface is exposed as the result of the removal of the first liner layer 122 and the second semiconductor layers 108. The exposed surface will be surrounded by a gate electrode layer formed subsequently. Each first semiconductor layer 106 forms a nanosheet channel of the nanosheet transistor.

Figure 23C:
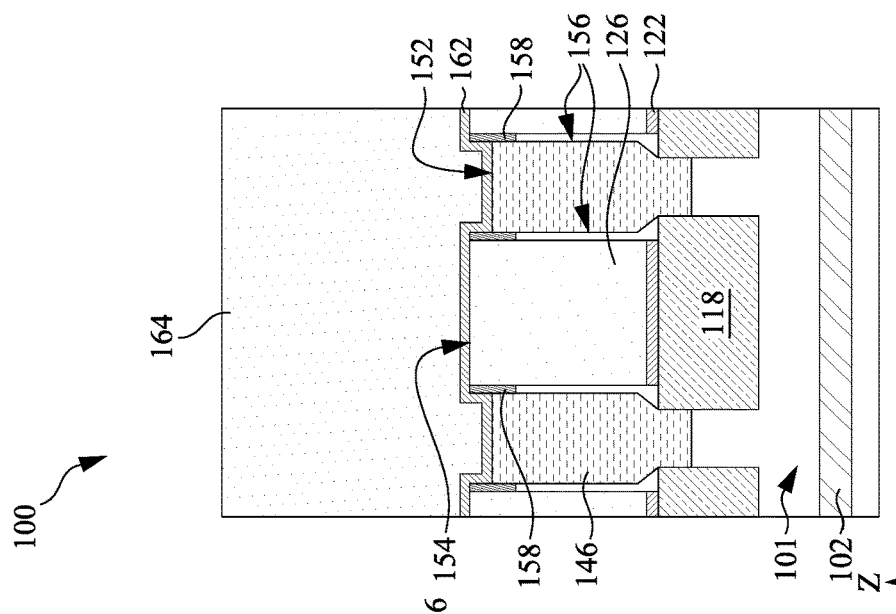
FIGS. 23A, 23B, and 23C are cross-sectional side views of various stages of manufacturing the semiconductor device structure taken along line A-A, line B-B, and line C-C of FIG. 11 in accordance with some embodiments.
Figure 23B:
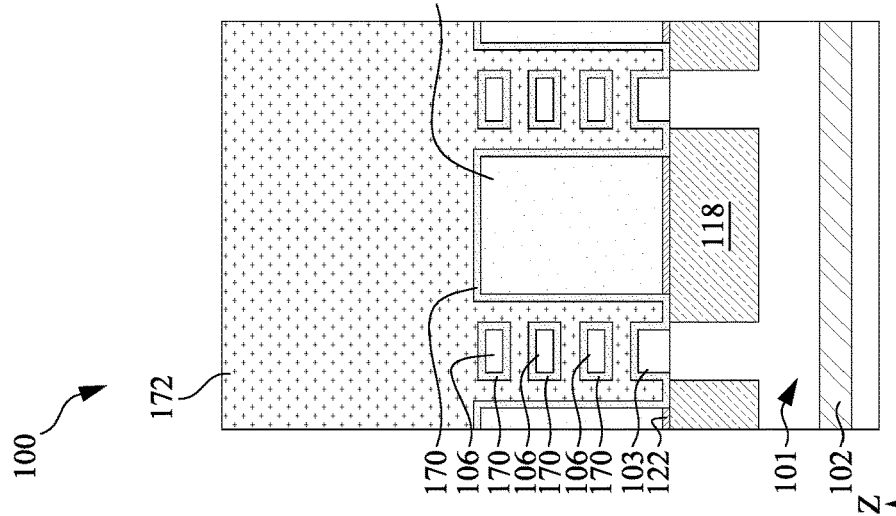
Figure 23A:
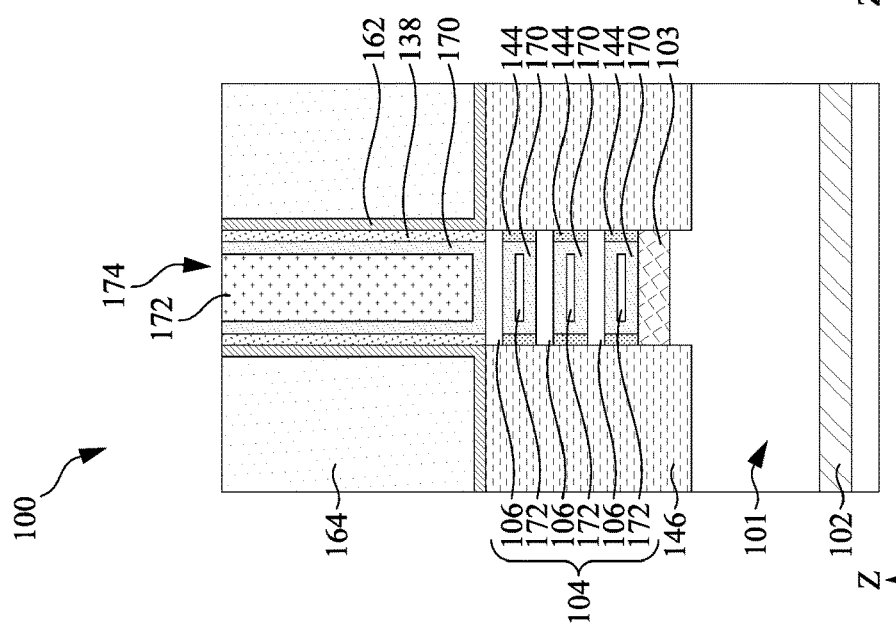

In FIGS. 23A-23C, after the formation of the nanosheet channels (i.e., the exposed first semiconductor layers 106), a gate dielectric layer 170 is formed around each first semiconductor layer 106, and a gate electrode layer 172 is formed on the gate dielectric layer 170, surrounding a portion of each first semiconductor layer 106, as shown in FIGS. 23A and 23B. The gate dielectric layer 170 and the gate electrode layer 172 may be collectively referred to as a gate stack 174. In some embodiments, the gate dielectric layer 170 includes one or more layers of a dielectric material, such as silicon oxide, silicon nitride, or high-K dielectric material, other suitable dielectric material, and/or combinations thereof. Examples of high-K dielectric material include HfO2, HfSiO, HfSiON, HfTaO, HfTiO, HfZrO, zirconium oxide, aluminum oxide, titanium oxide, hafnium dioxide-alumina (HfO2-Al2O3) alloy, other suitable high-K dielectric materials, and/or combinations thereof. In some embodiments, the gate dielectric layer 170 includes an interfacial layer (not shown) formed between the first semiconductor layers 106 and the buffer layer 103.

The gate dielectric layer 170 may be formed by CVD, ALD or any suitable deposition technique. In one embodiment, the gate dielectric layer 170 is formed using a conformal deposition process such as ALD in order to ensure the formation of a gate dielectric layer having a uniform thickness around each first semiconductor layer 106.

The gate electrode layer 172 is formed on the gate dielectric layer 170 to surround a portion of each first semiconductor layer 106. The gate electrode layer 172 may include one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or any combinations thereof. The gate electrode layer 172 may be formed by CVD, ALD, electro-plating, or other suitable deposition technique. The gate electrode layer 172 may be also deposited over the upper surface of the ILD layer 164. The gate dielectric layer 170 and the gate electrode layer 172 formed over the ILD layer 164 are then removed by using, for example, CMP, until the top surface of the ILD layer 164 is exposed, as shown in FIG. 23A.

Figure 24A:
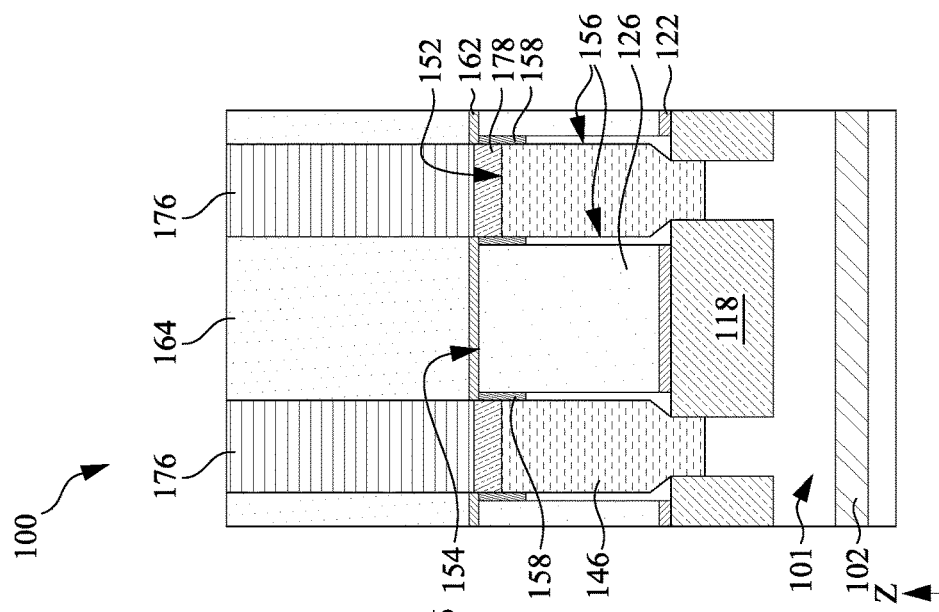
FIGS. 24A, 24B, and 24C are cross-sectional side views of various stages of manufacturing the semiconductor device structure taken along line A-A, line B-B, and line C-C of FIG. 11 in accordance with some embodiments.
Figure 24B:
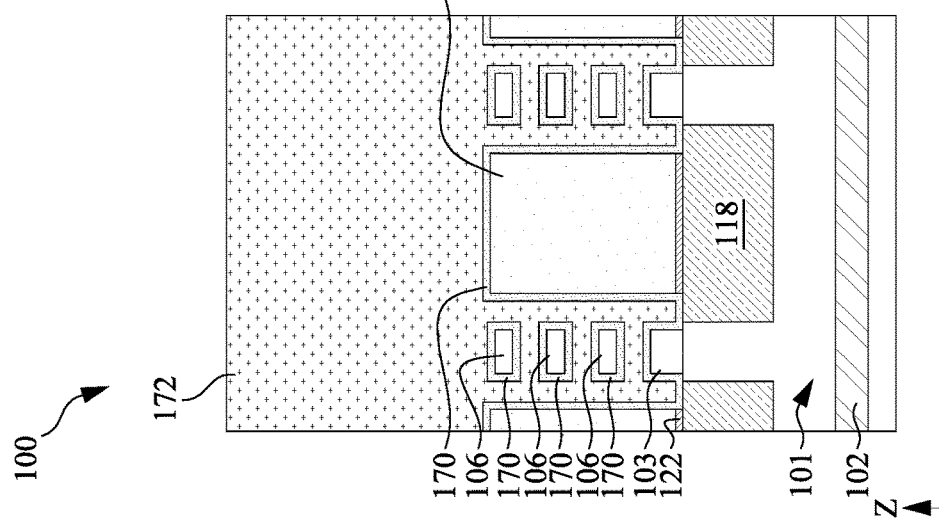
Figure 24C:
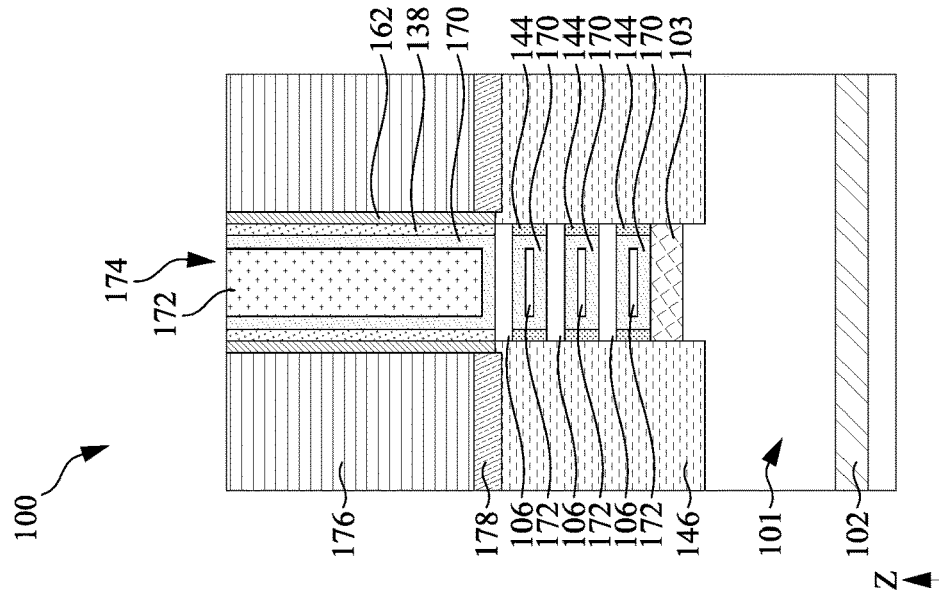

In FIGS. 24A-24C, S/D contacts 176 are formed in the ILD layer 164. Prior to forming the S/D contacts 176, contact openings are formed in the ILD layer 164 to expose the epitaxial S/D features 146. Suitable photolithographic and etching techniques are used to form the contact openings through various layers, including the ILD layer 164 and the CESL 162 to expose the epitaxial S/D features 146. In some embodiments, the upper portions of the epitaxial S/D features 146 are etched.

After the formation of the contact openings, a silicide layer 178 is formed on the epitaxial S/D features 146. The silicide layer 178 conductively couples the epitaxial S/D features 146 to the subsequently formed S/D contacts 176. The silicide layer 178 may be formed by depositing a metal source layer over the epitaxial S/D features 146 and performing a rapid thermal annealing process. During the rapid anneal process, the portion of the metal source layer over the epitaxial S/D features 146 reacts with silicon in the epitaxial S/D features 146 to form the silicide layer 178. Unreacted portion of the metal source layer is then removed. The silicide layer 178 may be made of a material including one or more of WSi, CoSi, NiSi, TiSi, MoSi and TaSi. In some embodiments, the silicide layer 178 is made of a metal or metal alloy silicide, and the metal includes a noble metal, a refractory metal, a rare earth metal, alloys thereof, or combinations thereof. Next, a conductive material is formed in the contact openings and form the S/D contacts 176. The conductive material may be made of a material including one or more of Ru, Mo, Co, Ni. W, Ti, Ta, Cu, Al, TiN and TaN. While not shown, a barrier layer (e.g., TiN, TaN, or the like) may be formed on sidewalls of the contact openings prior to forming the S/D contacts 176. Then, a planarization process, such as CMP, is performed to remove excess deposition of the contact material and expose the top surface of the gate electrode layer 172.

Figure 25:
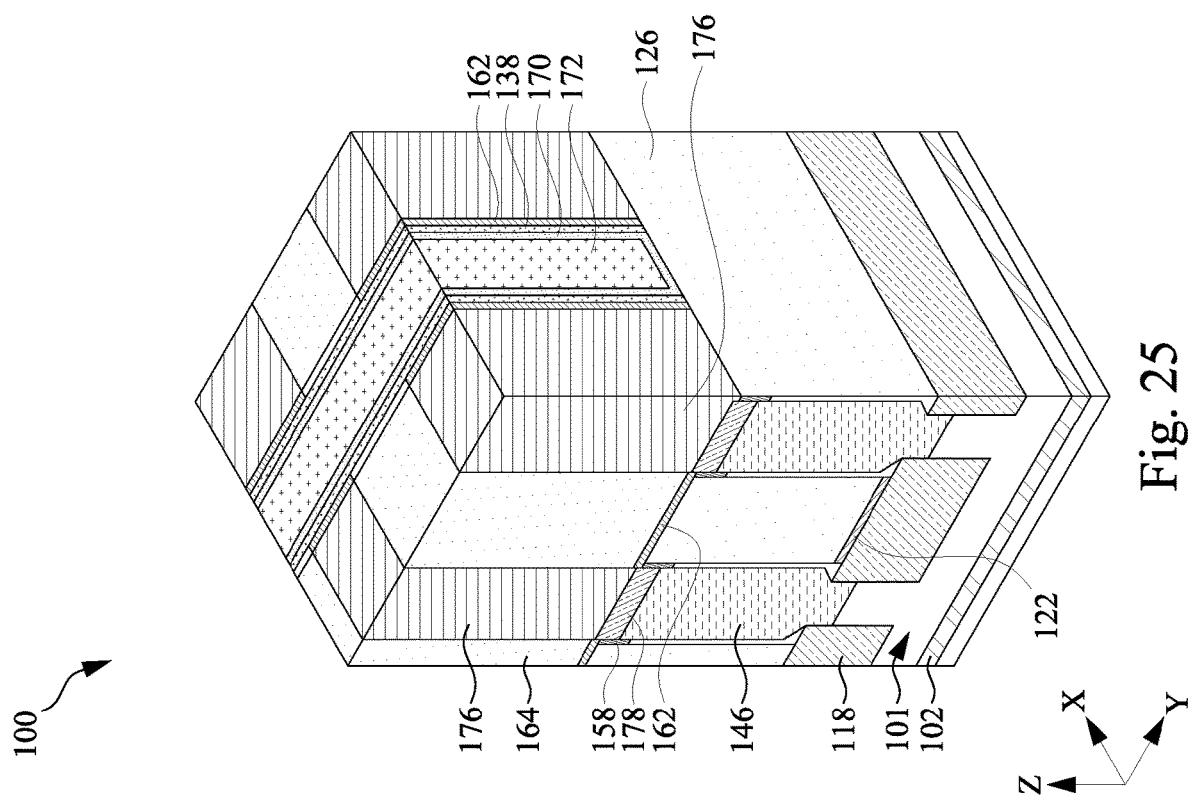
FIG. 25 is a perspective view of the semiconductor device structure shown in FIG. 24A-24C.

FIG. 25 is a perspective view of the semiconductor device structure 100 showing one of the manufacturing stages after the S/D contacts 176 are formed.

Figure 26:
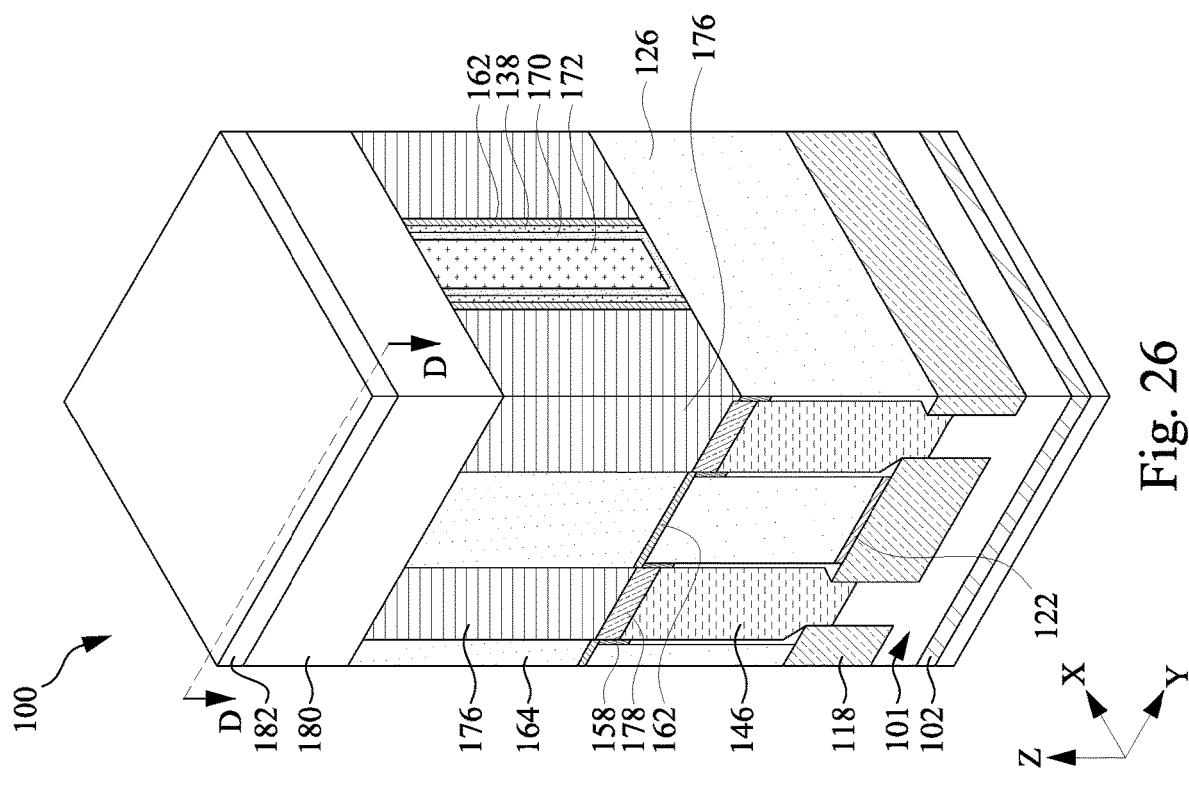
FIG. 26 is a perspective view of the semiconductor device structure of FIG. 25 showing an interconnecting structure formed on the substrate.

In FIG. 26, an interconnecting structure 180 is formed on the substrate 101. The interconnecting structure 180 can be a back-end-of-line (BEOL) interconnect structure including one or more layers of dielectric material having a plurality of metal lines (not shown) and vias (not shown) embedded therein. The metal lines and vias provide electrical paths to the features, such as the gate electrode layer 172 and epitaxial S/D features 146. The substrate 101 with the interconnecting structure 180 may be bonded to a carrier substrate 182. The carrier substrate 182 serves to provide mechanical support for the semiconductor device structure 100 so as to facilitate backside processing of the substrate 101.

Semiconductor devices may include multiple metal tracks, including power rails, such a positive voltage (VDD) or a negative voltage (VSS); and multiple signal lines. In conventional semiconductor devices, the power rails and signal lines are located over the substrate 101, such as in the interconnecting structure 180. As semiconductor device size shrinks, however, space for metal tracks, such as power rails and signal lines, decreases. Thus, one or more power rails may be formed on the back side of the substrate 101. In some embodiments, either the source or the drain of the epitaxial S/D features 146 is connected to a power rail disposed therebelow. For example, a source epitaxial feature 146 is connected to a power rail disposed therebelow, and a drain epitaxial feature 146 is connected to a power rail disposed thereabove. FIGS. 27-31 illustrate cross-sectional views of various stages of manufacturing the semiconductor device structure 100 having a back-side power rail in accordance with some embodiments, and the cross-sectional views are taken along line D-D of FIG. 26. It is contemplated that various embodiments of this disclosure are equally applicable to semiconductor devices having power rails formed on the front side of the substrate 101.

In FIG. 27, the semiconductor device structure 100 is flipped over so the substrate 101 as shown is over the epitaxial S/D features 146. In some embodiments, the semiconductor device structure 100 is flipped over after the carrier substrate 182 (FIG. 26) is bonded to the semiconductor device structure 100.

In FIG. 28, a planarization process, such as a CMP, is performed on the backside of the substrate 101 to remove the insulating layer 102 until portions of the substrate 101 is exposed.

In FIG. 29, a hard mask layer 184 is formed on the portion of the substrate 101 over the epitaxial S/D feature 146 (e.g., a source epitaxial feature). The hard mask layer 184 may be formed by a photolithography process and one or more etch processes. In some embodiments, the hard mask layer 184 covers portions of the substrate 101 disposed over multiple source epitaxial features. Next, the portion of the substrate 101 not covered by the hard mask layer 184 is removed. The removal process may be any suitable process, such as a wet etching or a dry etching process. In some embodiments, the removal process may be an isotropic wet etching process that utilizes TMAH, which selectively removes the semiconductor material of the substrate 101. The insulating material 118 is not removed by the removal process. The removal process continues until a portion of the epitaxial S/D feature 146 disposed below the removed portion of the substrate 101 is exposed. The removal of the portion of the substrate 101 forms an opening 186 exposing the epitaxial S/D feature 146 and a portion of the insulating material 118. In some embodiments, the exposed epitaxial S/D feature 146 is a drain epitaxial feature. While not shown, in some embodiments, multiple epitaxial S/D features 146 may be exposed through multiple openings 186. For example, multiple drain epitaxial features can be exposed through multiple openings formed in the substrate 101.

Next, a liner 188 is formed on the exposed epitaxial S/D feature 146, the exposed portion of the insulating material 118, and the exposed surface of the remaining portion of the substrate 101. The liner 188 may be made of a dielectric material, such as SiN, SiCN, SiOC, SiOCN, or the like. The liner 188 may be formed by a conformal process, such as an ALD process. A dielectric material 190 is then formed on the liner 188 and fills the opening 186, as shown in FIG. 29. The dielectric material 190 may be any suitable dielectric material, such as an oxide, for example silicon oxide. In some embodiments, the dielectric material 190 is made of the same material as the insulating material 118. The dielectric material 190 may be formed by any suitable method, such as CVD, PECVD, or FCVD.

In FIG. 30, a hard mask layer 192 is formed on the dielectric material 190 and the remaining portion of the substrate 101 that was covered by the hard mask layer 184 (FIG. 29) is removed. The removal process may be any suitable process, such as isotropic etching. In some embodiments, the removal process may be an isotropic dry etching process that utilizes hydrogen fluoride gas, which selectively removes the semiconductor material of the substrate 101. The exposed insulating material 118 is not removed by the removal process. The removal of the remaining portion of the substrate 101 exposes the epitaxial S/D feature 146 (e.g., a source epitaxial feature) that is not protected by the hard mask layer 192. The removal of the remaining portion of the substrate 101 forms an opening 194.

Figure 31:
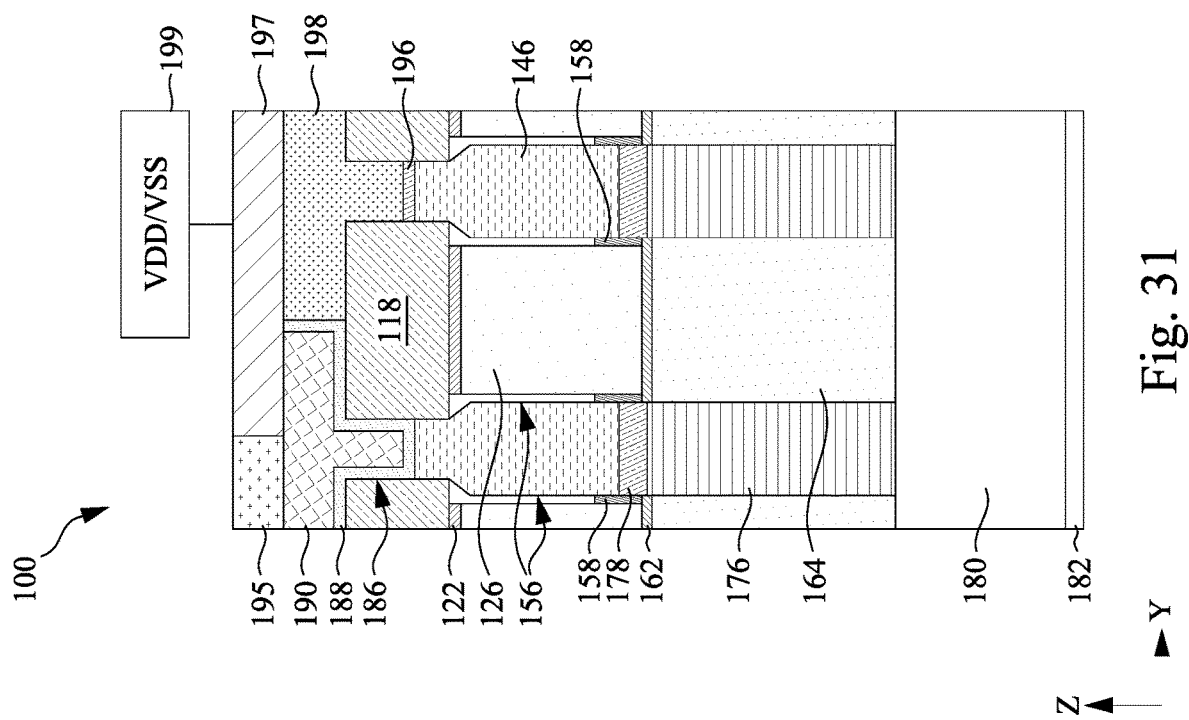

In FIG. 31, a silicide layer 196 is selectively formed on the exposed surface of the epitaxial S/D feature 146 (e.g., a source epitaxial feature). The silicide layer 196 may be made of a material including one or more of WSi, CoSi, NiSi, TiSi, MoSi and TaSi. In some embodiments, the silicide layer 196 is made of a metal or metal alloy silicide, and the metal includes a noble metal, a refractory metal, a rare earth metal, alloys thereof, or combinations thereof. Next, a conductive feature 198 is formed on the silicide layer 196 in the opening 194. The conductive feature 198 may be made of a metal or metal nitride, such as W, Ru, Co, Cu, Ti, TiN, Ta, TaN, Mo, or Ni. The conductive feature 198 may be formed by any suitable process, such as PVD or electro-plating.

After the conductive feature 198 is formed, an ILD layer 195 is formed over the backside of the semiconductor device structure 100. One or more conductive features 197 (only one is shown) are formed in the ILD layer 195. The conductive feature 197 is in electrical communication with the S/D contacts 176 through the conductive feature 198, the silicide layer 196, the epitaxial S/D feature 146 (e.g., a source epitaxial feature) and the silicide layer 178. The conductive feature 197 is in connection with a power rail 199 to be connected to a power supply. In some embodiments, the conductive feature 197 is a portion of a power rail 199. Depending on the conductivity type of the device, the power supply may be fed with a positive voltage (VDD) or a negative voltage (VSS) (i.e., ground or zero voltage). Having the conductive feature 197 connected to the power rail 199 at the backside of the semiconductor device structure 100 allows for the device to be powered directly by a backside power, thereby enhancing the device performance, saving an amount of routing resources used on the front side of device, and reducing BEOL process complexity without abnormal electrical mis-connection issues. Furthermore, the air gap 156 extends along the exposed surface of the epitaxial S/D features 146 along the Z direction, providing improved isolation between neighboring epitaxial S/D features 146. Therefore, the parasitic fringing capacitances or capacitive coupling between neighboring epitaxial S/D features 146 can be reduced.

FIGS. 32A-36A are perspective views of one of the various stages of a semiconductor device structure 200 in accordance with embodiments of the present disclosure. FIGS. 32B-36B are cross-sectional side views of the semiconductor device structure 200 of FIGS. 32A-36A taken along line F-F of FIG. 32A. FIGS. 32A and 32B illustrate the semiconductor device structure 200 having fins 212 protruded through an insulating layer 218 (i.e., isolation region 220) along the Z direction from a substrate 201. The insulating layer 218 is disposed on either side of the fins 212 and above the substrate 201. A trench 213 is defined between two neighboring fins 212. The substrate 201 may be constructed in the same or similar fashion as the substrate 101. Each fin 212 includes a buffer layer 203, alternating semiconductor layers made of a first semiconductor layer 206 and a second semiconductor layer 208, and a hard mask layer 210. The buffer layer 203, the first semiconductor layer 206, the second semiconductor layer 208, and the hard mask layer 210 may be made of the same material as the buffer layer 103, the first semiconductor layer 106, the second semiconductor layer 108, and the hard mask layer 110, respectively. FIG. 32A also shows a first liner layer 222 conformally formed on the insulating layer 218 and exposed surfaces of the fins 212, that is, the sidewalls of the buffer layer 203, the first semiconductor layer 206, the second semiconductor layer 208, and the hard mask layer 210. A second liner 224 is then conformally formed on the first liner layer 222. The first liner layer 222 and the second liner layer 224 may be formed of the same material as the first liner layer 122 and the second liner layer 124, respectively.

In some embodiments, the first liner layer 222 has a first thickness "T1" and the second liner 224 has a second thickness "T2". In some embodiments, the second thickness "T2" of the second liner layer 224 is greater than the first thickness of "T1" of the first liner layer 222. Similar to the first liner layer 122, the first liner layer 222 can have a thickness of about 1 nm to about 10 nm. The first thickness T1 and the second thickness "T2" have a ratio in a range of about 1:1 to about 1:4 (T1:T2), for example about 1:2 to about 1:3. As will be discussed in more detail below, the trench 213 provides room for a subsequent formed insulating layer 226 (FIG. 36A). The insulating layer 226 can vary the width of an air gap to be formed between neighboring electrically-conductive features (e.g., epitaxial S/D features). Therefore, if the ratio of the first thickness "T1" to the second thickness "T2" is greater than about 1:4, the combined thickness of the first liner layer 222 and the second liner layer 224 within the trench 213 may be too thick and substantially fill the trench 213, resulting in little or no air gaps between neighboring electrically-conductive features. On the other hand, if the ratio of the first thickness "T1" to the second thickness "T2" is less than about 1:1, the combined thickness of the first liner layer 222 and the second liner layer 224 within the trench 213 may be small, leaving a large space inside the trench 213. In such a case, any material, such as a subsequently formed ILD layer (e.g., ILD layer 264 in FIG. 43C), may substantially fill the trench 213, resulting in little or no air gaps between neighboring electrically-conductive features.

Figure 33B:
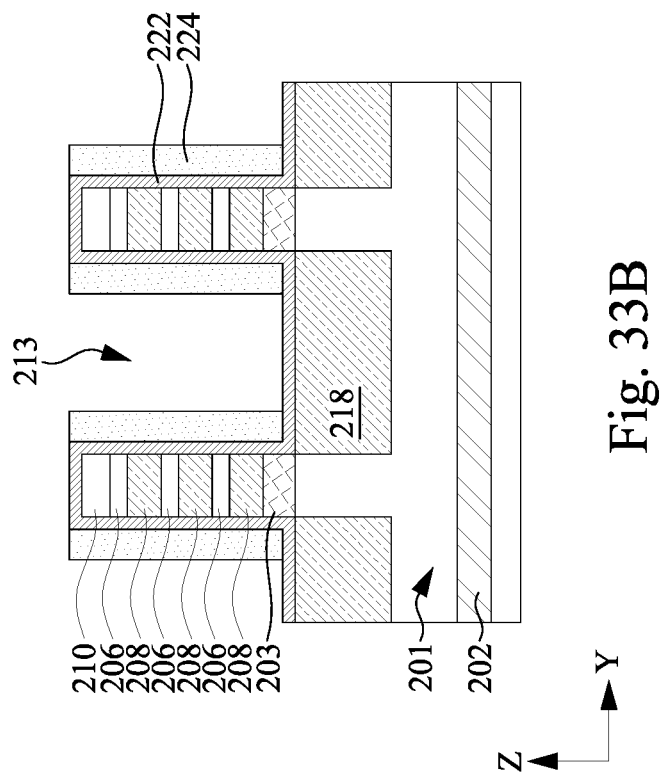
FIGS. 33A-33B are cross-sectional and cross-sectional side views of the semiconductor device structure of FIG. 32A taken along line F-F of FIG. 32A.
Figure 33A:
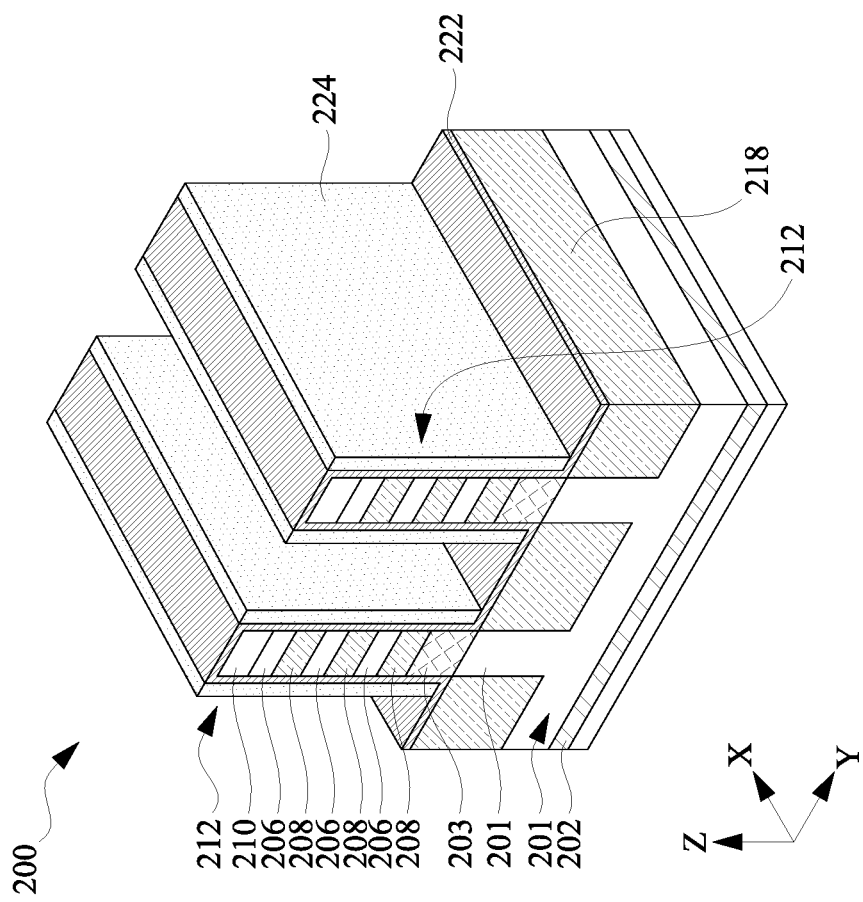

In FIGS. 33A and 33B, portions of the second liner layer 224 are removed to expose the first liner layer 222 underneath. The second liner layer 224 may be removed by any suitable removal process, such as an anisotropic selective dry etch process discussed above with respect to FIG. 7A. The anisotropic selective dry etch process removes portions of the second liner layer 224 from horizontal surfaces of the semiconductor device structure 200, such as the top of the fins 212 and the insulating layer 218, while leaving the second liner layer 224 on the vertical surfaces, such as the second liner layer 224 in contact with the sidewalls of the fins 212.

Figure 34B:
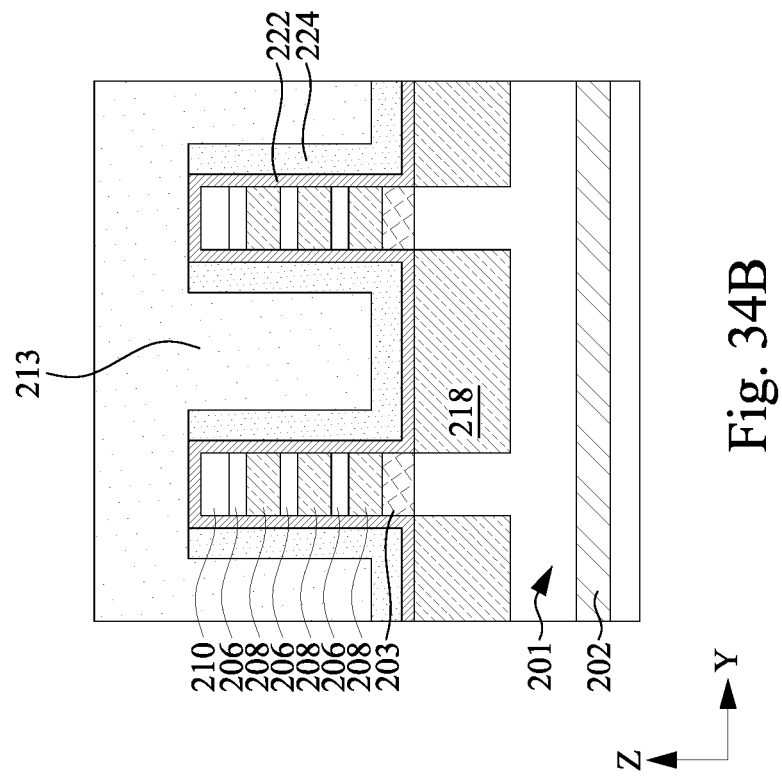
FIGS. 34A-34B are perspective view and cross-sectional side views of one of the various stages of the semiconductor device structure in accordance with some embodiments.
Figure 34A:
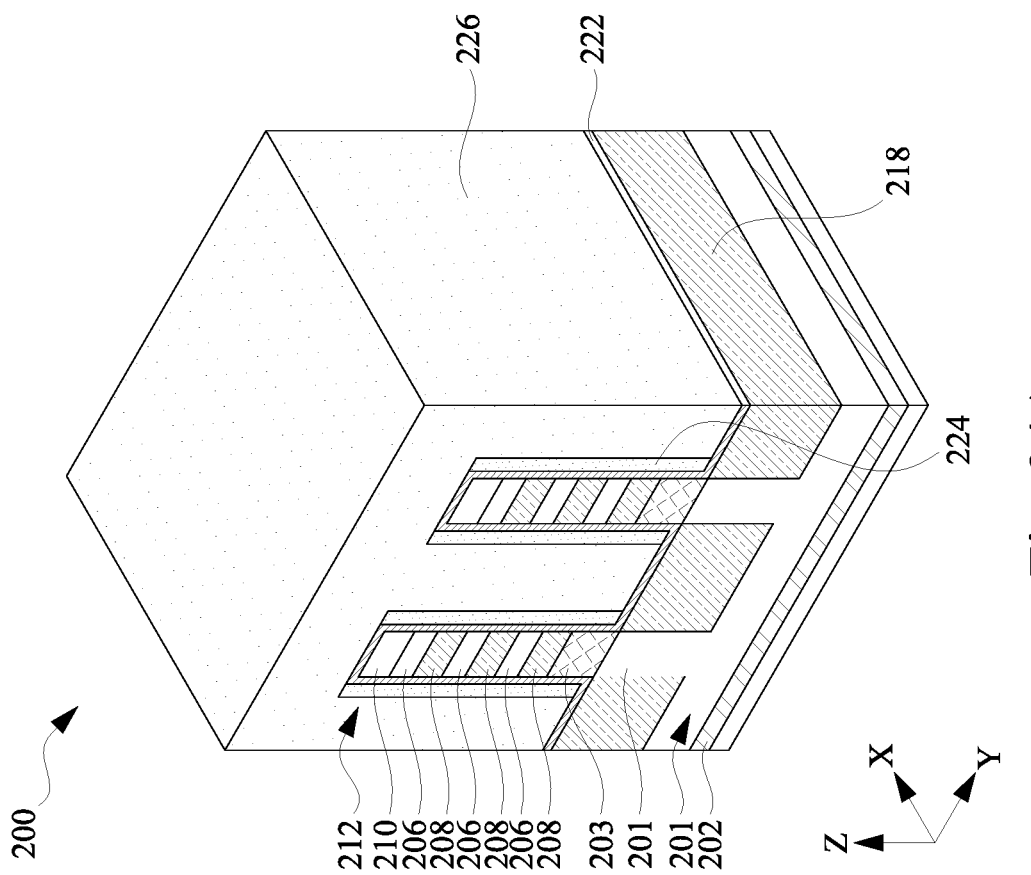

In FIG. 34A, an insulating layer 226 is formed over the semiconductor device structure 200. The insulating layer 226 fill the trench 213 (FIG. 33A) completely and extend over the top of the fins 212. The insulating layer 226 may be formed from the same material as the insulating layer 126 and deposited by any suitable deposition technique, such as a FCVD process as discussed above with respect to the insulating layer 126.

Figure 35B:
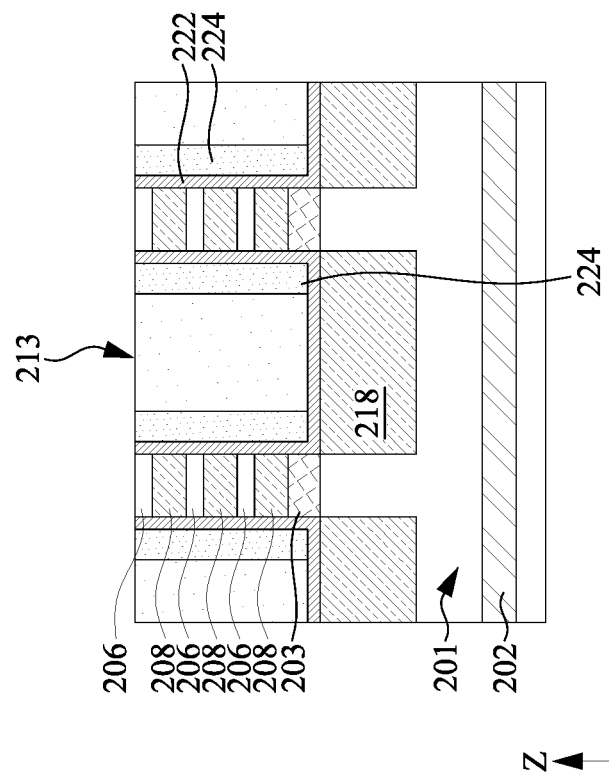
FIGS. 35A-35B are perspective view and cross-sectional side views of one of the various stages of the semiconductor device structure in accordance with some embodiments.
Figure 35A:
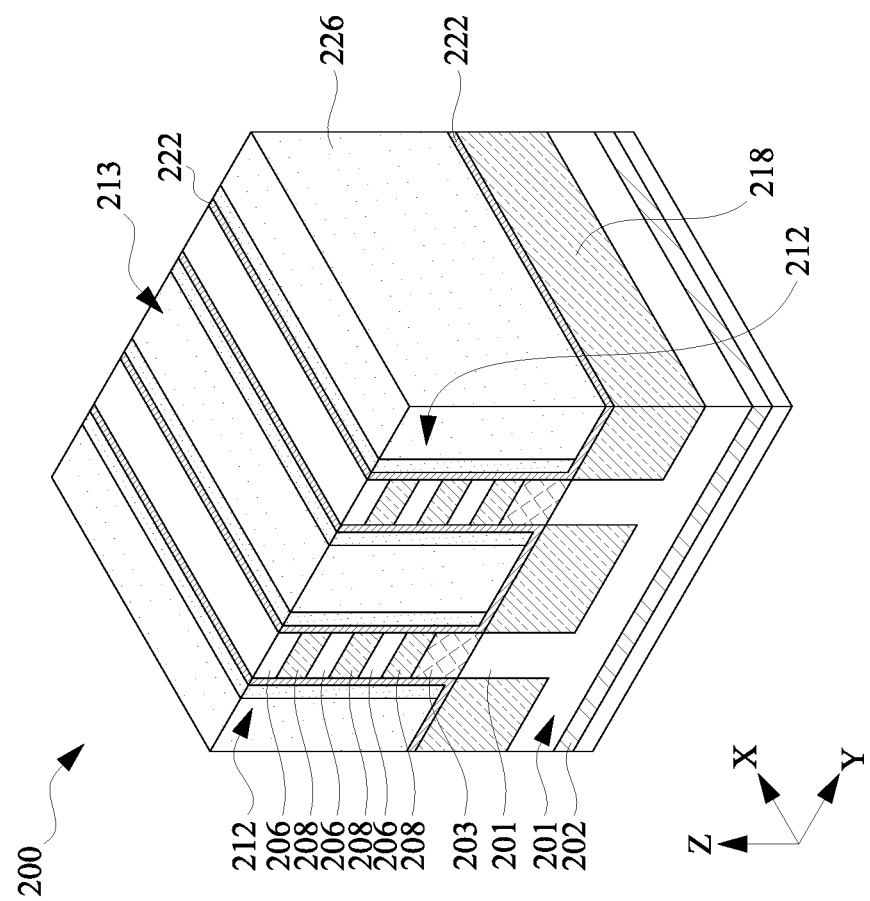

In FIG. 35A, after the insulating layer 226 is formed, a planarization operation, such as CMP, is performed on the semiconductor device structure 200 to remove portions of the insulating layer 226. The planarization operation is performed until the top of the stack of the semiconductor layers 206, 208, the first liner layer 222, and the second liner layer 224 are exposed. At this stage, the top surfaces of the fins 212, the first liner layers 222, the second liner layers 224, and the insulating layers 218 are substantially coplanar.

In FIG. 36A, the insulating layer 226 is selectively removed by a removal process. The removal process may be an etch process, such as a wet etch, a dry etch, and/or a combination thereof. Since the first liner layer 222, the second liner layer 224 and the insulating layer 226 have different etch selectivity to an etchant, the etch process can selectively etch the insulating layer 226 without substantially etching the first liner layer 222 and the second liner layer 224. The removal of the insulating layer 226 reveals the trench 213 between the second liner layers 224 in contact with the sidewalls of the fins 212. The trench 213 and a subsequently formed third liner layer 251 (FIG. 42C) vary the size of the air gap to be formed between the subsequently formed epitaxial S/D features 246 (FIG. 42C). Depending on the application, the size of the air gap can be adjusted by controlling the thickness of the second liner layer 224 and/or the third liner layer 251.

Figure 37:
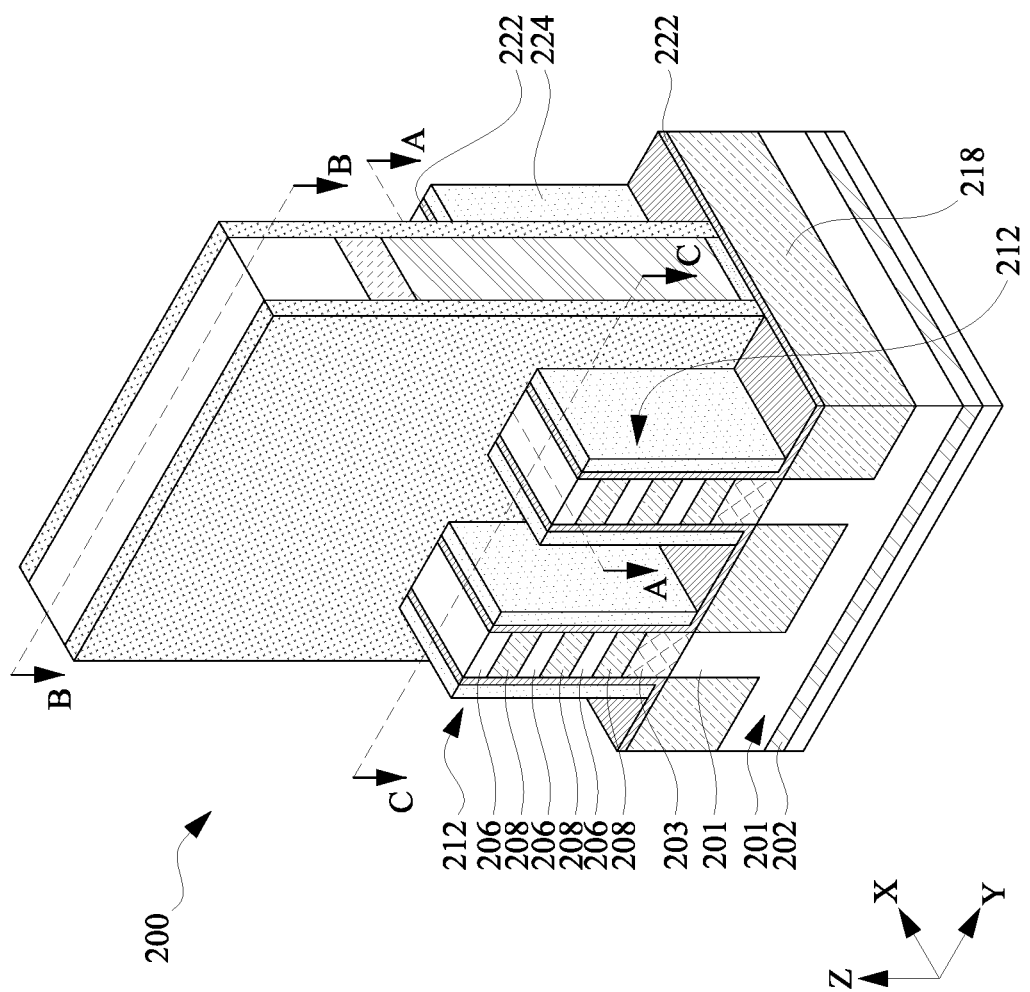
FIG. 37 illustrates a sacrificial gate structure formed over the semiconductor device structure shown in FIG. 36A.

In FIG. 37, a sacrificial gate structure 230 is formed over the semiconductor device structure 200. FIGS. 38A-50A are cross-sectional side views of various stages of manufacturing the semiconductor device structure 200 taken along line A-A of FIG. 37 in accordance with various embodiments. FIGS. 38B-50B are cross-sectional side views of various stages of manufacturing the semiconductor device structure 200 taken along line B-B of FIG. 37 in accordance with various embodiments. FIGS. 38C-50C are cross-sectional side views of various stages of manufacturing the semiconductor device structure 200 taken along line C-C of FIG. 37 in accordance with various embodiments. As can be seen in FIG. 37, FIGS. 38A and 38B, the sacrificial gate structure 230 is formed over a portion of the fins 212 which are to be a channel region for the semiconductor device structure 200. The sacrificial gate structure 230 may include a sacrificial gate dielectric layer 232, a sacrificial gate electrode layer 234, and a mask layer 236. Gate spacers 238 are then formed on sidewalls of the sacrificial gate structure 230. The sacrificial gate dielectric layer 232, the sacrificial gate electrode layer 234, and the mask layer 236, and the gate spacers 238 may be formed of the same material (and by the same deposition techniques) as discussed above with respect to the sacrificial gate dielectric layer 132, the sacrificial gate electrode layer 134, and the mask layer 136, and the gate spacers 138, respectively.

To form the sacrificial gate structure 230, the sacrificial gate dielectric layer 232 is formed conformally over the fins 212. The sacrificial gate electrode layer 234 is then formed on the sacrificial gate dielectric layer 232 and over the fins 212, such that the fins 212 are fully embedded in the sacrificial gate electrode layer 234. Subsequently, the mask layer 236 is formed over the sacrificial gate electrode layer 234. Next, a patterning operation is performed on the mask layer 236, the sacrificial gate electrode layer 234, and the sacrificial gate dielectric layer 232 to form the sacrificial gate structure 230. The gate spacers 238 are then formed on the sidewalls of the sacrificial gate structure 230. While only one sacrificial gate structure 230 is formed, the number of the sacrificial gate structure is not limited to one. Two or more sacrificial gate structures may be formed in the X direction in some embodiments.

In FIG. 39A-39C, the portions of the fins 212 (FIG. 37) in the S/D regions (e.g., regions on opposite sides of the sacrificial gate structure 230) are recessed down below the top surface of the isolation region 220 (or the insulating material 218) by using dry etching and/or wet etching. The recess of the fins 212 form trenches 243 between the neighboring first liner layers 222, as shown in FIG. 39C. Surfaces 242 of the substrate 201 are exposed as the result of the recess of the portions of the fins 212.

In FIGS. 40A-40C, edge portions of each second semiconductor layer 208 are removed and replaced by the dielectric spacers 244, as shown in FIG. 40A. The removal of the edge portions of each second semiconductor layer 208 and the formation of the dielectric spacers 244 are performed in a similar fashion as discussed above with respect to the dielectric spacers 144.

In FIGS. 41A-41C, epitaxial S/D features 246 are formed on the exposed surfaces 242 of the substrate 201. The epitaxial S/D features 246 may be made of the same material as the epitaxial S/D features 146. The epitaxial S/D features 246 are in contact with the semiconductor layers 206, 208 and the buffer layer 103, as shown in FIG. 41A. The epitaxial S/D features 246 may be the S/D regions. For example, one of a pair of epitaxial S/D features 246 located on one side of the sacrificial gate structure 230 can be a source region 248, and the other of the pair of epitaxial S/D features 246 located on the other side of the sacrificial gate structure 230 can be a drain region 250. A pair of epitaxial S/D features 246 refers herein to a source epitaxial feature 246 and a drain epitaxial feature 246 connected by the channels (e.g., the first semiconductor layers 206). Likewise, a source and a drain are interchangeably used in this disclosure. Therefore, a source/drain (S/D) can refer to a source and/or a drain.

In FIGS. 42A-42C, a third liner layer 251 is formed over the semiconductor device structure 200. The third liner layer 251 provides additional thickness within the trench 213 so that the width "W2" of the trench 213 along the Y direction is reduced. When the trench width "W2" is narrow, any material, such as a subsequently formed ILD layer (e.g., ILD layer 264 in FIG. 43C), may only fill the opening of the trench 213, instead of filling the air gaps 256 (FIG. 43C).

The third liner layer 251 may have a thickness "T3" of about 1 nm to about 15 nm. In some embodiments, the thickness "T3" of the third liner layer 251 is greater than the thickness of "T1" (FIG. 32B) of the first liner layer 222. In some embodiments, the thickness "T3" of the third liner layer 251 is greater than the thickness of "T2" (FIG. 32B) of the second liner layer 224. The width "W2" of the trench 213 varies depending on the combined thickness of the first liner layer 222, the second liner layer 224, and the third liner layer 251. In some embodiments, the width "W2" of the trench 213 may be in a range of about 0.5 nm to about 10 nm, such as about 1 nm to about 5 nm. If the width "W2" is greater than about 6 nm, any material, such as a subsequently formed ILD layer (e.g., ILD layer 264), may substantially fill the trench 213 and result in little or no air gaps between neighboring electrically-conductive features (e.g., epitaxial S/D features 246). On the other hand, if the width "W2" is less than 0.5 nm, there may be insufficient isolation between neighboring electrical-conductive structures.

The third liner layer 251 may be formed of a material having an etch selectivity different than the first liner layer 222 and the second liner layer 224. In some embodiments, the third liner layer 251 may include or be compounds comprising Si, O, and C or compounds comprising Si, O, C, and H, such as silicon oxide, TEOS oxide, SiCOH and SiOC. Organic materials, such as polymers, may also be used for the third liner layer 251. In such a case, the third liner layer 251 may be deposited by a CVD process, a PECVD process or any suitable deposition technique.

In some embodiments, the third liner layer 251 may include or be amorphous silicon, polysilicon, or the like, and may be formed by any suitable deposition technique, such as a FCVD process, an ALD process, or a PVD process. In one example, the third liner layer 251 is formed by a low temperature chemical vapor deposition process (e.g., about 200° C. to about 550° C.) in a gaseous environment containing a suitable silicon precursor and a carrier gas. Suitable silicon precursors may include, but are not limited to, $SiH_4$, $Si_2H_6$, $Si_3H_8$, $SiCl_2H_2$, $SiCl_3H$, or the like, or any combination thereof. Suitable carrier gas may include $H_2$ or He. If desired, the semiconductor device structure 200 may be exposed to a dopant gas, such as a germanium-containing gas, a boron-containing gas, or the like.

FIGS. 43A-43C illustrate one embodiment where an interlayer dielectric (ILD) layer 264 is formed directly on or over the semiconductor device structure 200 after the third liner layer 251 is formed. In this embodiment, the third liner layer 251 can function as an etch stop layer to stop an etch process when forming openings in the ILD layer 264. The ILD layer 264 may be formed by a blanket deposition on the third liner layer 251 until the sacrificial gate structure 230 is embedded. The ILD layer 264 may include or be the same material as the ILD layer 164. The ILD layer 264 seals the opening of the trench 213 and forms an air gap 247 therein. The air gap 247 is defined by the ILD layer 264 and the third liner layer 251 in contact with the second liner layer 224 and the first liner layer 222. In other words, the ILD layer 264 and the third liner layer 251 are directly exposed to the air gap 247. The air gap 247, the second liner layer 224 and the third liner layer 251 together provide improved isolation between neighboring epitaxial S/D features 246. Therefore, the parasitic fringing capacitances or capacitive coupling between neighboring epitaxial S/D features 246 can be reduced.

Due to the narrow width "W2" of the trench 213, the ILD layer 264 will have a minimum filling depth "D4" into the trench 213. The minimum filling depth "D4" may be in a range from about 0.5 nm to about 5 nm. If the distance "D4" is greater than about 5 nm, the size of the air gap is reduced and may not provide sufficient isolation between neighboring electrically-conductive features. After the ILD layer 264 is formed, the processes described in FIGS. 47A-47C to FIG. 52 are performed on the semiconductor device structure 200.

FIGS. 44A-44C illustrate an alternative embodiment where portions of the third liner layer 251 are removed to expose the epitaxial S/D features 246, the first liner layer 222, and the second liner layer 224. In this embodiment, after the third liner layer 251 is formed, the third liner layer 251 is subjected to a removal process, such as an anisotropic selective dry etch process. The anisotropic selective dry etch process removes portions of the third liner layer 251 from horizontal surfaces of the semiconductor device structure 100, leaving the third liner layer 251 on the vertical surfaces, such as the third liner layer 251 in contact with the second liner layer 224 and the sacrificial gate structure 230. The anisotropic etching may be RIE or any suitable dry etching process. The top surfaces of the third liner layers 251, the second liner layers 224, the first liner layers 222, and the epitaxial S/D features 246 are substantially co-planar after the removal process.

In FIGS. 45A-45C, a contact etch stop layer (CESL) 262 is conformally formed on the exposed surfaces of the semiconductor device structure 200. The CESL 262 covers the sidewalls of the sacrificial gate structure 230, and exposed surfaces of the third liner layers 251, the second liner layers 224, the first liner layers 222, and the epitaxial S/D features 246. The CESL 262 can provide a mechanism to stop an etch process when forming openings in the ILD layer 264 during subsequent device processing operations. The CESL 262 may be formed of the same material as the CESL 162 and be deposited in a similar fashion as the CESL 162. The CESL 262 may have a thickness "T4" of about 1 nm to about 10 nm.

In FIGS. 46A-46C, after the CESL 262 is formed, an interlayer dielectric (ILD) layer 264 is formed on the semiconductor device structure 200. The ILD layer 264 may be formed by a blanket deposition on the CESL 262 until the sacrificial gate structure 230 is embedded. In some embodiments, the ILD layer 264 is subjected to an implantation process, such as the implantation process discussed above with respect to FIGS. 17A-17C, to further densify the ILD layer 264. The ILD layer 264 may include or be the same material as the ILD layer 164. The ILD layer 264 seals the opening of the trench 213 and forms an air gap 256 therein. The air gap 256 is defined by the ILD layer 264 and the CESL 262 in contact with the third liner layer 251 and the first liner layer 222. The air gap 256, the CESL 262, the third liner layer 251, the second liner 224, and the first liner layer 222 together provide improved isolation between neighboring epitaxial S/D features 246. Therefore, the parasitic fringing capacitances or capacitive coupling between neighboring epitaxial S/D features 246 can be reduced.

The combined thickness of the CESL 262, the first liner layer 222, the second liner layer 224, and the third liner layer 251 varies the width "W3" of the trench 213. In some embodiments, the width "W3" of the trench 213 may be in a range of about 0.5 nm to about 10 nm, such as about 1 nm to about 5 nm. If the width "W3" is greater than about 6 nm, any material, such as a subsequently formed ILD layer (e.g., ILD layer 264), may substantially fill the trench 213 and result in little or no air gaps between neighboring electrically-conductive features (e.g., epitaxial S/D features 246). On the other hand, if the width "W3" is less than 0.5 nm, there may be insufficient isolation between neighboring electrical-conductive structures.

Due to the narrow width "W3" of the trench 213, the ILD layer 264 will have a minimum filling depth "D5" into the trench 213. The minimum filling depth "D5" may be in a range from about 0.5 nm to about 5 nm. If the distance "D5" is greater than about 5 nm, the size of the air gap is reduced and may not provide sufficient isolation between neighboring electrically-conductive features.

In FIGS. 47A-47C, after the ILD layer 264 is formed, a planarization operation, such as CMP, is performed on the semiconductor device structure 200 to expose the sacrificial gate electrode layer 234. The sacrificial gate structure 230 (i.e., the sacrificial gate electrode layer 234 and the sacrificial gate dielectric layer 232 as shown in FIG. 46A) is then removed using the same or similar methods as discussed above with respect to the removal of the sacrificial gate structure 130. The removal of the sacrificial gate structure 230 forms a trench 266 between the neighboring spacers 238, as shown in FIG. 47A. The trench 266 exposes the top of the stack of semiconductor layers (e.g., the first semiconductor layers 206), the first liner layer 222, and the second liner layer 224, as shown in FIG. 47B.

In FIGS. 48A-48C, the exposed portions of the first liner layer 222 (i.e., first liner layer 222 in contact with the sidewalls of the stack of semiconductor layers 206, 208 and the buffer layer 203) and the remaining portion of each second semiconductor layer 208 are removed, as shown in FIG. 48B. The removal of the first liner layer 222 and the second semiconductor layers 208 results in gaps 268 formed between the dielectric spacers 244, as shown in FIG. 48A. In some embodiments, the first liner layer 222 (e.g., SiGe) and the second semiconductor layers 208 (e.g., SiGe) may be removed using a selective wet etching process that removes the first liner layer 222 and the second semiconductor layers 208 without substantially affecting the first semiconductor layers 206 (e.g., Si), the second liner layers 224 (e.g., SiON), and the buffer layer 203 (e.g., Si). Exemplary wet etchants may include, but are not limited to, ammonium hydroxide ($NH_4OH$), tetramethylammonium hydroxide (TMAH), ethylenediamine pyrocatechol (EDP), or potassium hydroxide (KOH) solution.

The resulting semiconductor device structure 200 includes a plurality of first semiconductor layers 206 separated by pairs of the dielectric spacers 244 having gaps 268 formed between each pair of the dielectric spacers 244, as shown in FIG. 48A. Each first semiconductor layer 206 may have a surface along the longitudinal direction of the semiconductor layer 206, and the majority of that surface is exposed as the result of the removal of the first liner layer 222 and the second semiconductor layers 208. The exposed surface will be surrounded by a gate electrode layer formed subsequently. Each first semiconductor layer 206 forms a nanosheet channel of the nanosheet transistor.

In FIGS. 49A-49C, after the formation of the nanosheet channels (i.e., the exposed first semiconductor layers 206), a gate dielectric layer 270 is formed around each first semiconductor layer 206, and a gate electrode layer 272 is formed on the gate dielectric layer 270, surrounding a portion of each first semiconductor layer 206, as shown in FIGS. 49A and 49B. The gate dielectric layer 270 and the gate electrode layer 272 may be collectively referred to as a gate stack 274. The gate dielectric layer 270 and the gate electrode layer 272 may be formed of the same material as the gate dielectric layer 170 and the gate electrode layer 172, and be deposited using the same or similar approach as discussed above with respect to FIGS. 23A-23C. The gate electrode layer 272 may be also deposited over the upper surface of the ILD layer 264. The gate dielectric layer 270 and the gate electrode layer 272 formed over the ILD layer 264 are then removed by using, for example, CMP, until the top surface of the ILD layer 264 is exposed, as shown in FIG. 49A.

In FIGS. 50A-50C, S/D contacts 276 are formed in the ILD layer 264. Prior to forming the S/D contacts 276, contact openings are formed in the ILD layer 264 to expose the epitaxial S/D features 246. Suitable photolithographic and etching techniques are used to form the contact openings through various layers, including the ILD layer 264 and the CESL 262 to expose the epitaxial S/D features 246. In some embodiments, the upper portions of the epitaxial S/D features 246 are etched.

After the formation of the contact openings, a silicide layer 278 is formed on the epitaxial S/D features 246. The silicide layer 278 conductively couples the epitaxial S/D features 246 to the subsequently formed S/D contacts 276. The silicide layer 278 may be made of the same material as the silicide layer 178 and be formed using the same method as the silicide layer 178 as discussed above. Next, a conductive material is formed in the contact openings and form the S/D contacts 276. The conductive material may be made of the same material as the conductive material for the S/D contacts 176. Then, a planarization process, such as CMP, is performed to remove excess deposition of the contact material and expose the top surface of the gate electrode layer 272.

Figure 51:
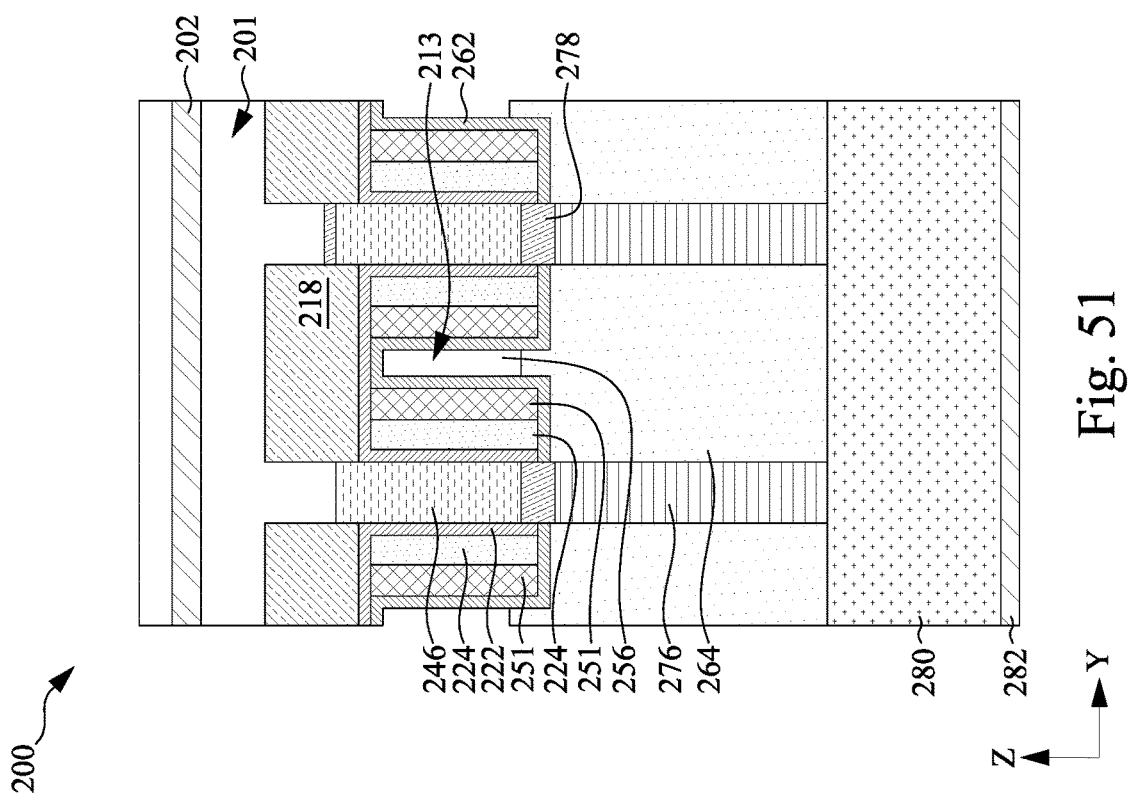
FIG. 51 illustrates the stage after formation of S/D contacts and after an interconnecting structure and a carrier substrate are formed on a substrate shown in FIGS. 50A-50C.

FIG. 51 illustrates the stage after the formation of the S/D contacts 276 and after an interconnecting structure 280 and a carrier substrate 282 are formed on the substrate 201. The semiconductor device structure 200 is then flipped over for backside processing of the substrate 101.

Figure 52:
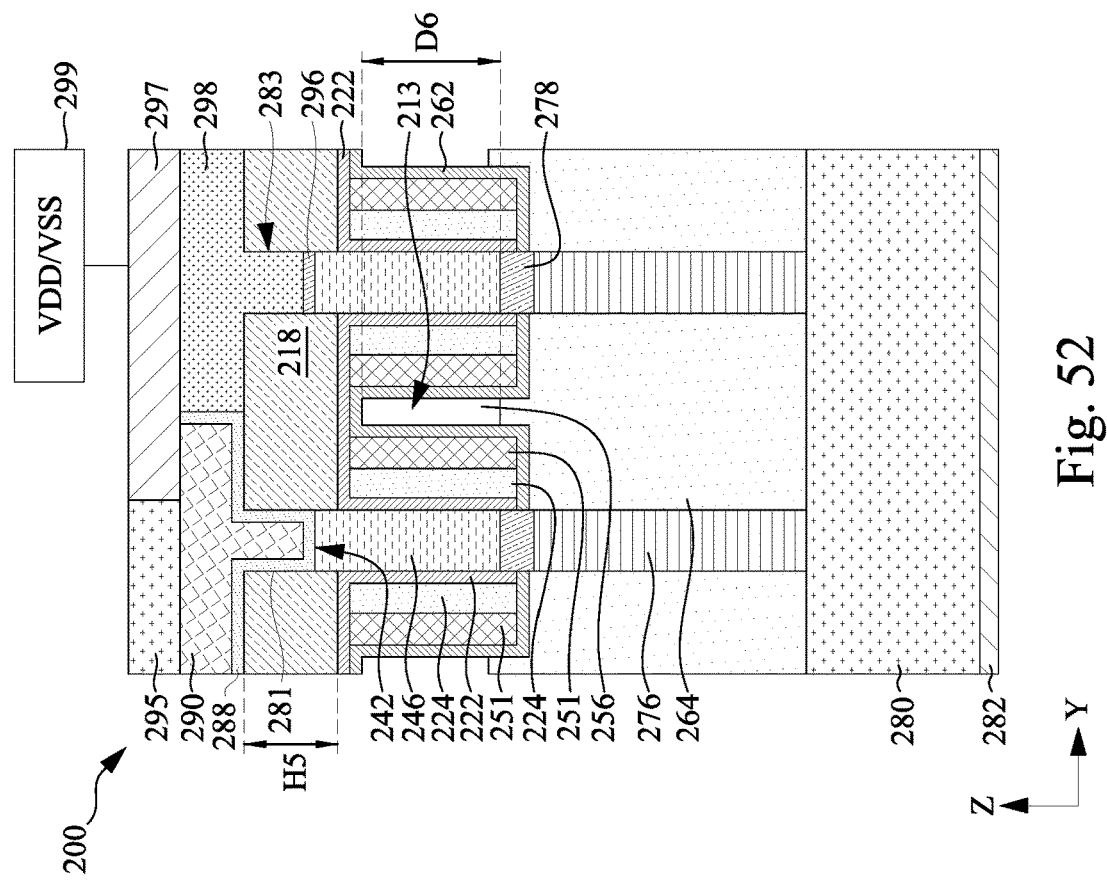
FIG. 52 illustrates the stage after processes of FIGS. 28-31 have been performed on a backside of the semiconductor device structure.

FIG. 52 illustrates the stage after the backside processes, such as the processes discussed above with respect to FIGS. 28-31, have been performed on the backside of the semiconductor device structure 200. For example, after the semiconductor device structure 200 is flipped over, a planarization process is performed on the backside of the substrate 201 until portions of the substrate 201 below the insulating layer 202 are exposed. A hard mask layer, such as the hard mask 184, is formed on the portion of the substrate 201 over the epitaxial S/D feature 246 (e.g., a source epitaxial feature). Next, the portion of the substrate 201 not covered by the hard mask layer is removed until a portion of the epitaxial S/D feature 246 disposed below the removed portion of the substrate 201 is exposed. The removal of the portion of the substrate 201 forms an opening 281 exposing the epitaxial S/D feature 246 and a portion of the insulating material 218 adjacent the exposed epitaxial S/D feature 246, which can be a drain epitaxial feature. Next, a liner 288, such as the liner 188, is formed on the exposed epitaxial S/D feature 246, the exposed portion of the insulating material 218, and the exposed surface of the remaining portion of the substrate 201. A dielectric material 290, such as the dielectric material 190, is then formed on the liner 288 and fills the opening 281. Thereafter, a hard mask layer, such as the hard mask layer 192, is formed on the portion of the substrate 201 over the epitaxial S/D feature 246 (e.g., a drain epitaxial feature) and the remaining portion of the substrate 201 that was covered by the hard mask layer is removed. The removal of the remaining portion of the substrate 201 forms an opening 283 exposing the epitaxial S/D feature 246 (e.g., a source epitaxial feature) that is not protected by the hard mask layer. Next, a silicide layer 296, such as the silicide layer 196, is selectively formed on the exposed surface of the epitaxial S/D feature 246 (e.g., a source epitaxial feature). A conductive feature 298, such as the conductive feature 198, is then formed on the silicide layer 296 in the opening 283. After the conductive feature 298 is formed, an ILD layer 295, such as the ILD layer 195, is formed over the backside of the semiconductor device structure 200. One or more conductive features 297 (only one is shown), such as the conductive feature 197, are formed in the ILD layer 295. The conductive feature 297 is in electrical communication with the S/D contacts 276 through the conductive feature 298, the silicide layer 296, the epitaxial S/D feature 246 (e.g., a source epitaxial feature) and the silicide layer 278. The conductive feature 297 is in connection with a power rail 299 to be connected to a power supply, which may be fed with a positive voltage (VDD) or a negative voltage (VSS) (i.e., ground or zero voltage).

FIGS. 52 and 53A-53C also illustrate the air gaps 256 extending at different lengths within the trench 213 between neighboring epitaxial S/D feature 246. The length of the air gaps 256 can be controlled by varying the height of the insulating layer 218 (i.e., isolation region). It has been observed that the greater the length of the air gaps between electrically-conductive features, the lower the effective capacitance (related to the delays of the gates and resistive-capacitive (RC) time constant) of the semiconductor device structure 200. As shown in FIG. 52, the air gap 256 is formed with a length "D6" between the epitaxial S/D features 246, which is the result of having the insulating layer 218 formed at a height "H5". In this embodiment, after flipping the semiconductor device structure 200, the bottom of the air gap 256 is above the bottom of the epitaxial S/D features 246 and above the backside conductive feature 298. In some embodiments, the length "D6" may be in a range of about 10 nm to about 100 nm. The effective capacitance of the semiconductor device structure 200 in the embodiment in FIG. 52 is measured about 1.4% lower as compared to semiconductor device structures incorporating only dielectric fins between neighboring epitaxial S/D features.

Figure 53A:
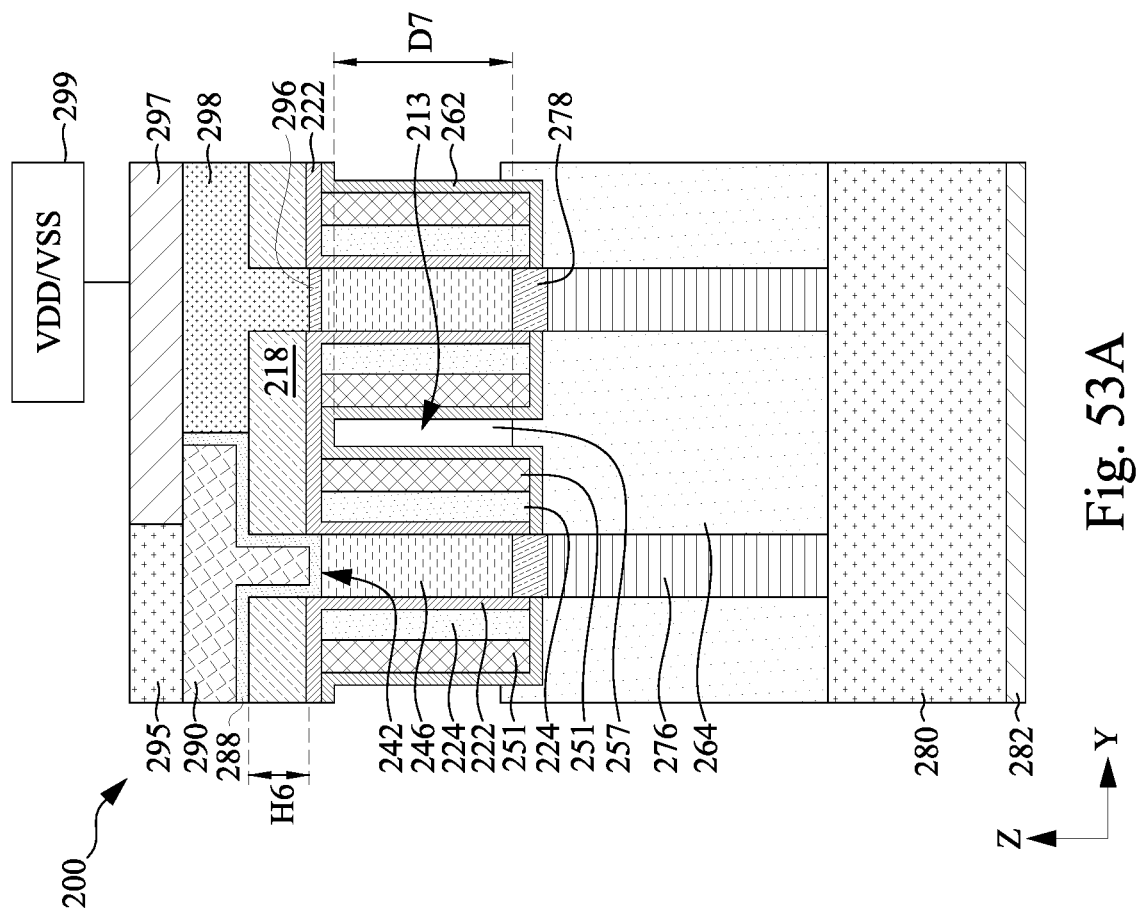
FIGS. 53A, 53B, and 53C illustrate air gaps extending at different lengths within a trench between neighboring epitaxial S/D features.

FIG. 53A illustrates the air gap 257 being formed with a length "D7" between the epitaxial S/D features 246, which is the result of having the insulating layer 218 formed at a height "H6". As can be seen in FIGS. 52 and 53A, the height "H6" is shorter than the height "H5", resulting in the length "D7" greater than the length "D6". In this embodiment, after flipping the semiconductor device structure 200, the bottom of the air gap 257 is at about the same level with the bottom of the epitaxial S/D features 246 and above the backside conductive feature 298. The effective capacitance of the semiconductor device structure 200 in the embodiment in FIG. 53A is measured about 1.6% lower as compared to semiconductor device structures incorporating only dielectric fins between neighboring epitaxial S/D features.

Figure 53C:
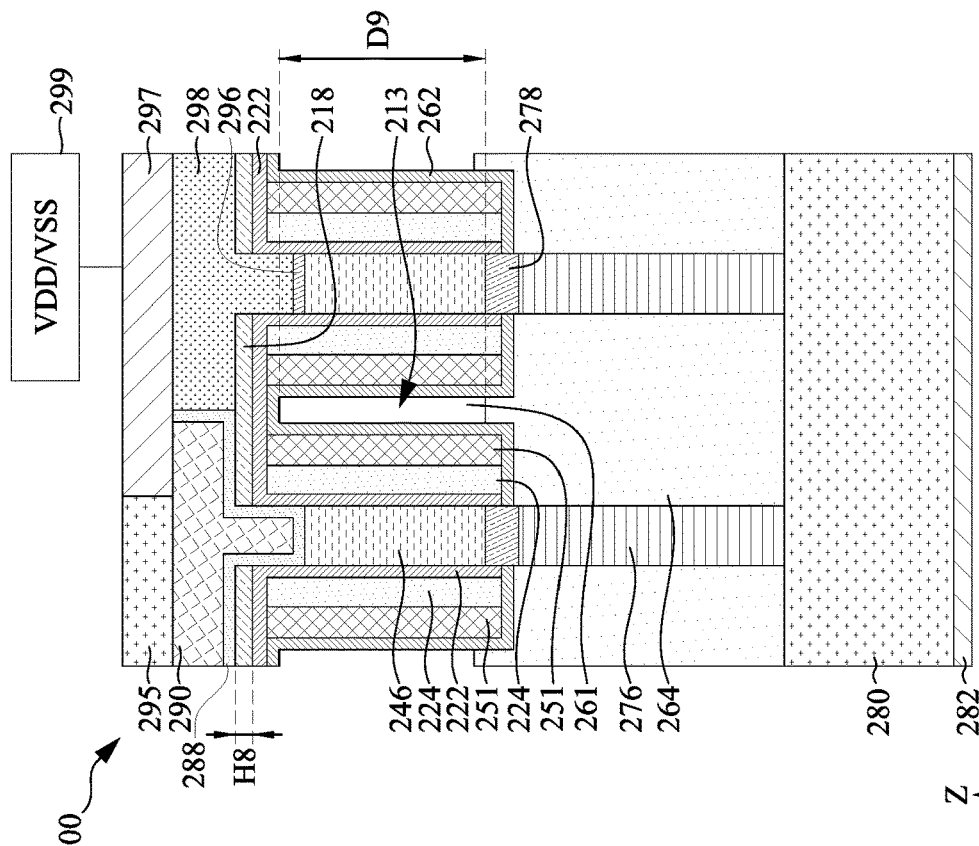
Figure 53B:
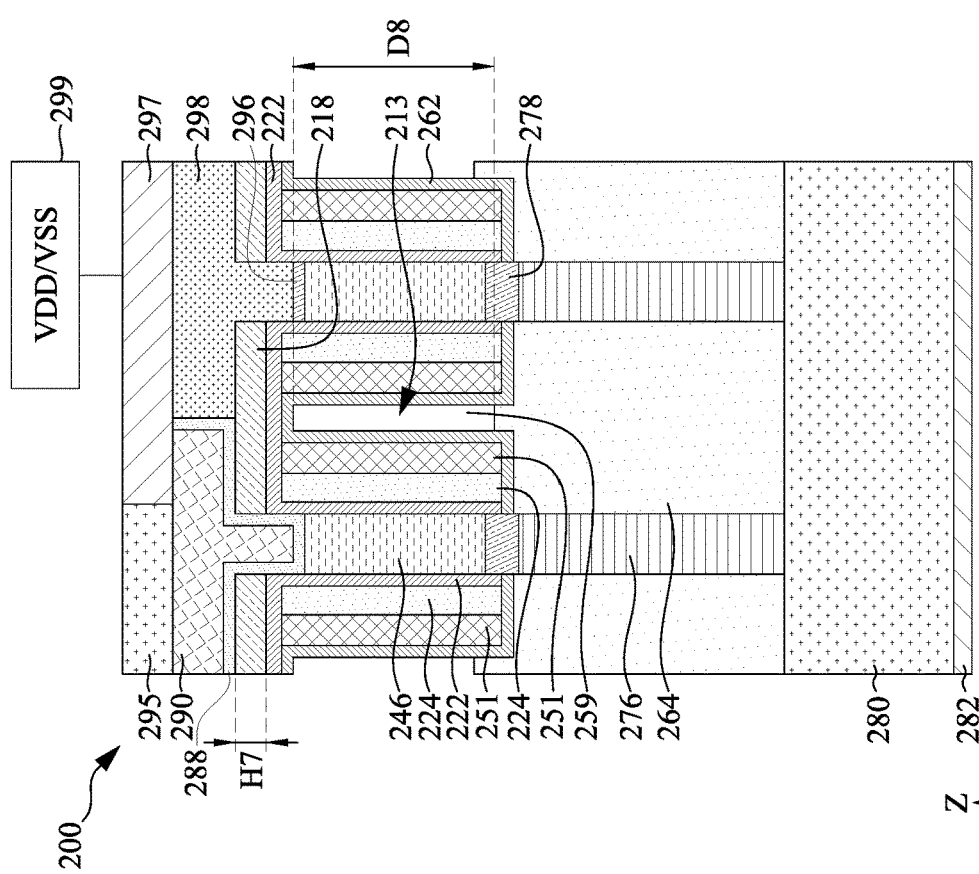

FIG. 53B illustrates the air gap 259 being formed with a length "D8" between the epitaxial S/D features 246, which is the result of having the insulating layer 218 formed at a height "H7". As can be seen in FIGS. 53A and 53B, the height "H7" is shorter than the height "H6", resulting in the length "D8" greater than the length "D7". In this embodiment, after flipping the semiconductor device structure 200, the bottom of the air gap 259 extends below the bottom of the epitaxial S/D features 246 and to about the same level with the silicide layer 296 (or below the bottom of the silicide layer 296) in contact with the backside conductive feature 298. The effective capacitance of the semiconductor device structure 200 in the embodiment in FIG. 53B is measured about 1.8% lower as compared to semiconductor device structures incorporating only dielectric fins between neighboring epitaxial S/D features.

FIG. 53C illustrates the air gap 261 being formed with a length "D9" between the epitaxial S/D features 246, which is the result of having the insulating layer 218 formed at a height "H8". As can be seen in FIGS. 53B and 53C, the height "H8" is shorter than the height "H7", resulting in the length "D9" greater than the length "D8". In this embodiment, after flipping the semiconductor device structure 200, the bottom of the air gap 261 extends below the bottom of the epitaxial S/D features 246 and further to the level of the backside conductive feature 298. The effective capacitance of the semiconductor device structure 200 in the embodiment in FIG. 53C is measured about 1.9% lower as compared to semiconductor device structures incorporating only dielectric fins between neighboring epitaxial S/D features.

FIG. 54 illustrates another embodiment showing the stage after the backside power contact has been formed on the semiconductor device structure 200. The embodiment shown in FIG. 54 is based on the alternative embodiment shown in FIGS. 43A-43C in which the third liner layer 251 functions as an etch stop layer. The air gap 247 is defined by the ILD layer 264, the third liner layer 251 in contact with the insulating layer 218, and neighboring epitaxial S/D features 246. The air gap 247 extends within the trench 213 between neighboring epitaxial S/D feature 246. Likewise, the air gap 247 has a length "D10" and can be controlled by varying the height "H9" of the insulating layer 218, thereby achieving lower effective capacitance (related to the delays of the gates) of the semiconductor device structure. In some embodiments, the length "D10" may be in a range of about 10 nm to about 100 nm.

Embodiments of the present disclosure provide a semiconductor device structure including a device, such as a nanosheet transistor, having air gaps disposed between epitaxial S/D features. The air gaps extend along the longitudinal direction of the epitaxial S/D features and may extend below the bottom of the epitaxial S/D features. The air gaps alone, or with multiple liners disposed adjacent the air gaps, can provide improved isolation between epitaxial S/D features. The air gap has a lower k value compared to the conventional dielectric fins, which reduce parasitic fringing capacitances or capacitive coupling between neighboring conductive structures.

An embodiment is a semiconductor device structure. The structure includes a dielectric layer and a first source/drain feature in contact with the dielectric layer, wherein the first source/drain feature comprises a first sidewall. The structure also includes a second source/drain feature in contact with the dielectric layer and adjacent to the first source/drain feature, wherein the second source/drain feature comprises a second sidewall. The structure also includes an insulating layer disposed over the dielectric layer and between the first sidewall and the second sidewall, wherein the insulating layer comprises a first surface facing the first sidewall, a second surface facing the second sidewall, a third surface connecting the first surface and the second surface, and a fourth surface opposite the third surface. The structure further includes a sealing material disposed between the first sidewall and the first surface, wherein the sealing material, the first sidewall, the first surface, and the dielectric layer are exposed to an air gap.

Another embodiment is a semiconductor device structure. The structure includes a dielectric layer and a first source/drain feature in contact with the dielectric layer, wherein the first source/drain feature comprises a first sidewall. The structure also includes a second source/drain feature in contact with the dielectric layer and adjacent to the first source/drain feature, wherein the second source/drain feature comprises a second sidewall. The structure also includes a first liner layer disposed over the dielectric layer, wherein the first liner layer has a first portion in contact with the first sidewall, a second portion in contact with the second sidewall, and a third portion connecting the first portion of the first liner layer to the second portion of the first liner layer, and wherein the third portion of the first liner layer is in contact with the dielectric layer. The structure also includes a contact etch stop layer disposed over the dielectric layer, wherein the contact etch stop layer has a first portion adjacent to the first portion of the first liner layer, a second portion adjacent to the second portion of the first liner layer, and a third portion connecting the first portion of the contact etch stop layer to the second portion of the contact etch stop layer, wherein the third portion of the contact etch stop layer is in contact with the third portion of the first liner layer. The structure further includes an interlayer dielectric layer disposed over the dielectric layer, wherein the interlayer dielectric layer, the first portion of the etch contact stop layer, the second portion of the etch stop layer, and the third portion of the etch stop layer are exposed to an air gap.

A further embodiment is a semiconductor device structure. The structure includes a dielectric layer and a first source/drain feature disposed over the dielectric layer, wherein the first source/drain feature comprises a first sidewall. The structure also includes a second source/drain feature in contact with the dielectric layer and adjacent to the first source/drain feature, wherein the second source/drain feature comprises a second sidewall. The structure also includes a first liner layer in contact with the dielectric layer and having a first thickness, wherein the first liner layer comprises a first portion in contact with the first sidewall, a second portion in contact with the second sidewall, and a third portion connecting the first portion of the first liner layer to the second portion of the first liner layer, and wherein the third portion of the first liner layer is in contact with the dielectric layer. The structure also includes a second liner layer disposed over the dielectric layer and having a second thickness greater than the first thickness of the first liner layer, wherein the second liner layer comprises a first portion disposed adjacent the first portion of the first liner layer, a second portion disposed adjacent the second portion of the first liner layer, and a third portion connecting the first portion of the second liner layer and second portion of the second liner layer, and wherein the third portion of the second liner layer is in contact with the third portion of the first liner layer. The structure further includes an interlayer dielectric layer disposed over the dielectric layer, wherein the interlayer dielectric layer, the first portion of the second liner layer, the second portion of the second liner layer, and the third portion of the second liner layer enclose an air gap therebetween.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:
1. A semiconductor device structure, comprising:
a dielectric layer;
a first source/drain feature in contact with the dielectric layer, wherein the first source/drain feature comprises a first sidewall;
a second source/drain feature in contact with the dielectric layer and adjacent to the first source/drain feature, wherein the second source/drain feature comprises a second sidewall;
a first liner layer disposed over the dielectric layer, wherein the first liner layer has a first portion in contact with the first sidewall, a second portion in contact with the second sidewall, and a third portion connecting the first portion of the first liner layer to the second portion of the first liner layer, and wherein the third portion of the first liner layer is in contact with the dielectric layer;
a contact etch stop layer disposed over the dielectric layer, wherein the contact etch stop layer has a first portion adjacent to the first portion of the first liner layer, a second portion adjacent to the second portion of the first liner layer, and a third portion connecting the first portion of the contact etch stop layer to the second portion of the contact etch stop layer, wherein the third portion of the contact etch stop layer is in contact with the third portion of the first liner layer; and
an interlayer dielectric layer disposed over the dielectric layer, wherein the interlayer dielectric layer, the first portion of the contact etch stop layer, the second portion of the contact etch stop layer, and the third portion of the contact etch stop layer are exposed to an air gap.

2. The semiconductor device structure of claim 1, further comprising:
   a second liner layer in contact with the first portion of the first liner layer.

3. The semiconductor device structure of claim 2, further comprising:
   a third liner layer disposed between the first portion of the contact etch stop layer and the second liner layer.

4. The semiconductor device structure of claim 3, wherein the second liner layer is a nitride-based material or a silicon nitride-based material, and wherein the third liner layer is an amorphous silicon, polysilicon, a material comprising Si, O and C, or a material comprising Si, O, C, and H.

5. The semiconductor device structure of claim 1, further comprising:
   a first silicide layer in contact with a first surface of the first source/drain feature;
   a second silicide layer in contact with a second surface of the first source/drain feature; and
   a first conductive feature disposed in the dielectric layer and in contact with the first silicide layer; and
   a second conductive feature disposed in the interlayer dielectric layer and in contact with the second silicide layer.

6. The semiconductor device structure of claim 5, wherein the third portion of the contact etch stop layer is disposed above the first surface of the first source/drain feature.

7. The semiconductor device structure of claim 5, wherein the third portion of the contact etch stop layer is disposed below the first surface of the first source/drain feature.

8. The semiconductor device structure of claim 5, further comprising:
   a dielectric liner layer in contact with a first surface of the second source/drain feature;
   a third silicide layer in contact with a second surface of the second source/drain feature; and
   a third conductive feature disposed in the interlayer dielectric layer, wherein the third conductive feature is in contact with the third silicide layer.

9. The semiconductor device structure of claim 1, wherein the contact etch stop layer comprises an oxygen-containing material or a nitrogen-containing material.

10. A semiconductor device structure, comprising:
    a dielectric layer;
    a first source/drain feature disposed over the dielectric layer, wherein the first source/drain feature comprises a first sidewall;
    a second source/drain feature in contact with the dielectric layer and adjacent to the first source/drain feature, wherein the second source/drain feature comprises a second sidewall;
    a first liner layer having a first thickness, wherein the first liner layer comprises a first portion in contact with the first sidewall, a second portion in contact with the second sidewall, and a third portion connecting the first portion of the first liner layer to the second portion of the first liner layer, and wherein the third portion of the first liner layer is in contact with the dielectric layer;
    a second liner layer disposed over the dielectric layer and having a second thickness greater than the first thickness of the first liner layer, wherein the second liner layer comprises a first portion disposed adjacent the first portion of the first liner layer, a second portion disposed adjacent the second portion of the first liner layer, and a third portion connecting the first portion of the second liner layer and second portion of the second liner layer, and wherein the third portion of the second liner layer is in contact with the third portion of the first liner layer; and
    an interlayer dielectric layer disposed over the dielectric layer, wherein the interlayer dielectric layer, the first portion of the second liner layer, the second portion of the second liner layer, and the third portion of the second liner layer enclose an air gap therebetween.

11. The semiconductor device structure of claim 10, further comprising:
    a third liner layer disposed between the first portion of the first liner layer and the first portion of the second liner layer.

12. The semiconductor device structure of claim 10, further comprising:
    a first silicide layer in contact with a first surface of the first source/drain feature;
    a second silicide layer in contact with a second surface of the first source/drain feature;
    a first conductive feature disposed in the dielectric layer and in contact with the first silicide layer;
    a second conductive feature disposed in an interlayer dielectric layer and in contact with the second silicide layer;
    a dielectric liner layer in contact with a first surface of the second source/drain feature;
    a third silicide layer in contact with a second surface of the second source/drain feature; and
    a third conductive feature disposed in the interlayer dielectric layer and in contact with the third silicide layer.

13. A semiconductor device structure, comprising:
    a source/drain feature disposed between a source/drain contact and a conductive feature;
    a dielectric layer in contact with a portion of the conductive feature, the dielectric layer having a first thickness;
    a first liner layer comprising a first portion in contact with the dielectric layer and a second portion in contact with the conductive feature and the source/drain feature;
    a second liner layer in contact with the first liner layer;
    a third liner layer in contact with the second liner layer; and
    an interlayer dielectric layer disposed over the dielectric layer and in contact with the source/drain contact, wherein the interlayer dielectric layer and the third liner layer define an air gap therein.

14. The semiconductor device structure of claim 13, further comprising:
    a contact etch stop layer, comprising:
      a first portion in contact with the first portion of the first liner layer;
      a second portion in contact with the third liner layer; and
      a third portion in contact with the third liner layer, the second liner layer, and the second portion of the first liner layer.

15. The semiconductor device structure of claim 14, wherein the interlayer dielectric layer, the first portion of the contact etch stop layer, and the second portion of the contact etch stop layer are exposed to the air gap.

16. The semiconductor device structure of claim 13, wherein the second liner layer is a nitride-based material or a silicon nitride-based material, and the third liner layer is an amorphous silicon, polysilicon, a material comprising Si, O and C, or a material comprising Si, O, C, and H.

17. The semiconductor device structure of claim 13, wherein the air gap has a first length and the dielectric layer has a second length less than the first length.

18. The semiconductor device structure of claim 17, wherein the air gap has a bottom extending below a bottom of the source/drain feature.

19. The semiconductor device structure of claim 17, wherein the air gap has a bottom extending to a level of the conductive feature.

20. The semiconductor device structure of claim 17, wherein the air gap has a bottom extending to a level within a length of the source/drain feature.

* * * * *